US011870060B2

(12) United States Patent
Son et al.

(10) Patent No.: US 11,870,060 B2
(45) Date of Patent: Jan. 9, 2024

(54) COMPOSITE, ELECTROCHEMICAL ACTIVE MATERIAL COMPOSITE USING THE COMPOSITE, ELECTRODE INCLUDING THE COMPOSITE OR ELECTROCHEMICAL ACTIVE MATERIAL COMPOSITE, LITHIUM BATTERY INCLUDING THE ELECTRODE, FIELD EMISSION DEVICE INCLUDING THE COMPOSITE, BIOSENSOR INCLUDING THE COMPOSITE, SEMICONDUCTOR DEVICE INCLUDING THE COMPOSITE, AND THERMOELECTRIC DEVICE INCLUDING THE COMPOSITE

(71) Applicant: Samsung Electronics Co., Ltd., Suwon-si (KR)

(72) Inventors: Inhyuk Son, Yongin-si (KR); Jonghwan Park, Yongin-si (KR); Jaejun Chang, Seoul (KR); Junhwan Ku, Seongnam-si (KR); Xiangshu Li, Hwaseong-si (KR); Jaeman Choi, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 457 days.

(21) Appl. No.: 17/090,331

(22) Filed: Nov. 5, 2020

(65) Prior Publication Data
US 2021/0057729 A1 Feb. 25, 2021

Related U.S. Application Data

(62) Division of application No. 16/283,221, filed on Feb. 22, 2019, now Pat. No. 10,862,110, which is a division of application No. 14/733,028, filed on Jun. 8, 2015, now Pat. No. 10,249,871.

(30) Foreign Application Priority Data

Jun. 10, 2014 (KR) .................. 10-2014-0070267

(51) Int. Cl.
| | |
|---|---|
| H01M 4/36 | (2006.01) |
| H01M 4/13 | (2010.01) |
| H01M 4/48 | (2010.01) |
| H01M 4/62 | (2006.01) |
| H01B 1/04 | (2006.01) |
| H01J 1/304 | (2006.01) |
| F21K 2/08 | (2006.01) |
| B82Y 30/00 | (2011.01) |
| H10N 10/17 | (2023.01) |
| H10N 10/853 | (2023.01) |
| H10N 10/854 | (2023.01) |
| H10N 10/855 | (2023.01) |

(52) U.S. Cl.
CPC .............. *H01M 4/364* (2013.01); *B82Y 30/00* (2013.01); *F21K 2/08* (2013.01); *H01B 1/04* (2013.01); *H01J 1/304* (2013.01); *H01M 4/13* (2013.01); *H01M 4/483* (2013.01); *H01M 4/625* (2013.01); *H10N 10/17* (2023.02); *H10N 10/853* (2023.02); *H10N 10/854* (2023.02); *H10N 10/855* (2023.02); *H01J 2201/30461* (2013.01); *H01J 2201/30496* (2013.01)

(58) Field of Classification Search
CPC ....... H01M 4/364; H01M 4/625; C01B 32/00; C01B 33/00; B82Y 30/00; H01B 1/04
USPC ................... 252/182.1, 502, 506; 429/231.8; 977/890
See application file for complete search history.

(56) References Cited

U.S. PATENT DOCUMENTS

| | | | |
|---|---|---|---|
| 6,277,766 B1 | 8/2001 | Ayers | |
| 7,939,218 B2 | 5/2011 | Niu | |
| 2003/0215711 A1* | 11/2003 | Aramata | H01M 4/386 252/502 |
| 2010/0176337 A1 | 7/2010 | Zhamu et al. | |
| 2011/0033746 A1 | 2/2011 | Liu et al. | |
| 2011/0159368 A1 | 6/2011 | Hiirose et al. | |
| 2011/0268647 A1 | 11/2011 | Ivanovici et al. | |
| 2013/0221266 A1* | 8/2013 | Lu | C09C 1/405 264/319 |
| 2013/0344392 A1 | 12/2013 | Huang et al. | |
| 2014/0147751 A1* | 5/2014 | Yang | H01M 4/134 427/122 |
| 2014/0329150 A1 | 11/2014 | De Guzman et al. | |
| 2014/0370392 A1 | 12/2014 | Mengqun et al. | |

(Continued)

FOREIGN PATENT DOCUMENTS

| | | |
|---|---|---|
| CN | 101073934 A * | 11/2007 |
| CN | 103346303 A * | 10/2013 |

(Continued)

OTHER PUBLICATIONS

Arumugam et al., "Synthesis and electrochemical characterizations of Nano-SiO2-coated LiMn2O4 cathode materials for rechargeable lithium batteries", Journal of Electroanalytical Chemistry, vol. 624, 2008, pp. 197-204.

Bachmatluk et al., "Investigating the Graphitization Mechanism of SiO2 Nanoparticles in Chemical Vapor Deposition", ACSNANO, vol. 3, No. 12, 2009. pp. 4098-4104.

Chen et al., "Oxygen-Aided Synthesis of Polycrystalline Graphene on Silicon Dioxide Substrates", Journal of the American chemical Society, 133, 2011, pp. 17548-17551.

(Continued)

*Primary Examiner* — Tri V Nguyen

(74) *Attorney, Agent, or Firm* — CANTOR COLBURN LLP

(57) ABSTRACT

A composite including: at least one selected from a silicon oxide of the formula $SiO_2$ and a silicon oxide of the formula $SiO_x$ wherein $0<x<2$; and graphene, wherein the silicon oxide is disposed in a graphene matrix.

10 Claims, 41 Drawing Sheets

(56) References Cited

U.S. PATENT DOCUMENTS

| | | | |
|---|---|---|---|
| 2015/0028263 | A1 | 1/2015 | Wang et al. |
| 2015/0044565 | A1 | 2/2015 | Wang et al. |
| 2015/0093648 | A1 | 4/2015 | Son et al. |
| 2015/0111106 | A1 | 4/2015 | Son et al. |

FOREIGN PATENT DOCUMENTS

| | | |
|---|---|---|
| JP | 2013030462 A | 2/2013 |
| KR | 101181851 B1 | 9/2012 |
| KR | 1020130005102 A | 1/2013 |
| KR | 1020130033733 A | 4/2013 |
| KR | 1020130040541 A | 4/2013 |
| KR | 1020130087152 A | 8/2013 |
| KR | 1020140036496 A | 3/2014 |
| KR | 1020140111548 A | 9/2014 |
| KR | 1020150045337 A | 4/2015 |

OTHER PUBLICATIONS

Guo et al., "A SiO/graphene Nanocomposite as a High Stability Anode Material for Lithium-Ion BAtteries", Int. J. Electronem.Sci., 7, 2012, 8745-8752.

Hu ("Superior Storage Performance of a Si@SoOx/C Nanocomposite as Anode Material for Lithium-Ion Batteries") Angew. Chem. Int. Ed. 2008, 47, 1645-1649. 2008.

Kato et al., "Direct Growth of Doping-Density-Controlled Hexagonal Graphene on SiO2 Substrate by Rapid-Heating Plasma CVD", ACSNANO, vol. 6, No. 10, 2012, pp. 8508-8515.

Kim et al., "Solar Photoconversion Using Graphene/TiO2 Composites: Nanographene Shell on TiO2 core versus TiO2 Nanoparticles on Graphene Sheet", The Journal of Physical Chemistry, vol. 116, 2012, pp. 1535-1543.

Lee et al., "Chemical Vapor Deposition of Mesoporous Graphene Nanoballs for Supercapacitor", ACSNANO, vol. 7, No. 7, 2013, pp. 6047-6055.

Lee et al., "Chemical Vapor Depostion of Mesoporous Graphene Nanoballs for Supercapacitor", ACSNANO, vol. 7, No. 7, 2013, pp. 6047-6055.

Li et al., "Flexible graphene-based lithium ion batteries with ultrafast charge and discharge rates", PNAS, vol. 109, No. 43, Oct. 23, 2012, pp. 17360-17365.

Lux et al., "Enhanced Electrochemical Performance of Graphite Anodes for Lithium-Ion Batteries by Dry coating with Hydrophobic Fumed Silica", Journal of The Electrochemical Society, vol. 159, No. 11, 2012, pp. A1849-A1855.

Mao et al., "A general Approach to One-Pot Fabrication of Grumpled Graphene-Based Nanohybrids for Energy Applications", ACSNaNo, vol. 6, No. 8, 2012, 7505-7513.

Nguyen ("Facile Synthesis and High Anode Performance of Carbon Fiber-Interwoven Amorphous Nano-SiOx/Graphene for Rechargeable Lithium Batteries." ACS Appl. Mater. Interfaces, 5, 11234-11239) (Year: 2013).

Shin et al., High performance screen printed thermoelectric films on fabric, scientific reports, 7:7317; 2017.

Wu et al., "Graphene/metal oxide composite electrode materials for energy storage", Nano Energy, vol. 1, 2012, pp. 107-131.

Zhou et al., "A general strategy toward graphene@metal oxide core-shell nanostructures for high-performance lithium storage*", Energy & Environmental Scinence, 4, 2011, 4954.

Zhou et al., "One-pot hydrothermal synthesis of a mesoporous SiO2-graphene hybrid with tunable surface area and bore size", Applied Surface Science, vol. 259, 2012, pp. 566-573.

Kim et al. "Graphene shell on silica nanowires toward a nanostructured electrode with controlled morphology", Appl. Phys. Lett. 103, 2013, 013101.

Korean Office Action for Korean Patent Application No. 10-2020-0176608 dated Feb. 16, 2021.

* cited by examiner

COMPOSITE, ELECTROCHEMICAL ACTIVE MATERIAL COMPOSITE USING THE COMPOSITE, ELECTRODE INCLUDING THE COMPOSITE OR ELECTROCHEMICAL ACTIVE MATERIAL COMPOSITE, LITHIUM BATTERY INCLUDING THE ELECTRODE, FIELD EMISSION DEVICE INCLUDING THE COMPOSITE, BIOSENSOR INCLUDING THE COMPOSITE, SEMICONDUCTOR DEVICE INCLUDING THE COMPOSITE, AND THERMOELECTRIC DEVICE INCLUDING THE COMPOSITE

CROSS REFERENCE TO RELATED APPLICATIONS

This application is a divisional of U.S. patent application Ser. No. 16/283,221, filed on Feb. 22, 2019, which is a divisional application of U.S. patent application Ser. No. 14/733,028 filed on Jun. 8, 2015 and patented as U.S. Pat. No. 10,249,871 on Apr. 2, 2019, which claims priority to and the benefit of Korean Patent Application No. 10-2014-0070267, filed on Jun. 10, 2014, in the Korean Intellectual Property Office, and all the benefits accruing therefrom under 35 U.S.C. § 119, the contents of which applications are incorporated herein in their entireties by reference.

BACKGROUND

1. Field

The present disclosure relates to composite, an electrochemically active material composite including the composite, an electrode including the composite or the electrochemically active material composite, and a lithium battery, field emission device, biosensor, semiconductor device, and thermoelectric device that include the composite.

2. Description of the Related Art

Lithium ion batteries have been widely used as power sources for various portable electronic devices due to their high energy density and ease of design. With the recent greater use of lithium ion batteries as power sources for electric vehicles, power storage, and portable electronic devices, research into materials that provide higher-energy density and longer lifetime has increased. In particular, surface coating of electrode active materials may be one of the satisfactory ways to improve the performance of lithium ion batteries with known electrode active materials.

Various coating materials are known to improve the performance of batteries. However, such known coating materials do not provide satisfactory suppression of a side reaction between an electrode active material and an electrolyte, adhesion between an electrode active material and a coating material, and electrode conductivity. Therefore, there remains a need for improved electrochemical materials,

SUMMARY

Provided is a composite.
Provided is a method of preparing the composite.
Provided is an electrochemically active material composite including any of the composite and an electrochemically active material.

Provided is an electrode that includes the composite, or the electrochemically active material composite including any of the composite and an electrochemically active material.

Provided is a lithium battery including the electrode.
Provided is a device including any of the composite.
Additional aspects will be set forth in part in the description which follows and, in part, will be apparent from the description.

According to an aspect, a composite includes
at least one selected from a silicon oxide of the formula $SiO_2$ and a silicon oxide of the formula $SiO_x$ wherein $0<x<2$; and
graphene, wherein the silicon oxide is disposed in a graphene matrix including the graphene.

According to another aspect, disclosed is a method of preparing a composite, the method including:
contacting a reaction gas including a carbon source gas and a silicon oxide of the formula $SiO_x$ wherein $0<x≤2$; and
thermally treating the reaction gas-contacted silicon oxide to prepare the composite.

According to another aspect, an electrochemically active material composite includes the composite and an electrochemically active material.

According to another aspect, an electrode includes the composite, or an electrochemically active material composite including the composite and an electrochemically active material.

According to another aspect, a lithium battery includes the electrode.

According to another aspect, a field emission device includes the composite.

According to another aspect, a biosensor includes the composite.

According to another aspect, a semiconductor device includes the composite.

According to another aspect, a thermoelectric device includes the composite.

BRIEF DESCRIPTION OF THE DRAWINGS

These and/or other aspects will become apparent and more readily appreciated from the following description of the embodiments, taken in conjunction with the accompanying drawings in which:

FIGS. 7B to 7E illustrate the results of XPS analysis on composites of Preparation Examples 1, 3 and 5, and structures of Comparative Preparation Examples 2 and 3 in which FIG. 7B is a graph of intensity (counts per second, C/S) versus binding energy (eV), and FIGS. 7C and 7D are each a graph of intensity (a.u.) versus binding energy (eV);

FIGS. 8A to 8D illustrate results of scanning electron microscopy with energy dispersive analysis of X-rays (SEM-EDAX) on the electrode material of Example 1 in which FIG. 8A is a secondary electron image of the electrode material of Example 1, FIG. 8B is an energy dispersive X-ray analysis (EDAX) map for Ni of the electrode material of Example 1, FIG. 8C is an EDAX map for carbon of the electrode material of Example 1, FIG. 8D is an EDAX map for silicon of the electrode material of Example 1;

FIG. 8E to 8H illustrate the results of scanning electron microscopy with energy dispersive analysis of X-rays (SEM-EDAX) on the electrode material of a lithium composite oxide of the formula $LiNi_{0.5}Co_{0.2}Mn_{0.3}O_2$ used for preparing the electrode material of Example 1 in which FIG. 8E is a secondary electron image of the lithium composite oxide $LiNi_{0.5}Co_{0.2}Mn_{0.3}O_2$, FIG. 8F is a secondary image for Ni of the lithium composite oxide $LiNi_{0.5}Co_{0.2}Mn_{0.3}O_2$, FIG. 8G is an EDAX map for carbon of the lithium composite oxide $LiNi_{0.5}Co_{0.2}Mn_{0.3}O_2$, and FIG. 8H is an EDAX map for silicon of lithium composite oxide $LiNi_{0.5}Co_{0.2}Mn_{0.3}O_2$;

FIGS. 13A to 13F are results of transmission electron with energy-dispersive X-ray spectrometry (TEM-EDS) analysis on the composite of Preparation Example 6 in which FIG. 13A is a scanning transmission electron (STEM) image, FIG. 13B is a C EDS map, FIG. 13C is a Si and C EDS map, FIG. 13D is a Si EDS map, FIG. 13E is a O EDS map, and FIG. 13F is an O and Si EDS map;

FIGS. 13G to 13K are results of TEM-EDS on silicon oxide ($SiO_2$) in which FIG. 13G is a STEM image, FIG. 13H is a C EDS map, FIG. 13I is a Si EDS map, FIG. 13J is an O EDS map, and FIG. 13K is an O and Si EDS map;

FIGS. 15A to 15C are results of TEM-EDS analysis on the composite of Preparation Example 1 in which FIG. 13A is a STEM image, FIG. 15B is a Si EDS map, and FIG. 15C is a graph of intensity (a.u.) versus energy (electron volts, eV)

DETAILED DESCRIPTION

Figure 1:
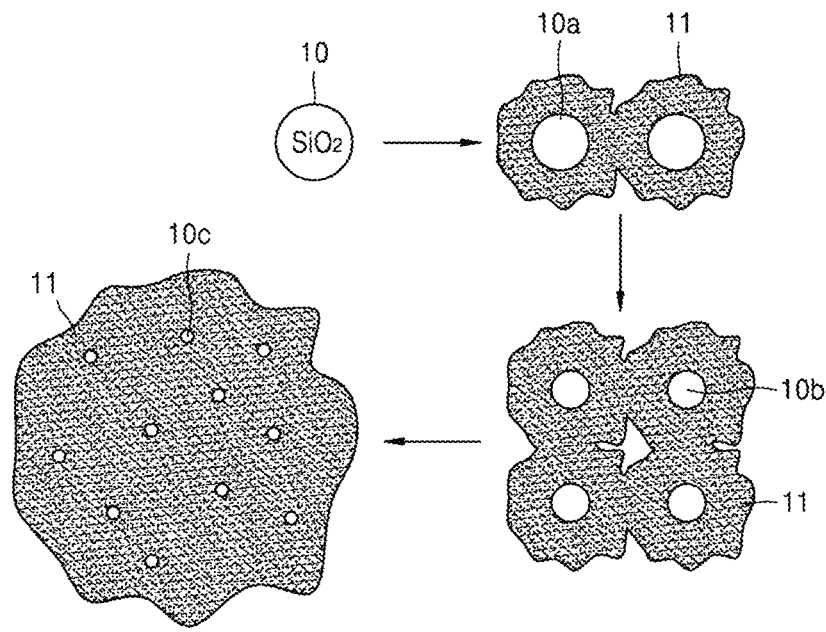
FIG. 1 is a schematic view of an embodiment of a method of preparing a composite.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed. "Or" means "and/or." Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Alkyl" as used herein means a straight or branched chain, saturated, monovalent hydrocarbon group (e.g., methyl or hexyl).

"Alkenyl" means a straight or branched chain, monovalent hydrocarbon group having at least one carbon-carbon double bond (e.g., ethenyl (—HC=CH$_2$)).

"Alkynyl" means a straight or branched chain, monovalent hydrocarbon group having at least one carbon-carbon triple bond (e.g., ethynyl).

"Rare earth" means the fifteen lanthanide elements, i.e., atomic numbers 57 to 71, plus scandium and yttrium.

The "lanthanide elements" means the chemical elements with atomic numbers 57 to 71.

A C rate means a current which will discharge a battery in one hour, e.g., a C rate for a battery having a discharge capacity of 1.6 ampere-hours would be 1.6 amperes.

Hereinafter, composites according to embodiments of the present disclosure, methods of preparing the same, electrochemically active material composites using the composites, lithium batteries including the composites or electrochemically active material composites, and field emission devices, electroluminescent devices, biosensors, semiconductor devices, and thermoelectric devices that use any of the composites according to embodiments of the present disclosure will be described in greater detail with reference to the appended drawings.

According to an aspect of the present disclosure, a composite includes; at least one selected from a silicon oxide of the formula SiO$_2$ and a silicon oxide of the formula SiO$_x$ wherein 0<x<2; and graphene, wherein the silicon oxide is disposed in, e.g., embedded in, a graphene matrix comprising the graphene. In an embodiment, the silicon oxide is of the formula SiO$_x$ wherein 0<x<2 and is a reduction product of SiO$_2$. In an embodiment, 0<x<1.9, 0.1<x<0.8, 0.2<x<1.7, 0.3<x<1.6, 0.4<x<1.5, or 0.5<x<1.4. In a preferred embodiment, 1<x<1.9.

As used herein, the term "embedded" may refer to a structure in which the silicon oxide (SiO$_2$) is surrounded by the graphene and may also be construed as a structure in which at least part of the silicon oxide is exposed from the graphene matrix.

The graphene may have a branched structure comprising contacting and/or interconnected graphene particles to provide a branched structure that resembles the branches of a bush, and the silicon oxide may be distributed in the graphene having the branched structure.

The graphene may have a globular or spherical structure having a size of about 50 nanometers (nm) to about 300 nm, about 75 nm to about 275 nm, or about 100 nm to about 150 nm. As used herein, the term "globular" may refer to a substantially spherical shape or any shape similar to sphere, including, for example an ellipse, or the like.

When the globular structure is a sphere, the size of the globular structure may be an average particle diameter of the sphere. When the globular structure is an ellipse, the size of the globular structure may be a major axis diameter of the ellipse.

The silicon oxide may have an average particle diameter of about 1 nm to about 20 nm, and in some embodiments, about 10 nm to about 20 nm, or about 5 nm to about 15 nm.

The silicon oxide may be, for example, at least one selected from $SiO_{1.8}$, $SiO_{1.9}$, $SiO_{1.7}$, $SiO_{1.8}$, $SiO_{1.5}$, and $SiO_{1.4}$, $SiO_{1.3}$.

The graphene may have a degree of crystallinity of about 0.5 to about 1.5, for example, about 1.055 to about 1.146, or about 1.06 to about 1.14.

The degree of crystallinity (or degree of disordering of graphene crystals) of the graphene may be obtained by measuring an intensity ratio of D peak to G peak (D/G) in a Raman spectra of the composite.

In the composite, the silicon oxide may have a degree of deviation in uniformity of about 1% or less, for example, about 0.0001 to about 1%, about 0.001 to about 0.9%, or about 0.01 to about 0.8%, which may be obtained, for example, by X-ray photoelectron spectroscopy (XPS).

In the composite, a major peak having a Bragg diffraction angle in a range of about 15 degrees two-theta (°2θ) to about 30 °2θ, about 16 °2θ to about 28 °2θ, or about 17 °2θ to about 26 °2θ, and a minor peak in a range of about 40 °2θ to about 50 °2θ, for example, about 40° to about 48°, about 42 °2θ to about 46 °2θ, when analyzed using Cu K-alpha X-rays having a wavelength of 1.541 Å.

In some embodiments, the major peak may appear, for example, in a range of about 18° to about 28°, and the minor peak may appear, for example, in a range of about 41° to about 46°. As used herein, the major peak may refer to a peak having the highest intensity, and the minor peak may refer to a peak having a lower intensity than the major peak.

In some embodiments, the major peak may have a full width at half maximum (FWHM) of about 5° to about 10°, about 6° to about 9°, or about 7° to about 8°. The composite having such X-ray diffraction characteristics may have improved characteristics in terms of, for example, conductivity.

In the composite, there are no silicon dioxide (i.e., $SiO_2$) and silicon carbide (SiC) peaks at a chemical shift of about −90 ppm to about −120 ppm, versus tetramethylsilane (TMS), when analyzed by $^{29}Si\{^1H\}$-cross-polarization magic-angle spinning (CP/MAS) nuclear magnetic resonance (NMR) spectroscopy.

In some embodiments, the composite may have a dumped structure. The dumped structure may be, for example, a globular structure. The clumped structure may vary depending on the shape of silicon dioxide ($SiO_2$) used as a starting material for the composite. For example, when the silicon dioxide ($SiO_2$) is in the form of spherical particles, the composite may have a clumped globular structure, for example, a crumpled paper ball structure. For example, when the silicon dioxide ($SiO_2$) is a mesoporous silicon dioxide, the composite may have a rectangular structure.

In some embodiments, the composite may have a crumpled paper ball structure in the form of a faceted sphere, and the silicon oxide may be distributed in the faceted spherical structure. In an embodiment, the crumpled paper ball structure has an overall shape of a sphere, and comprises facets on a smaller scale. In an embodiment, the crumpled paper ball structure comprises graphene microparticles, each of which has a planar shape, wherein the combination of graphene microparticles has an overall spherical shape to provide the crumpled paper ball structure. The graphene microparticles may have a dimension of 1 nm to about 500 nm, or about 5 nm to about 100 nm, and the crumpled paper ball structure may have an overall diameter of about 500 nm to about 5 μm, or about 600 nm to about 1 μm.

The silicon oxide may be in the form of at least one selected from a particle, a tube, a wire, a rod, a fiber, and a lump. The silicon oxide may be bound to the graphene via a chemical bond, for example, a covalent bond or an ionic bond. The covalent bond may include at least one of, for example, an ester group, an ether group, a carbonyl group, an amide group, and an acid anhydride group.

The ionic bond may be an ionic bond including, for example, carboxylic acid ions, ammonium ions, or acyl cations. The ammonium ions may be represented by the formula $RNH_3^+$ (where R may be a hydrogen or at least one of a C1-C20 alkyl group, a C2-C20 alkenyl group, and a C2-C20 alkynyl group).

In some embodiments, the amount of the graphene in the composite may be in a range of about 0.001 parts by weight to about 90 parts by weight, for example, about 10 parts by weight to about 80 parts by weight, based on 100 parts by weight of the composite. When the amount of the graphene is within these ranges, the composite may have improved conductivity characteristics.

The graphene is a polycyclic aromatic molecule formed of a plurality of covalently bonded carbon atoms. The plurality of covalently bonded carbon atoms may basically form a 6-membered ring as a repeating unit, but may further form a 5-membered ring and/or a 7-membered ring. As a result, the graphene may appear as a single layer of covalently bonded carbon atoms (comprising, generally, $sp^2$ bonding). The graphene may have a single layer, or a plurality of layers laminated upon one another. For example, the graphene may have 1 to about 100 layers, 2 to about 100 layers, or about 3 to about 50 layers.

The graphene may extend from the silicon oxide by a distance of about 10 nm or less, or about 1 nm to about 10 nm, and may include at least 1 to about 20 graphene layers, or about 2 to about 18 graphene layers, or about 3 to about 17 graphene layers, and may have a total thickness of about 0.6 nm to about 12 nm, or 0.7 nm to about 11 nm, or 0.8 nm to about 10 nm. The graphene may be oriented at an angle of about 0° to about 90°, about 3° to about 85°, or about 5° to about 80° with respect to a primary axis of the silicon oxide.

A proximity of the silicon oxide and the graphene may be evaluated by measuring distance between silicon of the silicon oxide and the graphene by scanning electron microscopy (SEM). The graphene may extend from the silicon by a distance of 10 nm or less, for example, about 0.5 nm to about 10 nm, or about 1 nm to about 8 nm. The graphene may be oriented at an angle of about 0° to about 90°, about 3° to about 85°, or about 5° to about 80° with respect to the primary axis of the silicon oxide. The graphene may include at least 1 to about 20 graphene layers, or about 2 to about 15 graphene layers, and may have a total thickness of about 0.6 nm to about 12 nm, about 1 nm to about 11 nm, or about 2 nm to about 10 nm. In a preferred embodiment, the graphene may be oriented at an angle of about 0° to 90° with respect to the primary axis of the silicon.

The silicon oxide may have any shape of, for example, but is not limited to, at least one selected from a nanowire, a particle, a nanotube, a nanorod, and a nanoribbon.

In some embodiments, the silicon oxide may be in the form of a nanowire. The nanowire may have a length of less than about 500 nm, for example, about 75 nm to about 400 nm, or about 100 nm to about 300 nm, and a diameter of about 50 nm, for example, about 25 nm to about 125 nm, or about 50 nm to about 100 nm.

In some embodiments, the composite may be prepared by vapor carbon deposition.

The vapor carbon deposition reaction may include: supplying a carbon source gas to contact the carbon source gas with silicon dioxide ($SiO_2$), wherein the carbon source gas may be i) a compound represented by Formula 2 or ii) a mixed gas of a compound represented by Formula 2 and at least one selected from a compound represented by Formula 1 and an oxygen-containing gas represented by Formula 3; and thermally treating the contacted silicon oxide.

$C_nH_{(2n+2-a)}[OH]_a$   Formula 1 wherein, in Formula 1, may be an integer of 1 to 20, and a may be 0 or 1, $C_nH_{(2n)}$   Formula 2 wherein, in Formula 2, n may be an integer of 2 to 6, and $CxHyOz$   Formula 3 wherein, in Formula 3, x may be 0 or an integer of to 20, y may be 0 or an integer of 1 to 20, and z may be 1 or 2.

Although not wanting to be limited to any specific theory, such coating by the above-described vapor carbon deposition is understood to be associated with reforming of the silicon dioxide ($SiO_2$) in the mixed gas with $CO_2$. For example, when the compound of Formula 1 is methane (i.e., where n in Formula 1 is 1 and a is 0), it may be supposed that deposition of carbon on silicon oxide may occur from a side reaction (e.g., a Boudouard reaction represented by Reaction Scheme 2) or a reformation reaction represented by Reaction Scheme 1, or from the decomposition reaction of the compound of Formula 1 as represented by Reaction Scheme 3.

$CH_4 + CO_2 \leftrightarrow 2H_2 + 2CO$   Reaction Scheme 1

$2CO \leftrightarrow CO_2 + C$   Reaction Scheme 2

$CH_4 \leftrightarrow 2H_2 + C$   Reaction Scheme 3

However, other reactions, not limited to the above-described reactions, may occur during the thermal treatment in the vapor carbon deposition reaction.

According to the above-described vapor carbon deposition, graphene may be directly grown on the silicon of silicon oxide product ($SiO_x$), and thus may have a high proximity to the silicon.

In some embodiments, graphene may be grown on the silicon oxide by reaction of a carbon-containing gas and an oxygen-containing gas to form the composite.

FIG. 1 is a schematic view of an embodiment of a method of preparing a composite. However, embodiments of the present disclosure are not limited to the scheme shown in FIG. 1, which is merely presented as an example.

Referring to FIG. 1, a reaction gas including a carbon source gas is supplied to contact a silicon dioxide ($SiO_2$) particle 10 to provide $SiO_x$ where 0<x≤2 having graphene 11 thereon, and thus graphene 11 may disposed, e.g., grown, on at least one silicon oxide particle 10a ($SiO_x$ where 0<x≤2). The graphene 11 may also be gradually grown on at least one second silicon oxide particle 10b ($SiO_x$ where 0<x≤2), resulting from the lapse of reaction time to thus obtain a composite.

For example, the composite may have a structure in which at least one third silicon oxide particle 10c is distributed in the graphene 11.

In FIG. 1, the silicon dioxide ($SiO_2$) particle 10, the at least one first silicon oxide particle 10a ($SiO_x$), the at least one second silicon oxide particle 10b, and the at least one third silicon oxide particle 10c, resulting from the lapse of reaction time, may appear to have different sizes, but are not limited thereto. The silicon oxide particles 10, 10a, 10b, and 10c, may each independently have a diameter of 10 nm to 500 nm, or about 20 nm to about 400 nm. Although not illustrated in detail, the graphene 11 in FIG. 1 may have a structure of layer or nanosheet, or a structure including flakes.

As used herein, the terms "nanosheet" and "layer" may be defined as follows.

The term "nanosheet" may refer to graphene formed in an irregular pattern on the silicon oxide ($SiO_x$), and the term "layer" may refer to graphene formed as a continuous uniform pattern on the silicon oxide ($SiO_x$). The term "flake" may refer to the case where the nanosheet or layer is partially damaged or deformed.

In some embodiments, the amount of the graphene in the composite may be in a range of about 0.001 parts by weight to about 90 parts by weight, for example, about 10 parts by weight or about 80 parts by weight, based on 100 parts by weight of the composite. When the amount of the graphene is within these ranges, the composite may have improved conductivity.

According to another aspect of the present disclosure, an electrochemically active material composite includes the composite according to the above-described embodiments and an electrochemically active material.

Charging and discharging may be performed at a high voltage to increase the capacity of a battery. While not wanting to be bound by theory, it is understood that during such charging and discharging, decomposition of the electrolyte, or dissolution and electrochemical deposition of an active metallic material may occur on a surface of the cathode of the battery. Such side reactions on the surface of the cathode may consequently lead to self-discharging of the battery during storage at high temperature and reduction in capacity during high-temperature charging and discharging.

While not wanting to be bound by theory, it is understood that using the composite disclosed herein or an electrochemically active material composite comprising the composite may reduce a side reaction resulting from the direct contact of the electrolyte to the electrode surface and electron transfer therebetween, and may also remove a byproduct that may result from charging and discharging and deteriorate cell performance.

Hereinafter, an embodiment of a method of preparing the composite, will be disclosed in greater detail.

A method of preparing a composite, according to an embodiment of the present disclosure, may include contacting a reaction gas including a carbon source gas and silicon dioxide ($SiO_2$); and thermally treating the reaction gas-contacted silicon dioxide to prepare the composite.

The carbon source gas may be i) a compound represented by Formula 2, or ii) a mixed gas of a compound represented by Formula 2 and at least one selected from a compound represented by Formula 1 and an oxygen-containing gas represented by Formula 3.

$$C_nH_{(2n+2-a)}[OH]_a \qquad \text{Formula 1}$$

wherein, in Formula 1, n may be an integer of 1 to 20, and a may be 0 or 1, $$C_nH_{(2n)} \qquad \text{Formula 2}$$

wherein, in Formula 2, n may be an integer of 2 to 6, $$C_xH_yO_z \qquad \text{Formula 3}$$

wherein, in Formula 3, x may be 0 or an integer of 1 to 20, y may be 0 or an integer of 1 to 20, and z may be 1 or 2.

The compound represented by Formula 1 or the compound represented by Formula 2 may be at least one selected from methane, ethylene, propylene, methanol, ethanol, and propanol.

The oxygen-containing gas represented by Formula 3 may include, for example, at least one selected from carbon dioxide ($CO_2$), carbon monoxide (CO), and water vapor ($H_2O$).

The method of preparing a composite may further include cooling with at least one inert gas selected from nitrogen, helium, and argon after the thermally treating of the reaction gas-contacted silicon dioxide ($SiO_2$). The cooling refers to controlling the temperature to room temperature (about 20° C. to about 25° C.).

The carbon source gas may include at least one inert gas selected from nitrogen, helium, and argon.

The oxygen-containing gas may be at least one selected from carbon monoxide, carbon dioxide, and water vapor.

In some embodiments, the graphene in the composite may have, for example, a layered structure including about 1 to about 20 layers, or about 5 to about 10 layers.

Figure 2:
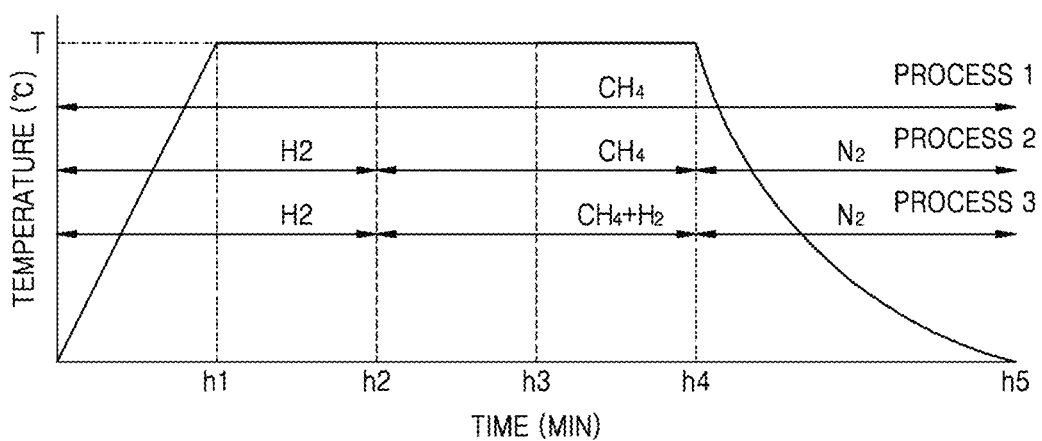
FIG. 2 is a graph of temperature (degrees Celsius, ° C.) versus time (minutes, min) for a method of forming graphene by vapor deposition in a method of preparing a composite.

FIG. 2 is a graph for explaining growing of graphene by a vapor deposition reaction and discloses reaction conditions such as temperature, time, and reaction gas composition in an embodiment of a method of preparing a composite.

Referring to FIG. 2, processes 1 and 2 illustrate an embodiment of a method of preparing a composite. Process 1 may include supplying methane ($CH_4$) and increasing a temperature to a thermal treatment temperature (T). A temperature increase time (h1) may be about 10 minutes to about 4 hours, about 20 minutes to about 3.5 hours, or about 30 minutes to about 3 hours, and the thermal treatment temperature (T) may be in a range of about 700° C. to about 1100° C., about 750° C. to about 1050° C., or about 800° C. to about 1000° C.

In process 1, thermal treatment may be performed at the thermal treatment time (T) for a reaction time (h4–h1), and then a product from the thermal treatment may be cooled down to room temperature to obtain a composite product. The time it takes to cool down to room temperature (h5–h4) may be, for example, about 1 to about 5 hours, about 1.5 to about 4.5 hours, or about 2 to about 4 hours.

The reaction time (h4–h1) may be, for example, about 4 to about 8 hours, about 4.5 to about 7.5 hours, or about 5 to about 7 hours.

Process 2 is the same as process 1, except that an initial reaction gas having a different composition is used, and nitrogen is supplied during the cooling to room temperature after the thermal treatment. The composite prepared by process 2 may include an increased amount of graphene and have a larger specific surface area and a larger conductivity, compared to the composite prepared by process 1.

Process 3 illustrates preparing a composite by a vapor deposition method. Process 3 may involve supplying hydrogen, increasing a temperature to a thermal treatment temperature T, a thermal treatment at the thermal treatment temperature T, supplying a mixed gas of methane and hydrogen at the thermal treatment temperature T, and cooling while supplying nitrogen.

In the methods of preparing a composite, according to the above-described embodiments of the present disclosure, when the carbon source gas includes water vapor, a composite having improved conductivity may be obtained. Although not limited to any specific theory, the high conductivity of the composite even with coating of less amount of carbon is attributed to the deposition of carbon having high crystallinity on the silicon oxide of the formula $SiO_x$ wherein $0<x\leq2$ by reaction of the gas mixture in the presence of water vapor. The amount of water vapor in the gas mixture, although not specifically limited, may be, for example, in a range of about 0.01% by volume (vol %) to about 10 vol %, 0.05% by volume (vol %) to about 8 vol %, or 0.1% by volume (vol %) to about 5 vol %, based on a total volume of the carbon source gas.

In some embodiments, the carbon source gas may be methane, a mixed gas of methane and an inert gas, an oxygen-containing gas, or a mixed gas of methane and an oxygen-containing gas.

In some embodiments, the carbon source gas may be i) $CH_4$, ii) a mixed gas of $CH_4$ and $CO_2$, or iii) a mixed gas of $CH_4$, $CO_2$, and $H_2O$.

The mixed gas of $CH_4$ and $CO_2$ may be supplied to have a mole ratio of $CH_4$ and $CO_2$ of about 1:0.2 to about 1:0.5, and in some embodiments, in a mole ratio of about 1:0.25 to about 1:0.45, and in some other embodiments, in a mole ratio of about 1:0.3 to about 1:0.4.

In the mixed gas of $CH_4$, $CO_2$, and $H_2O$, the amount of $CO_2$ is in the range of about 0.20 mole to about 0.50 mole, and in some embodiments, in the range of about 0.25 mole to about 0.45 mole, and in some other embodiments, in the range of about 0.30 mole to about 0.40 mole, based on 1 mole of $CH_4$. Also, the amount of $H_2O$ is in the range of about 0071 mole to about 1.45 mole, and in some embodiments, in the range of about 0.10 mole to about 1.35 mole, and in some other embodiments, in the range of about 0.05 mole to about 1.0 mole, based on 1 mole of $CH_4$.

In some embodiments, the carbon source gas may be carbon monoxide (CO) or carbon dioxide ($CO_2$).

In some embodiments, the carbon source gas may be a mixed gas of $CH_4$ and $N_2$.

The mixed gas of $CH_4$ and $N_2$ may be supplied in a mole ratio of $CH_4$ and $N_2$ of about 1:0.2 to about 1:0.5, and in some embodiments, in a mole ratio of about 1:0.25 to 1:0.45, and in some other embodiments, in a mole ratio of about 1:0.3 to about 1:0.4. In some embodiments, the carbon source gas may not include an inert gas such as nitrogen.

The thermal treatment may be performed at a temperature of about 700° C. to about 1100° C., about 750° C. to about 1050° C., or about 800° C. to about 1000° C.

The thermal treatment may be performed without limitation to a selected pressure. The pressure level for the thermal treatment may be appropriately selected in consideration of the thermal treatment temperature, composition of the gas mixture, and target amount of coated carbon. The pressure level for the thermal treatment may be controlled by varying the amounts of inflow and outflow of the gas mixture. For example, the pressure for the thermal treatment may be about 1 atmosphere (atm) or greater, and in some embodiments, about 2 atm or greater, about 3 atm or greater, about 4 atm or greater, or about 5 atm or greater, but is not limited thereto. In an embodiment the pressure for the thermal treatment may be about 1 atmosphere to about 50 atm, about 2 atm to about 45 atm, or about 4 atm to about 40 atm.

The thermal treatment time may be not specifically limited, and may be appropriately controlled depending on the thermal treatment temperature, thermal treatment pressure, composition of the gas mixture, and target amount of coated carbon. For example, the thermal treatment time may be in a range of about 10 minutes to about 100 hours, and in some embodiments, may be in a range of about 30 minutes to about 90 hours, and in some other embodiments, may be in a range of about 50 minutes to about 40 hours, but is not limited thereto. Although not limited to any specific theory, the longer the thermal treatment time, the more the amount of graphene (carbon) may be deposited, and the better the electrical characteristics of the composite may become. However, these effects may not be directly proportional to the thermal treatment time. For example, deposition of grapheme may not occur any longer after a predetermined duration, or the deposition rate may become low.

The disclosed methods of preparing the composite, according to the above-described embodiments of the present disclosure, may provide graphene which is uniformly coated on the silicon oxide ($SiO_x$), even at a relatively low temperature by vapor deposition of the carbon source gas as described above.

The coating of graphene on the silicon oxide ($SiO_x$) by vapor deposition may form a coating layer having high crystallinity on the composite. When the composite having such a highly-crystalline coating layer is used as an anode active material, the anode active material may have improved conductivity without structural change.

An electrochemically active material composite using the composite according to the above-described embodiments may be prepared as follows.

The disclosed composite may be mixed with an electrochemically active material to obtain a mixture of the composite and the electrochemically active material.

The mixing may be performed using a Nobita mixer. The mixing may be performed at a mixing rate of about 100 revolutions per minute (rpm) to about 800 rpm, for example, at about 300 rpm. The mixing time may vary depending on the mixing rate. For example, the mixing time may be in a range of about 10 minutes to about 100 minutes.

The amount of the composite in the mixture of the composite and the electrochemically active material may be in a range of about 0.1 parts by weight to about 100 parts by weight, for example, about 0.5 parts by weight to about 30 parts by weight, based on 100 parts by weight of the mixture.

Any of the composite or the electrochemically active material composite according to the above-described embodiment may be used in an electrode and a battery. For example, a composite according to any of the above-described embodiment may be used, for example, as an electrode active material, or a conducting agent for enhancing the binding strength between an electrode and an active material.

In some embodiments, the composite may be used as a field emission material for a display, or may be used in a thermoelectric device or a biosensor.

According to another aspect of the present disclosure, an electrode includes the composite or the electrochemically active material composite according to any of the above-described embodiments. The electrode may be an electrode for a lithium battery.

The electrode may be a cathode or an anode.

According to another aspect of the present disclosure, a lithium battery includes a composite or an electrochemically active material composite according to any of the above-described embodiments, the electrochemically active material composite including the composite and an electrochemically active material.

The electrochemically active material may be a commercially available cathode active material or a commercially available anode active material.

The cathode active material may include at least one selected from lithium cobalt oxide, lithium nickel cobalt manganese oxide, lithium nickel cobalt aluminum oxide, lithium iron phosphorous oxide, and lithium manganese oxide, but is not limited thereto. Any suitable cathode active material available in the art may be used.

For example, the cathode active material may be a compound represented by one of the following formulas: $Li_aA_{1-b}B'_bD'_2$ (where $0.90 \leq a \leq 1.8$, and $0 \leq b \leq 0.5$); $Li_aE_{1-b}B'_bO_{2-c}D'_c$ (where $0.90 \leq a \leq 1.8$, $0 \leq b \leq 0.5$, and $0 \leq c \leq 0.05$); $LiE_{2-b}B'_bO_{4-c}D'_c$ (where $0 \leq b \leq 0.5$, and $0 \leq c \leq 0.05$); $Li_aNi_{1-b-c}Co_bB'_cD'_\alpha$ (where $0.90 \leq a \leq 1.8$, $0 \leq b \leq 0.5$, $0 \leq c \leq 0.05$, and $0 < \alpha < 2$); $Li_aNi_{1-b-c}Co_bB'_cO_{2-\alpha}F'_\alpha$ (where $0.90 \leq a \leq 1.8$, $0 \leq b \leq 0.5$, $0 \leq c \leq 0.05$, and $0 < \alpha < 2$); $Li_aNi_{1-b-c}Co_bB'_cO_{2-\alpha}F'_2$ (where $0.90 \leq a \leq 1.8$, $0 \leq b \leq 0.5$, $0 \leq c \leq 0.05$, and $0 < \alpha < 2$); $Li_aNi_{1-b-c}Mn_bB'_cD'_\alpha$ (where $0.90 \leq a \leq 1.8$, $0 \leq b \leq 0.5$, $0 \leq c \leq 0.05$, and $0 < \alpha \leq 2$); $Li_aNi_{1-b-c}Mn_bB'_cO_{2-\alpha}F'_\alpha$ (where $0.90 \leq a \leq 1.8$, $0 \leq b \leq 0.5$, $0 \leq c \leq 0.05$, and $0 < \alpha < 2$); $Li_aNi_{1-b-c}Mn_bB'_cO_{2-\alpha}F'_2$ (where $0.90 \leq a \leq 1.8$, $0 \leq b \leq 0.5$, $0 \leq c \leq 0.05$, and $0 < \alpha < 2$); $Li_aN_{i_b}E_cG_dO_2$ (where $0.90 \leq a \leq 1.8$, $0 \leq b \leq 0.9$, $0 \leq c \leq 0.5$, and $0.001 \leq d \leq 0.1$); $Li_aNi_bCo_cMn_dGeO_2$ (where $0.90 \leq a \leq 1.8$, $0 \leq b \leq 0.9$, $0 \leq c \leq 0.5$, $0 \leq d \leq 0.5$, and $0.001 \leq e \leq 0.1$); $Li_aNiG_bO_2$ (where $0.90 \leq a \leq 1.8$, and $0.001 \leq b \leq 0.1$); $Li_aCoG_bO_2$ (where $0.90 \leq a \leq 1.8$, and $0.001 \leq b \leq 0.1$); $Li_aMnG_bO_2$ (where $0.90 \leq a \leq 1.8$, and $0.001 \leq b \leq 0.1$); $Li_aMn_2G_bO_4$ (where $0.90 \leq a \leq 1.8$, and $0.001 \leq b \leq 0.1$); $QO_2$; $QS_2$; $LiQS_2$; $V_2O_5$; $LiV_2O_5$; $LiI'O_2$; $LiNiVO_4$; $Li_{(3-f)}J_2(PO_4)_3$ (where $0 \leq f \leq 2$); $Li_{(3-f)}Fe_2(PO_4)_3$ (where $0 \leq f \leq 2$); and $LiFePO_4$.

In the formulas above. A is at least one selected from nickel (Ni), cobalt (Co), and manganese (Mn); B' is at least one selected from aluminum (Al), nickel (Ni), cobalt (Co), manganese (Mn), chromium (Cr), iron (Fe), magnesium (Mg), strontium (Sr), vanadium (V), and a rare earth element; D' is at least one selected from oxygen (O), fluorine (F), sulfur (S), and phosphorus (P); E is at least one selected from cobalt (Co), and manganese (Mn); F' is at least one selected from fluorine (F), sulfur (S), and phosphorus (P); G is at least one selected from aluminum (Al), chromium (Cr), manganese (Mn), iron (Fe), magnesium (Mg), lanthanum (La), cerium (Ce), strontium (Sr), and vanadium (V); Q is at least one selected from titanium (Ti), molybdenum (Mo), and manganese (Mn); is at least one selected from chromium (Cr), vanadium (V), iron (Fe), scandium (Sc), and yttrium (Y); and J is at least one selected from vanadium (V), chromium (Cr), manganese (Mn), cobalt (Co), nickel (Ni), and copper (Cu).

The cathode active material may be, for example, a compound represented by Formula 4, a compound represented by Formula 5, or a compound represented by Formula 6.

$$Li_aNi_bCo_cMn_dO_2 \quad \text{Formula 4}$$

In Formula 4, $0.90 \leq a \leq 1.8$, $0 \leq b \leq 0.9$, $0 \leq c \leq 0.5$, $0 \leq d \leq 0.5$.

$$Li_2MnO_3 \quad \text{Formula 5}$$

$$LiMO_2 \quad \text{Formula 6}$$

In Formula 6, M may be at least one selected from Mn, Fe, Co, and Ni.

The cathode active material may be, for example, $LiNi_{0.5}Co_{0.2}Mn_{0.3}O_2$. In some embodiments, the cathode active material may be a compound represented by Formula 7.

$$yLi[Li_{1/3}Me_{2/3}]O_2-(1-y)LiMe'O_2 \quad \text{Formula 7}$$

In Formula 7, $0<y<1$; Me may be at least one selected from Mn, Mo, W, V, Ti, Zr, Ru, Rh, Pd, Os, Ir, and Pt; and Me' may be at least one selected from Ni, Co, Mn, Cr, Zr, Nb. Cu, V, Ti, Zn, Al, Ga, Mg, and boron (B). For example, Me' may be at least one selected from Ni, Mn, and Co.

In Formula 7, for example, $0<y<0.8$.

In Formula 7, Me may be represented by Formula 8.

$$M'_aM_bMn_c \quad \text{Formula 8}$$

In some embodiments, in Formula 8,

M may be at least one selected from molybdenum (Mo), tungsten (W), vanadium (V), titanium (Ti), zirconium (Zr), ruthenium (Ru), rhodium (Rh), palladium (Pd), osmium (Os), iridium (Ir), and platinum (Pt), M' may be at least one selected from nickel (Ni), copper (Cu), zinc (Zn), cobalt (Co), chromium (Cr), iron (Fe), and magnesium (Mg), $0 \le a \le 0.33$, $0 < b \le 0.33$, and $a+b+c=1$.

The cathode active material may be at least one selected from compounds represented Formulas 9 to 12, $$Li_xCo_{1-y-z}Ni_yM_zO_{2-a}X_a \quad \text{Formula 9}$$

In Formula 9, $0.9 \le x \le 1.6$, $0 \le y \le 1$, $0 \le z \le 1$, $0 \le a \le 1$, X may be at least one selected from oxygen (O), fluorine (F), sulfur (S), and phosphorous (P), and M may be at least one selected from Ni, Co, Mn, Cr, Zr, Nb, Cu, V, Ti, Zn, Al, Ga, Mg, and boron (B).

$$Li_xMn_{2-y}M_yO_{4-a}X_a \quad \text{Formula 10}$$

In Formula 10, $0.9 \le x \le 1.6$, $0 \le y \le 1$, $0 \le z \le 0.5$, $0 \le a \le 1$, X may be at least one selected from oxygen (O), fluorine (F), sulfur (S), and phosphorous (P), and M may be at least one selected from Ni, Co, Mn, Cr, Zr, Nb, Cu, V, Ti, Zn, Al, Ga, Mg, and boron (B).

$$MFePO_4 \quad \text{Formula 11}$$

In Formula 11, M may be at least one selected from Ni, Co, Mn, Cr, Zr, Nb, Cu, V, Ti, Zn, Al, Ga, Mg, and B, $$Li_xM_yM'_zPO_{4-d}X_d \quad \text{Formula 12}$$

In Formula 12, $0.9 \le x \le 1.1$, $0 < y \le 1$, $1.9 \le x+y+z \le 2.1$, $0 \le d \le 0.2$, M may be at least one selected from the group consisting of Fe, Mn, Ni, and Co, M' may be at least one selected from Mg, Ca, Sr, Ba, Ti, Zr, Nb, Mo, W, Zn, Al, Si, Cr, Zr, Nb, Cu, V, Ti, Zn, Ga, and B, and X may be at least one selected from the group consisting of S and F.

In Formulas 9 and 10, x may be in a range of about 1.1 to about 1.6.

In some embodiments, the cathode active material may be selected from $Li_{1.18}Ni_{0.17}Co_{0.1}Mn_{0.56}O_2$, $LiCoO_2$, $LiFePO_4$, $LiFe_{1-a}Mn_aPO_4(0<a<1)$, $LiNi_{0.5}Mn_{1.5}O_4$, and $LiMnPo_4$.

An anode active material may be used as the electrochemically active material. For example, the anode active material may be a structure with a metal nanowire disposed on a carbonaceous base. The amount of the carbonaceous base may be in a range of about 1 part by weight to about 20 parts by weight, based on 100 parts by weight of the structure.

The metal nanowire may be, for example, a silicon oxide nanowire.

The carbonaceous base may comprise graphite. For example, the graphite may be SFG6 graphite (TimCal Co.), and may have an average particle diameter of about 16 micrometers (μm). The metal nanowire may have a diameter of about 50 nm and a length of about 400 nm.

In an electrode formed using an electrochemically active material composite according to any of the above-described embodiments, the amount of the electrochemically active material composite may be, for example, in a range of about 68 parts by weight to about 87 parts by weight, based on 100 parts by weight of the electrode. The amount of the binder may be in a range of about 13 parts by weight to about 32 parts by weight, based on 100 parts by weight of the electrode. An example of the binder is lithium polyacrylate (LiPAA).

A battery having improved capacity and good improved rate characteristics may be manufactured using an electrochemically active material composite according to any of the above-described embodiments.

An electrochemically active material composite according to any of the above-described embodiments may be used as an electrode active material as described above, and may also be used alone without a common conducting agent when prepared as a composite with a conducting agent.

The electrochemically active material composite may reduce the specific surface area of the electrochemically active material, and thus may improve the binding strength between a current collector and the electrochemically active material and the binding strength between the electrochemically active materials when used to form an electrode.

A cathode may be manufactured as follows.

First, a cathode active material, a binder, and a solvent are mixed to prepare a cathode active material composition. A conducting agent may be further added into the cathode active material composition.

The cathode active material composition may be directly coated on a metallic current collector and dried to form a cathode plate. Alternatively, the cathode active material composition may be cast on a separate support to form a cathode active material film, which may then be separated from the support and laminated on a metallic current collector to form a cathode plate.

An electrochemically active material composite according to any of the above-described embodiment may be used as the cathode active material.

The cathode may further include an additional cathode active material as used in a lithium battery, in addition to the electrochemically active material composite.

The additional cathode active material may be at least one selected from lithium cobalt oxide, lithium nickel cobalt manganese oxide, lithium nickel cobalt aluminum oxide, lithium iron phosphorous oxide, and lithium manganese oxide, but is not limited thereto. Any suitable cathode active material available in the art may be used.

The compounds listed above as an additional cathode active material may have a surface coating layer (hereinafter, a "coating layer"). Alternatively, a mixture of a compound without having a coating layer and a compound having a coating layer, the compounds being selected from the compounds listed above, may be used. The coating layer may include at least one compound of a coating element selected from an oxide, hydroxide, oxyhydroxide, oxycarbonate, and hydroxycarbonate of the coating element. The compounds for the coating layer may be amorphous or crystalline. The coating element for the coating layer may be at least one selected from magnesium (Mg), aluminum (Al), cobalt (Co), potassium (K), sodium (Na), calcium (Ca), silicon (Si), titanium (Ti), vanadium (V), tin (Sn), germanium (Ge), gallium (Ga), boron (B), arsenic (As), and zirconium (Zr). The coating layer may be formed using any suitable method that does not adversely affect the physical properties of the cathode active material when a compound of the coating element is used. For example, the coating layer may be formed using a spray coating method, a dipping method, or the like. The details of the coating method can be determined by one of skill in the art without undue experimentation, and thus a detailed description thereof will be omitted.

The conducting agent, binder, and solvent used in the cathode active material composition may be the same as those used in an anode active material composition described above. If desired, a plasticizer may be further added to the cathode active material composition and/or the anode active material composition to form pores in the electrode plates.

The amounts of the cathode active material, the conducting agent, the binder, and the solvent may be those levels that are generally used in the manufacture of lithium batteries in the art. At least one of the conducting agent, the binder and the solvent may be omitted depending on the use and the structure of a lithium battery.

An anode may be manufactured in a substantially same manner as in the manufacture of the cathode, except for using an anode active material instead of a cathode active material.

Examples of the anode active material are at least one selected from a carbonaceous material, silicon, a silicon oxide, a silicon-based alloy, a silicon-carbonaceous material composite, tin, a tin-based alloy, a tin-carbon composite, and a metal oxide.

Examples of the carbonaceous material are crystalline carbon, amorphous carbon, and mixtures thereof. Non-limiting examples of the crystalline carbon are graphite, such as natural graphite or artificial graphite that are in amorphous, plate, flake, spherical or fibrous form. Non-limiting examples of the amorphous carbon are soft carbon (carbon sintered at low temperatures), hard carbon, mesophase pitch carbides, sintered corks, graphene, carbon black, fullerene soot, carbon nanotubes, and carbon fibers. Any appropriate material available in the art may be used.

For example, the anode active material may be selected from Si, $SiO_x$ (where $0<x<2$, for example, $0.5 \leq x \leq 1.5$), Sn, $SnO_2$, a silicon-containing metal alloy, and mixtures. A metal alloyable with silicon may be at least one selected from Al, Sn, Ag, Fe, Bi, Mg, Zn, in, Ge, Pb, and Ti.

The anode active material may include a metal/metalloid alloyable with lithium, an alloy thereof, or an oxide thereof. Examples of the metal/semimetalloid alloyable with lithium are Si, Sn, Al, Ge, Pb, Bi, Sb, a Si—Y' alloy (where Y' is an alkali metal, an alkaline earth metal, a Group 13 element, a Group 14 element, a transition metal, a rare earth element, or a combination thereof except for Si), a Sn—Y" alloy (where Y" is an alkali metal, an alkaline earth metal, a Group 13 element, a Group 14 element, a transition metal, a rare earth element, or a combination thereof except for Sn), and $MnO_x$ (where $0<x\leq2$). Y may be magnesium (Mg), calcium (Ca), strontium (Sr), barium (Ba), radium (Ra), scandium (Sc), yttrium (Y), titanium (Ti), zirconium (Zr), hafnium (Hf), rutherfordium (Rf), vanadium (V), niobium (Nb), tantalum (Ta), dubnium (Db), chromium (Cr), molybdenum (Mo), tungsten (W), seaborgium (Sg), technetium (Tc), rhenium (Re), bohrium (Bh), iron (Fe), lead (Pb), ruthenium (Ru), osmium (Os), hassium (Hs), rhodium (Rh), iridium (Ir), palladium (Pd), platinum (Pt), copper (Cu), silver (Ag), gold (Au), zinc (Zn), cadmium (Cd), boron (B), aluminum (Al), gallium (Ga), tin (Sn), indium (In), titanium (Ti), germanium (Ge), phosphorus (P), arsenic (As), antimony (Sb), bismuth (Bi), sulfur (S), selenium (Se), tellurium (Te), polonium (Po), or combinations thereof. Non-limiting examples of the oxide of the metal/metalloid alloyable with lithium are a lithium titanium oxide, a vanadium oxide, and a lithium vanadium oxide, $SnO_2$, and $SiO_x$ (where $0<x<2$).

For example, the anode active material may include at least one element selected from the elements of Groups 13, 14, and 15 of the periodic table of elements.

In some other embodiments, the anode active material may include at least one element selected from Si, Ge, and Sn.

The amounts of the anode active material, conducting agent, binder, and solvent may be those levels that are generally used in the manufacture of lithium batteries in the art.

A separator may be disposed between the cathode and the anode. The separator may be an insulating thin film having high ion permeability and strong mechanical strength.

The separator may have a pore diameter of about 0.01 µm to about 10 µm and a thickness of about 5 µm to about 20 µm. Examples of the separator are olefin-based polymers, such as polypropylene, and sheets or non-woven fabric made of glass fiber or polyethylene. When a solid polymer electrolyte is used, the solid polymer electrolyte may also serve as the separator.

The separator may be a monolayer or a multilayer including at least two layers of olefin-based polymer, for example, polyethylene, polypropylene, polyvinylidene fluoride, or a combination thereof. For example, the separator may be a two-layered separator including polyethylene and polypropylene layers, a three-layered separator including polyethylene, polypropylene and polyethylene layers, or a three-layered separator including polypropylene, polyethylene and polypropylene layers.

In the preparation of lithium battery, a lithium salt-containing non-aqueous electrolyte is used. The lithium salt-containing non-aqueous electrolyte may include a non-aqueous electrolyte and a lithium salt.

The non-aqueous electrolyte may be a non-aqueous liquid electrolyte, an organic solid electrolyte, or an inorganic solid electrolyte.

The non-aqueous liquid electrolyte may include an organic solvent. The organic solvent may be any organic solvent available in the art. Examples of the organic solvent are propylene carbonate, ethylene carbonate, fluoroethylene carbonate, butylene carbonate, dimethyl carbonate, diethyl carbonate, methylethyl carbonate, methylpropyl carbonate, ethylpropyl carbonate, methylisopropyl carbonate, dipropyl carbonate, dibutyl carbonate, chloroethylene carbonate, benzonitrile, acetonitrile, tetrahydrofuran, 2-methyltetrahydrofuran, γ-butyrolactone, dioxorane, 4-methyldioxorane, N,N-dimethyl formam ide, N,N-dimethyl acetamide, N,N-dimethylsulfoxide, dioxane, 1,2-dimethoxyethane, sulforane, dichloroethane, chlorobenzene, nitrobenzene, diethylene glycol, dimethyl ether, or mixtures thereof.

Examples of the organic solid electrolyte are polyethylene derivatives, polyethylene oxide derivatives, polypropylene oxide derivatives, phosphoric acid ester polymers, poly agitation lysine, polyester sulfide, polyvinyl alcohols, polyvinylidene fluoride, and polymers containing ionic dissociation groups.

Non-limiting examples of the inorganic solid electrolyte are nitrides, halides, and sulfates of lithium, such as $Li_3N$, LiI, Li$_5$NI$_2$, Li$_3$N—LiI—LiOH, Li$_2$SiS$_3$, Li$_4$SiO$_4$, Li$_4$SiO$_4$—LiI—LiOH, and Li$_3$PO$_4$—Li$_2$S—SiS$_2$.

The lithium salt may be a material dissoluble in the non-aqueous electrolyte, for example, LiPF$_6$, LiBF$_4$, LiSbF$_6$, LiAsF$_6$, LiClO$_4$, LiCF$_3$SO$_3$, Li(CF$_3$SO$_2$)$_2$N, LiC$_4$FgSO$_3$, LiAlO$_2$, LiAlCl$_4$, LiN(C$_x$F$_{2x+1}$SO$_2$)(C$_y$F$_{2y+1}$SO$_2$) (where x and y are natural numbers), LiCl, LiI, or a mixture thereof. An additive to improve charge and discharge characteristics and resistance to flame may be added to the non-aqueous electrolyte. Examples of the additive are pyridine, triethylphosphite, triethanolamine, cyclic ethers, ethylenediamine, n-glyme, hexamethylphosphoramide, nitrobenzene derivatives, sulfur, quinine imine dyes, N-substituted oxazolidinone, N, N-substituted imidazolidine, ethylene glycol dialkyl ether, ammonium salts, pyrrole, 2-methoxyethanol, and aluminum trichloride. A halogen-containing solvent, such as carbon tetrachloride, ethylene trifluoride, or the like, may be further added to provide non-flammability.

Figure 3A:
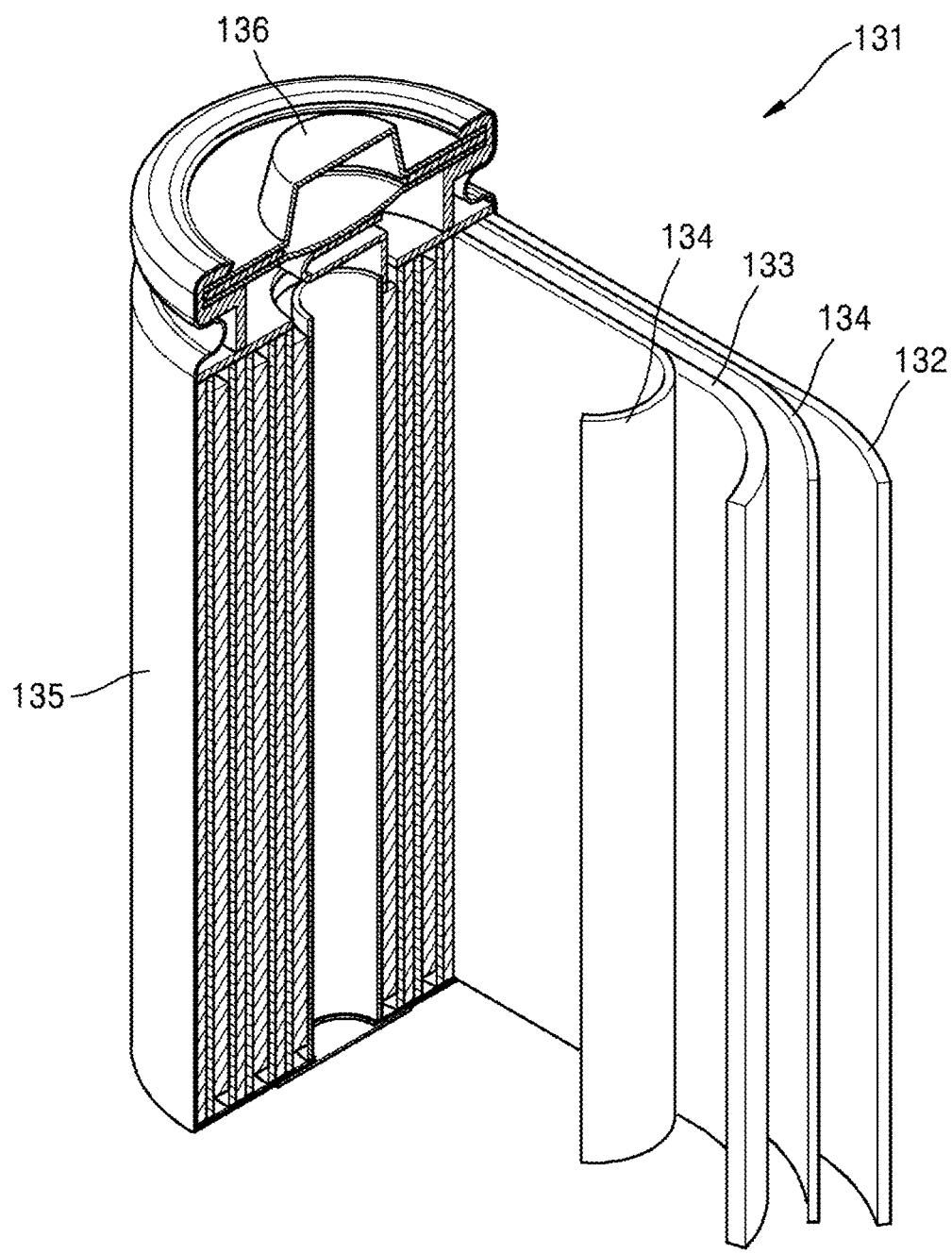
FIG. 3A is a schematic view of an embodiment of a lithium battery.

FIG. 3A is a schematic view of a lithium battery 131 according to an embodiment of the present disclosure. Referring to FIG. 3A, the lithium battery 131 includes a cathode 133, an anode 132, and a separator 34. The cathode 133, the anode 132 and the separator 134 may be wound or folded, and then sealed in a battery case 135. Then, the battery case 135 is filled with an organic electrolyte solution and sealed with a cap assembly 136, thereby completing the manufacture of the lithium battery 131. The battery case 135 may be a cylindrical type, a rectangular type, or a thin-film type. For example, the lithium battery 131 may be a thin-film type battery. For example, the lithium battery 131 may be a lithium ion battery.

The separator 134 may be interposed between the cathode 133 and the anode 32 to form a battery assembly. A plurality of such battery assemblies may be stacked in a bi-cell structure and impregnated with an organic liquid electrolyte. The resultant is then put into a pouch and hermetically sealed to manufacture a lithium ion battery.

Alternatively, a plurality of battery assemblies may be stacked upon one another to form a battery pack, which may be used in any device that operates at high temperatures and requires high output, for example, in a laptop computer, a smart phone, electric vehicle, and the like.

A lithium battery including such a battery pack may have improved high rate characteristics and lifetime characteristics, and thus may be applicable in an electric vehicle (EV), for example, in a hybrid vehicle such as plug-in hybrid electric vehicle (PHEV).

The lithium battery including such a battery pack may have improved conductivity, and consequently exhibit a higher initial charge-discharge efficiency and a higher capacity. Due to reduced resistance against the rate of charging and discharging, the lithium battery may be charged or discharged at high rates. In particular, a side reaction on the surface of a cathode and decomposition of the electrolyte on the surface of the cathode may be effectively prevented, so that the lithium battery may have a longer lifetime and improved durability.

According to another aspect of the present disclosure, a field emission device includes the composite.

A field emission device is a device using migration of electrons. In general, a field emission device may include, at least, a reduction electrode, an emitter tip, and an oxidation electrode separated from the reduction electrode (see U.S. Pat. Nos. 7,009,331, 6,976,897, and 6,911,767, and US 2006/0066217, the contents of which are incorporated herein in their entirety by reference). The emitter tip may emit electrons as a voltage is applied between the reduction electrode and the oxidation electrode. The electrons may migrate from the reduction electrode toward the oxidation electrode. An field emission device according to an embodiment of the present disclosure may be used for various purposes, for example, in an ultrasonic vacuum tube equipment (for example, X-ray tube), a power amplifier, an ion gun, a high-energy accelerator, a free-electron laser, and an electron microscope, and specifically, in a flat display device. A flat display device may be used as an alternative to a cathode tube, and thus may also be applicable in a TV or a computer monitor.

A composite according to any of the above-described embodiments may be used as the emitter tip.

An emitter tip may be manufactured using a metal such as molybdenum (Mo) or a semiconductor such as silicon. One of the concerns with using the metal emitter is the comparatively high control voltage of about 100 V required for emission. In addition, due to nonuniformity of such emitter tips, current densities of individual pixels of a field emission device using the metal emitter tips may be nonuniform.

However, when an emitter tip using a composite according to any of the above-described embodiments is used, the field emission device may have improved field emission characteristics.

The composite according to any of the above-described embodiments may be used to prepare an electroluminescent device.

According to another aspect of the present disclosure, a biosensor includes the composite.

The composite according to any of the above-described embodiments may be used to form an electrode of the biosensor.

Figure 3B:
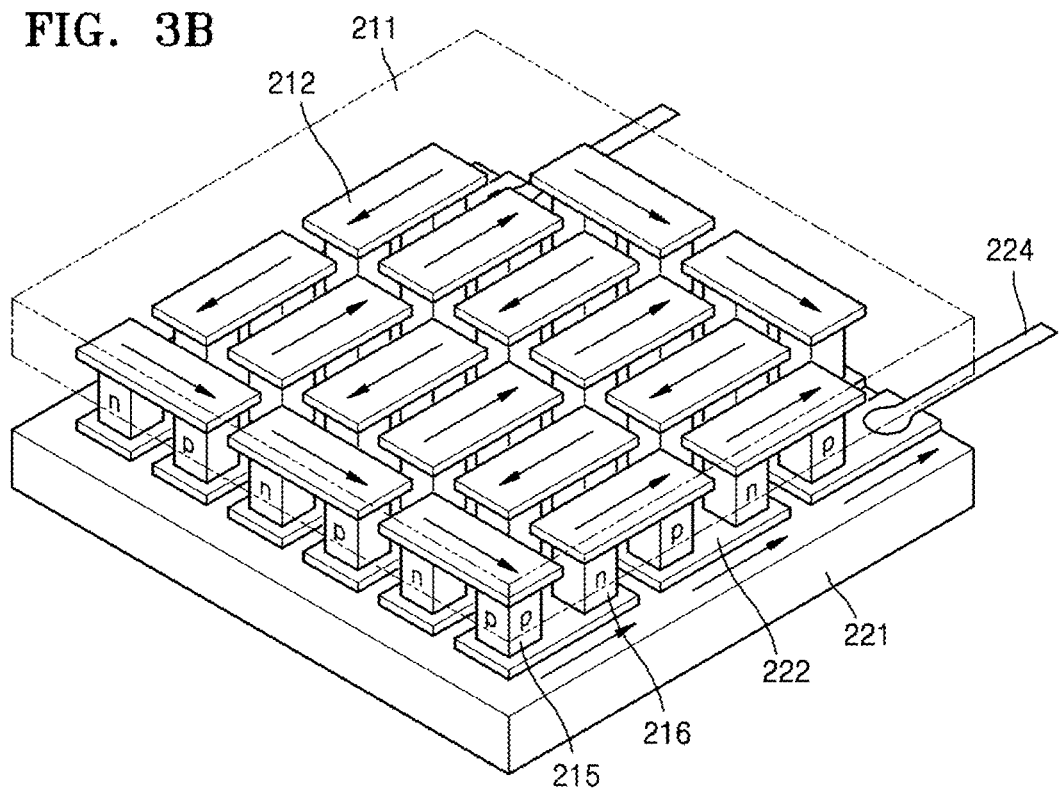
FIG. 3B is a schematic view of an embodiment of a thermoelectric module.
Figure 3C:
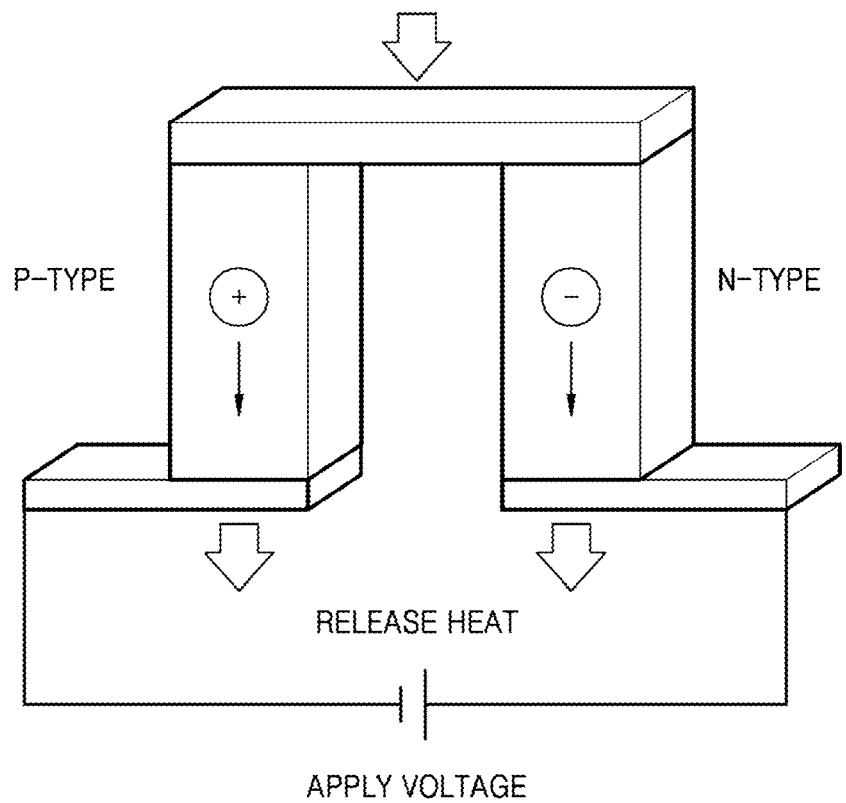
FIG. 3C illustrates an embodiment of thermoelectric cooling using the Peltier effect.
Figure 3D:
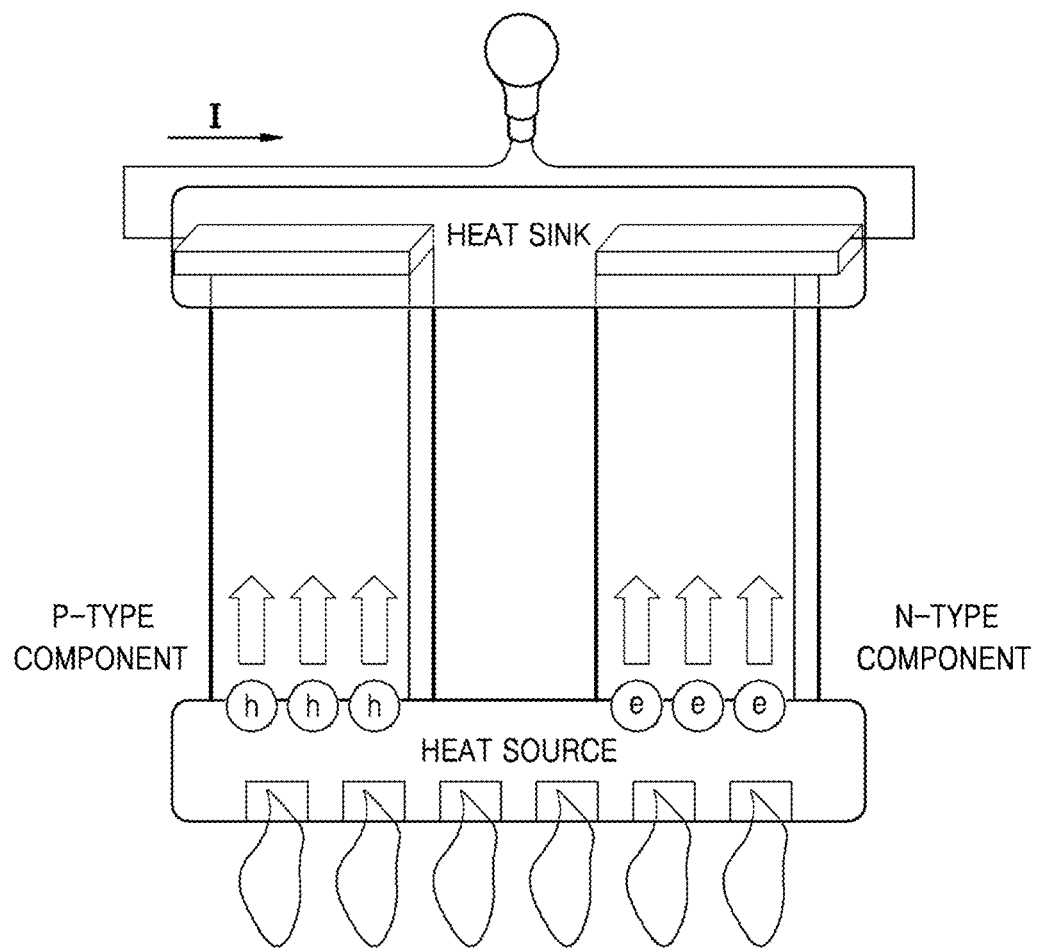
FIG. 3D illustrates an embodiment of thermoelectric power generation using the Seebeck effect.
Figure 3E:
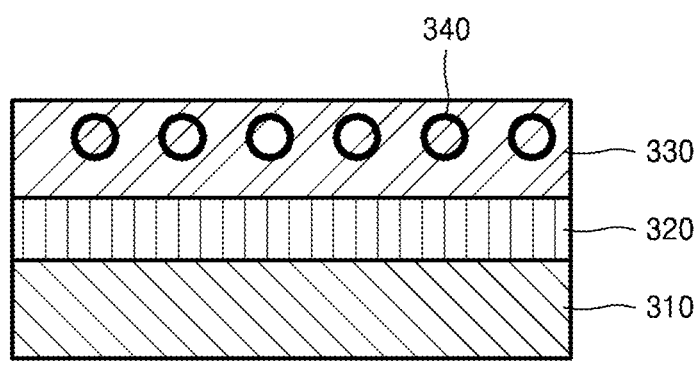
FIG. 3E is a schematic cross-sectional view illustrating an embodiment of a structure of an electrode of a biosensor.

FIG. 3E is a schematic cross-sectional view illustrating a structure of an electrode of a biosensor according to an embodiment of the present disclosure.

Referring to FIG. 3E, the electrode of the biosensor includes a substrate 310, a first layer 320 disposed on the substrate 310 and including a composite and a second layer 330 disposed on the first layer 320. A biomaterial 340 may be supported or fixed in the second layer 330 in a variety of manners.

The substrate 310 may be any plate on which graphene may be deposited or formed, and for example, may be selected from the group consisting of glass, plastic, metal, ceramic, and silicon. A type of the substrate 310 is not specifically limited, provided that graphene may be deposited or formed thereon.

The biomaterial 340 may be selected from enzymes, aptamers, proteins, nucleic acids, microorganisms, cells, lipids, hormones, DNA, PNA, RNA, and a mixture thereof. Any suitable biomaterial may also be used.

Referring to FIG. 3E, in the electrode of a biosensor, the biomaterial 340 may be an enzyme, and the first layer 320 may be a layer able to support or fix the enzyme therein.

Although in FIG. 3E an enzyme as the biomaterial 340 appears to be supported or fixed in the first layer 320, the location of the enzyme is not limited thereto, and a part or the whole enzyme may protrude through the surface of the first layer 320 and be exposed. When a biosensor has this structure including an enzyme with substrate specificity to selectively respond to a target molecule in a mixture, the biosensor may selectively sense an analyte (for example, blood sugar) that responds to the enzyme.

According to another aspect of the present disclosure, a semiconductor device includes the composite.

The composite may be used as an electrode of the semiconductor device.

According to another aspect of the present disclosure, there are provided a thermoelectric material and a thermoelectric device, each including the composite.

The thermoelectric material may have good electrical characteristics, and consequentially have improved thermoelectric performance. The thermoelectric material may be used in a thermoelectric device, a thermoelectric module, or a thermoelectric system.

The performance of the thermoelectric material is evaluated using a dimensionless figure of merit (ZT), which is defined by Equation 1.

$$ZT=(S^2\sigma T)/k \qquad \text{Equation 1}$$

In Equation 1, ZT is a figure of merit, S is a Seebeck coefficient, a is an electrical conductivity, T is an absolute temperature, and k is a thermal conductivity.

As represented in Equation 1, a higher ZT value of a thermoelectric material may be obtained by increasing the Seebeck coefficient (S) and electrical conductivity (a) of the thermoelectric material, i.e., a power factor ($S^2\sigma$), and reducing the thermal conductivity (k) of the thermoelectric material.

A composite according to any of the above-described embodiments may include graphene, and thus may provide a high electrical conductivity and a low thermal conductivity to a thermoelectric material when used therein, due to the characteristics of graphene, and thus improving the performance of the thermoelectric material.

In a composite according to any of the above-described embodiments, crystalline characteristics and an electron structure may be changed at an interface between metallic graphene and semi-conductive silicon to increase a Seebeck coefficient thereof and accelerate transfer of charge particles, which may consequently induce an increase in electrical conductivity and charge mobility. In addition, phonon scattering at the interface between the graphene and silicon may be increased, so that it may be possible to control the thermal conductivity of thermoelectric material.

Such a composite according to any of the above-described embodiments may be effectively used as a thermoelectric material.

A thermoelectric device may be manufactured by processing the thermoelectric material into a shape, for example, by cutting. The thermoelectric device may be a p-type thermoelectric device. The thermoelectric device may be a structure formed by shaping the thermoelectric material in a predetermined shape, for example, in rectangular parallelepiped.

The thermoelectric device may have a cooling effect when combined with an electrode and a current is applied thereto, and have a power generation effect due to a temperature difference.

FIG. 3B is a schematic view of a thermoelectric module using the thermoelectric device of FIG. 3E, according to an embodiment of the present disclosure. Referring to FIG. 3B, an upper electrode (first electrode) 212 and a lower electrode 222 are patterned on an upper insulating substrate 211 and a lower insulating substrate 221. The upper electrode 212 and the lower electrode 222 contact a p-type thermoelectric component 215 and an n-type thermoelectric component 316. The upper electrode 212 and the lower electrode 222 are connected to the outside of the thermoelectric device by a lead electrode 224. The p-type thermoelectric component 215 may be the thermoelectric device according to any of the above-described embodiments. The n-type thermoelectric component 316 may not be specifically limited, and may be any material known in the art.

The upper and lower insulating substrates 211 and 221 may include gallium arsenic (GaAs), sapphire, silicon, Firex, or quartz. The upper and lower electrodes 212 and 222 may include copper, aluminum, nickel, gold, or titanium, and may have various sizes. The upper and lower electrodes 212 and 222 may be formed using any suitable patterning method, for example, a lift-off semiconductor process, a deposition method, or a photolithography technique.

In some embodiments, one of the first and second electrodes 312 and 322 in the thermoelectric module may be exposed to a heat source as illustrated in FIGS. 3C and 3D. In some other embodiments, one of the first and second electrodes 312 and 322 in the thermoelectric device module may be electrically connected to a power supply source, or to the outside of the thermoelectric module, for example, an electric device (for example, a battery) that consumes or stores electric power.

In some embodiments, one of the first and second electrodes 312 and 322 in the thermoelectric module may be electrically connected to a power supply source.

One or more embodiments will now be described in further detail with reference to the following examples. However, these examples are only for illustrative purposes and shall not limit the scope of the disclosed embodiments.

EXAMPLES

Preparation Example 1: Preparation of Composite

After fumed $SiO_2$ particles (having an average particle diameter of about 15 nm) were put into a reactor, $CH_4$ was supplied into the reactor at about 300 standard cubic centimeters per minute (sccm) at about 1 atmosphere (atm) for about 30 minutes, and the temperature of the reactor was raised to about 1000° C., followed by thermal treatment at the same temperature for about 2 hours.

Subsequently, the temperature of the reactor was cooled down to room temperature (about 20° C. to about 25° C.) to obtain a composite in which particles of $SiO_x$ wherein $0<x\le2$ was embedded in graphene.

Preparation Example 2: Preparation of Composite

After fumed $SiO_2$ particles (having an average particle diameter of about 15 nm) were put in a reactor, $H_2$ was supplied into the reactor at about 300 sccm at about 1 atm for about 30 minutes, and the temperature of the reactor was raised to about 1000° C.

After the temperature of the reactor was maintained at about 1000° C. for about 1 hour, $CH_4$ was supplied into the reactor at about 300 sccm at about 1 atm for about 30 minutes, followed by thermal treatment at 1000° C. for about 6 hours. Subsequently, nitrogen was supplied into the reactor at about 300 sccm, and the temperature of the reactor was coded down to room temperature (about 20 to about 25° C.) to obtain a composite in which particles of $SiO_x$ wherein $0<x\le2$ was embedded in graphene.

Preparation Example 2a: Preparation of Composite

A composite was prepared in the same manner as in Preparation Example 1, except that $CH_4$ was supplied into the reactor at about 300 sccm at about 1 atm for about 10 minutes.

Preparation Example 3: Preparation of Composite

A composite was prepared in the same manner as in Preparation Example 1, except that $CH_4$ was supplied into the reactor at about 300 sccm at about 1 atm for about 60 minutes.

Preparation Example 4: Preparation of Composite

A composite was prepared in the same manner as in Preparation Example 2, except that $CH_4$ was supplied into the reactor at about 300 sccm at about 1 atm for about 60 minutes.

Preparation Example 5: Preparation of Composite

A composite was prepared in the same manner as in Preparation Example 1, except that $H_2$ was supplied into the reactor at about 300 sccm at about 1 atm for about 4 hours after fumed $SiO_2$ particles (having an average particle diameter of about 15 nm) were put into the reactor, followed by raising the temperature of the reactor to about 1000° C.

Preparation Example 6: Preparation of Composite

A composite was prepared in the same manner as in Preparation Example 1, except that $H_2$ was supplied into the reactor at about 300 scorn at about 1 atm for about 10 minutes after fumed $SiO_2$ particles (having an average particle diameter of about 15 nm) were put into the reactor, followed by raising the temperature of the reactor to about 1000° C.

Comparative Preparation Example 1: Preparation of Structure

A structure was prepared in the same manner as in Preparation Example 3, except that a mixed gas of $CH_4$ and $H_2$, instead of $CH_4$ alone, in a ratio of 100 scorn to 200 sccm, was supplied into the reactor.

Comparative Preparation Example 2: Preparation of Structure

A structure was prepared in the same manner as in Preparation Example 1, except that $H_2$ was supplied into the reactor at about 300 sccm at about 1 atm for about 1 minute after fumed $SiO_2$ particles (having an average particle diameter of about 15 nm) were put into the reactor, followed by raising the temperature of the reactor to about 1000° C.

Comparative Preparation Example 3: Preparation of Structure

A structure was prepared in the same manner as in Preparation Example 1, except that $H_2$ was supplied into the reactor at about 300 sccm at about 1 atm for about 5 minutes after fumed $SiO_2$ particles (having an average particle diameter of about 15 nm), followed by raising the temperature of the reactor to about 1000° C.

Example 1: Preparation of Electrode Material

An electrode material was prepared by mixing a lithium composite oxide ($LiNi_{0.5}Co_{0.2}Mn_{0.3}O_2$) (hereinafter, also referred to as NCM) and the composite of Preparation Example 1 by using a Nobilta mixer at about 300 rpm for about 30 minutes, A mixing ratio of the lithium composite oxide and the composite of Preparation Example 1 was about 99:1 by weight.

Examples 2-4: Preparation of Electrode Material

Electrode materials were prepared in the same manner as in Example 1, except that the composites of Preparation Examples 2-4, instead of the composite of Preparation Example 1, were used, respectively.

Example 5: Preparation of Electrode Material

An electrode material was prepared by mixing an electrode active material (SiNANOde, available from Nanosys, U.S.A) including a graphite core and a silicon oxide nanowire on the graphite core, and the composite of Preparation Example 3 by using a Nobilta mixer at about 300 rpm for about 30 minutes. A mixing ratio of the electrode active material and the composite of Preparation Example 3 was about 99.3:0.7 by weight.

Manufacture Example 1: Manufacture of Electrode and Coin Cell

The electrode material of Example 1 was mixed with Super P carbon (Timcal) as a conducting agent, polyvinylidene difluoride (PVDF) as a binder, and N-methylpyrrolidone as a solvent to prepare a slurry. A mixed ratio of the electrode material of Example 1, Super P, and PVDF was about 90:6:4 by weight. The slurry was coated on an aluminum (Al) substrate (having a thickness of about 15 μm) by a bar coating method, and dried at about 200° C. under a reduced pressure, followed by roll pressing and punching to manufacture an electrode. The electrode was assembled with a lithium metal as a counter electrode, and an electrolyte to manufacture a coin cell.

The electrode had a capacity of about 1.7 mAh/cm$^2$ and a thickness of about 55 mm. The electrolyte solution included 1.3M $LiPF_6$ and EC, DEC, and EMC in a ratio of 3:5:2 by volume.

Manufacture Examples 2-4: Manufacture of Electrode and Coin Cell

Electrodes and coin cells were manufactured in the same manner as in Manufacture Example 1, except that the electrode materials of Examples 24, instead of the electrode material of Example 1, were used, respectively.

Manufacture Example 5: Manufacture of Electrode and Coin Cell

An electrode and a coin cell were manufactured in the same manner as in Manufacture Example 1, except that the mixing ratio of the electrode material, Super P, and PVDF was changed from about 90:6:4 by weight to about 97:1.5:1.5 by weight.

Manufacture Example 6: Manufacture of Electrode and Coin Cell 88 parts by weight of the electrode material of Example 5 was mixed with 12 parts by weight of lithium polyacrylate (LiPAA), and N-methylpyrrolidone as a solvent to prepare a slurry.

The slurry was coated on an aluminum (Al) substrate (having a thickness of about 15 μm) by a bar coating method, and dried at about 200° C. under a reduced pressure, followed by roll pressing and punching to manufacture an electrode. The electrode was assembled with a lithium metal as a counter electrode, and an electrolyte) to manufacture a coin cell.

The cathode had a capacity of about 1.7 mAh/cm² and a thickness of about 55 mm. The electrolyte solution included 1.3M $LiPF_6$ and EC, DEC, and EMC in a ratio of 3:5:2 by volume.

Comparative Manufacture Example 1: Manufacture of Electrode and Coin Cell

An electrode and a coin cell were manufactured in the same manner as in Manufacture Example 1, except that the structure of Comparative Preparation Example 1, instead of the electrode material of Example 1, was used.

Comparative Manufacture Example 2: Manufacture of Electrode and Coin Cell

An electrode and a coin cell were manufactured in the same manner as in Manufacture Example 1, except that NCM, instead of the electrode material of Example 1, was used.

Comparative Manufacture Example 3: Manufacture of Electrode and Coin Cell

An electrode and a coin cell were manufactured in the same manner as in Comparative Manufacture Example 2, except that the mixing ratio of NCM, Super P, and PVDF was changed from about 90:6:4 by weight to about 97:1.5:1.5 by weight.

Comparative Manufacture Example 4: Manufacture of Electrode and Coin Cell

An electrode and a coin cell were manufactured in the same manner as in Manufacture Example 1, except that an electrode active material (SiNANOde, available from Nanosys, U.S.A) including a graphite core and a silicon oxide nanowire on the graphite core, was used, instead of the electrode material of Example 5.

Comparative Manufacture Example 5: Manufacture of Electrode and Coin Cell

An electrode and a coin cell were manufactured in the same manner as in Manufacture Example 1, except that an electrode material prepared by the following process, instead of the electrode material of Example 5.

The electrode material was prepared by blending an electrode active material (SiNANOde, available from Nanosys, USA) including a graphite core and a silicon oxide nanowire on the graphite core, and the composite of Preparation Example 3. A mixing ratio of the electrode active material and the composite of Preparation Example 3 was about 99.3:0.7 by weight.

Here, the mixing ratio of the electrode active material and the composite was about 99:1.

Evaluation Example 1: Specific Surface Area and Conductivity Characteristics 1) Preparation Examples 1-4 and Comparative Preparation Example 1

Specific surface areas and conductivities of the composites of Preparation Examples 1 to 4 and the structure of Comparative Preparation Example 1 were evaluated. The results are shown in Table 1. The conductivity of each sample was evaluated by measuring a resistance while scanning at a bias voltage of about 10 millivolts (mV) in a frequency range of 1 hertz (Hz) to 1 MHz.

TABLE 1

| Example | Specific surface area ($m^2/g$) | Conductivity (S/cm) |
|---|---|---|
| Preparation Example 1 | 108.3 | 22.6 |
| Preparation Example 2 | 104.0 | 30.1 |
| Preparation Example 3 | 81.9 | 48.4 |
| Preparation Example 4 | 83.8 | 52.1 |
| Comparative Preparation Example 1 | 147.1 | 5.8 |

Referring to Table 1, the composites of Preparation Examples 1 to 4 were found to have smaller specific surface areas and markedly increased conductivities, compared to the structure of Comparative Preparation Example 1.

2) Example 4

A specific surface area and conductivity of the electrode material of Example 4 were evaluated in the same manner as for the composites of Preparation Examples 1 to 4 and the structure of Comparative Preparation Example 1 as described above. The results are shown in Table 2. For comparison, a specific surface area and a conductivity of NCM are also represented in Table 2.

TABLE 2

| Example | Specific surface area ($m^2/g$) | Conductivity (S/cm) |
|---|---|---|
| Example 4 | 14.4 | $3.54 \times 10^{-2}$ |
| NCM | 7.4 | $4.17 \times 10^{-3}$ |

Referring to Table 2, the electrode material of Example 4 was found to have an improved conductivity, compared to NCM.

3) Example 5

A conductivity of the electrode material of Example 5 was evaluated in the same manner as for the composites of Preparation Examples 1 to 4 and the structure of Comparative Preparation Example 1 as described above. The results are shown in Table 3. For comparison, a conductivity of the anode active material (hereinafter, referred to as electrode active material A") used as a starting material to prepare the electrode material of Example 5, the electrode active material A including a graphite core and a silicon oxide nanowire on the graphite core, is also represented.

TABLE 3

| Example | conductivity (S/cm) |
|---|---|
| Example 5 | 44.5 |
| Electrode active material A | 6.37 |

Referring to Table 3, the electrode material of Example 5 was found to have an improved conductivity, compared to the electrode active material A.

Evaluation Example 2: Scanning Electron Microscopy (SEM) and High-Resolution Transmission Electron Microscopy (HR-TEM)

1) Preparation Examples 3 and 5

Silicon oxide ($SiO_2$) and the composites of Preparation Examples 3 and 5 were analyzed by scanning electron microscopy (SEM) and high-resolution transmission electron microscopy (HR-TEM).

The SEM analysis was performed using an ultrahigh-resolution scanning electron microscope (UHR-FE-SEM, Hitachi S-5500, Resolution: 0.4 nm) (at 30 kV), and the TEM analysis was performed using a Tecnai Titan (available from FEI). The results are shown in FIGS. 4A to 4H.

Figure 4A:
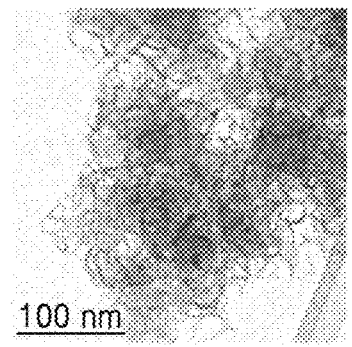
FIGS. 4A and 4B are high resolution-transmission electron (HR-TEM) images of a composite of Preparation Example 3.
Figure 4B:
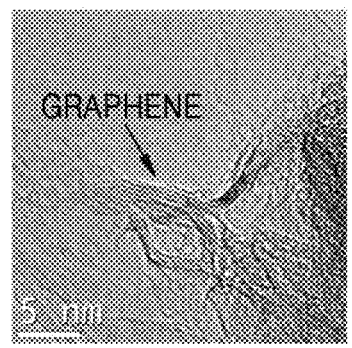
Figure 4C:
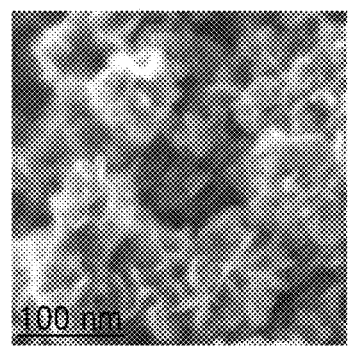
FIGS. 4C and 4D are scanning electron microscopic (SEM) images of the composite of Preparation Example 3.
Figure 4D:
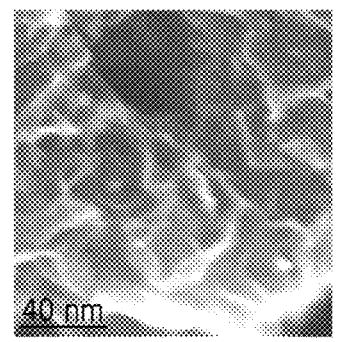

FIGS. 4A and 4B are HR-TEM images of the composite of Preparation Example 3. FIGS. 4C and 4D are SEM images of the composite of Preparation Example 3.

Figure 4E:
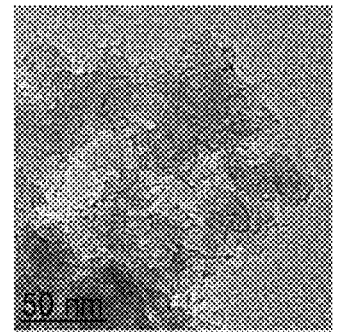
FIGS. 4E and 4F are HR-TEM and SEM images of the composite of Preparation Example 5, respectively.
Figure 4F:
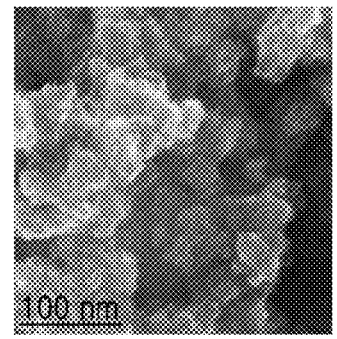
Figure 4G:
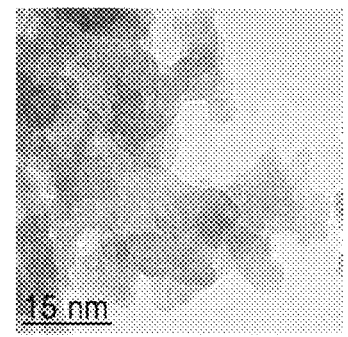
FIGS. 4G and 4H are HR-TEM and SEM images of silicon oxide (($SiO_2$)), respectively.
Figure 4H:
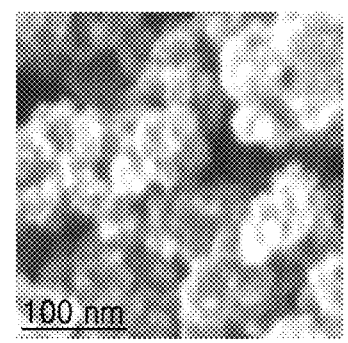

FIGS. 4E and 4F are HR-TEM and SEM images of the composite of Preparation Example 5, respectively. FIGS. 4G and 4H are HR-TEM and SEM images of silicon oxide ($SiO_2$), respectively.

Referring to FIGS. 4A to 4F, the composites of Preparation Example 3 (Time taken to raise temperature to a heat treatment temperature of 1000° C., hereinafter, also referred to as "reaction time"): about 60 min, and Preparation Example 5 (reaction time: about 4 hours) were found to include $SiO_x$ wherein 0<x≤2 embedded in graphene. The $SiO_x$ wherein 0<x≤2 had an average particle diameter of about 15 nm, and was uniformly distributed in graphene. The composites of Preparation Examples 3 and 4 had a particle diameter of about 100 nm to about 200 nm. The $SiO_x$ wherein 0<x≤2 was uniformly dispersed in the graphene.

2) Example 1

The electrode material of Example 1 was analyzed by SEM and HR-TEM in the same manner as for the composites of Preparation Examples 3 and 5 as described above. The results are shown in FIGS. 5A to 5F. For comparison, the results of SEM and HR-TEM on NCM are also represented in FIGS. 5G and 5H, respectively.

Figure 5A:
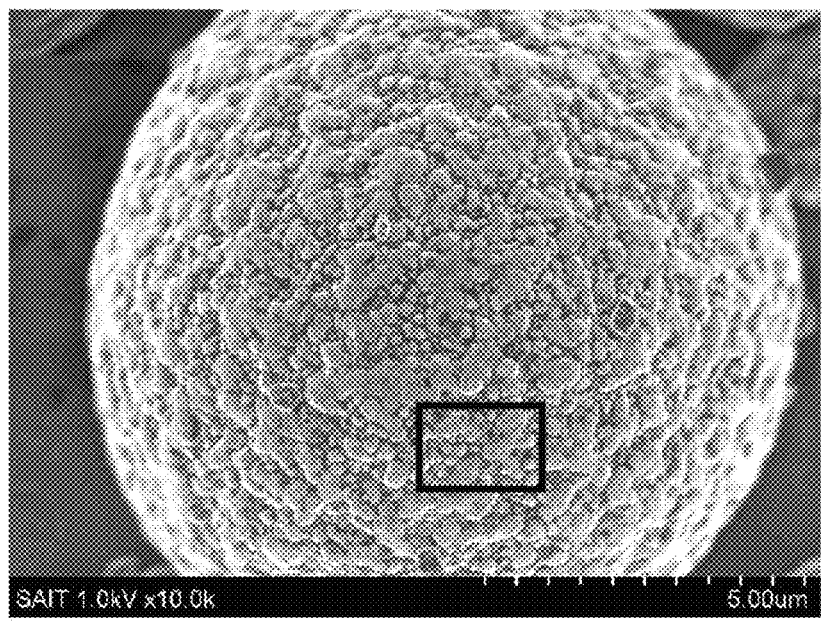
FIGS. 5A to 5F are SEM and HR-TEM images of an electrode material of Example 1.
Figure 5B:
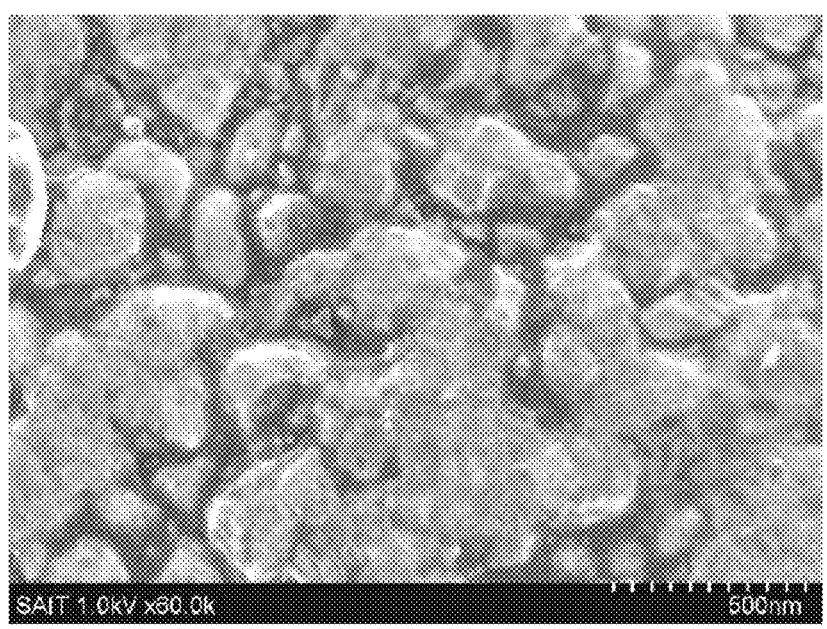
Figure 5C:
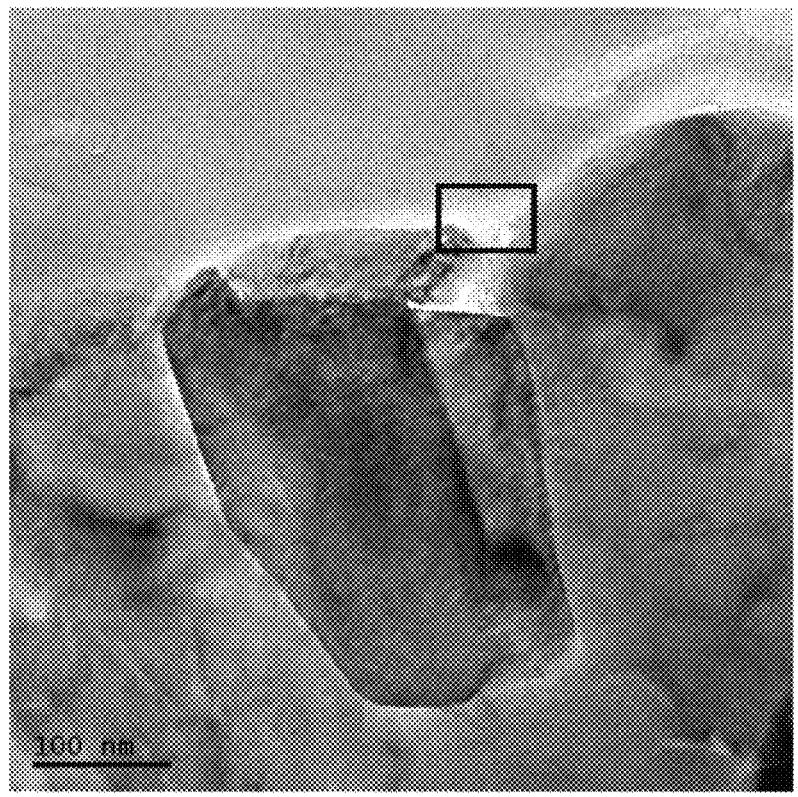
Figure 5D:
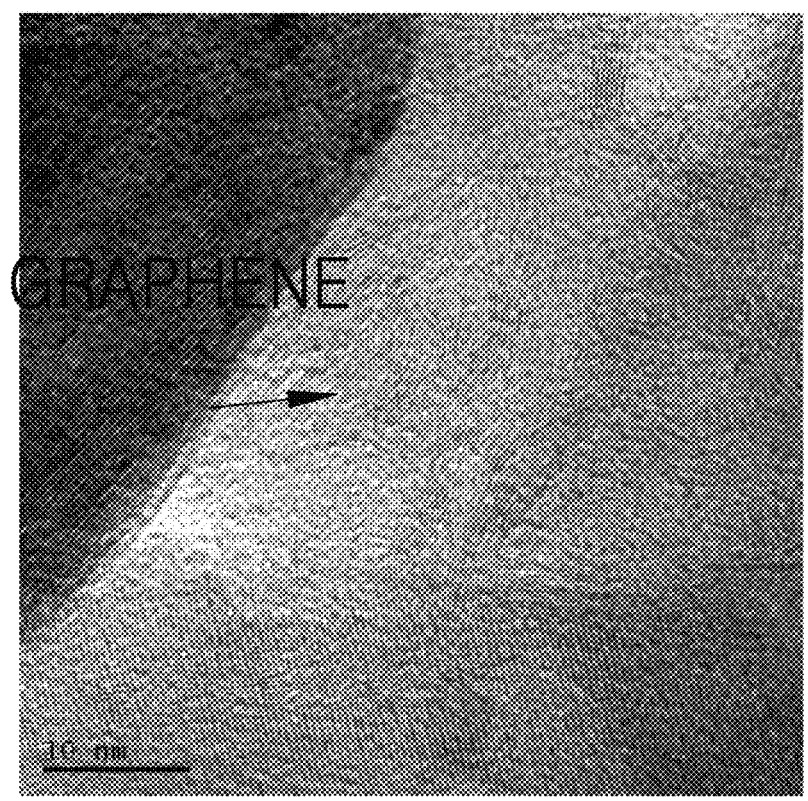
Figure 5E:
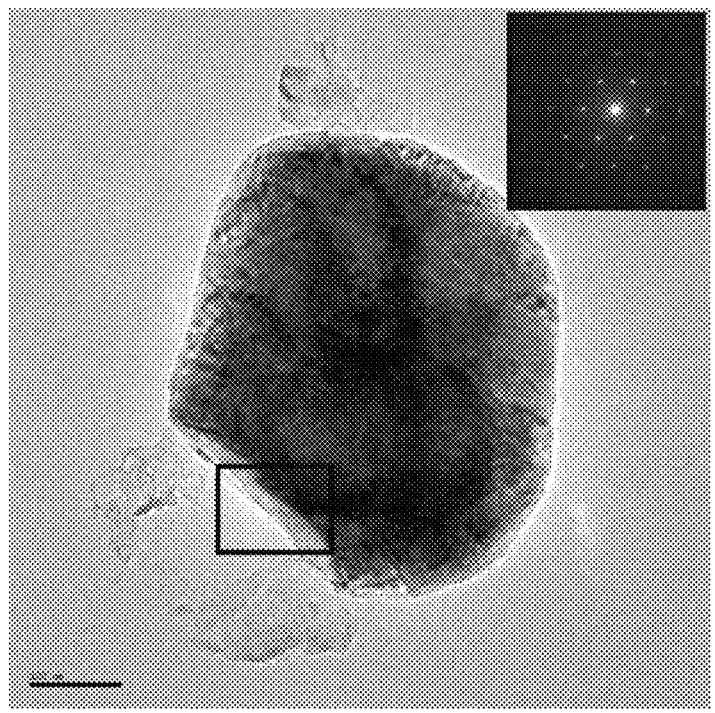
Figure 5F:
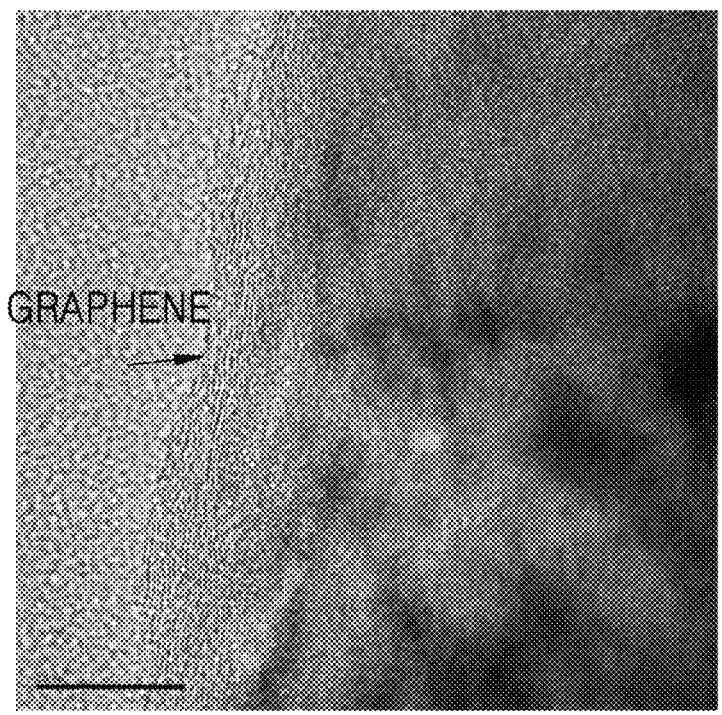
Figure 5G:
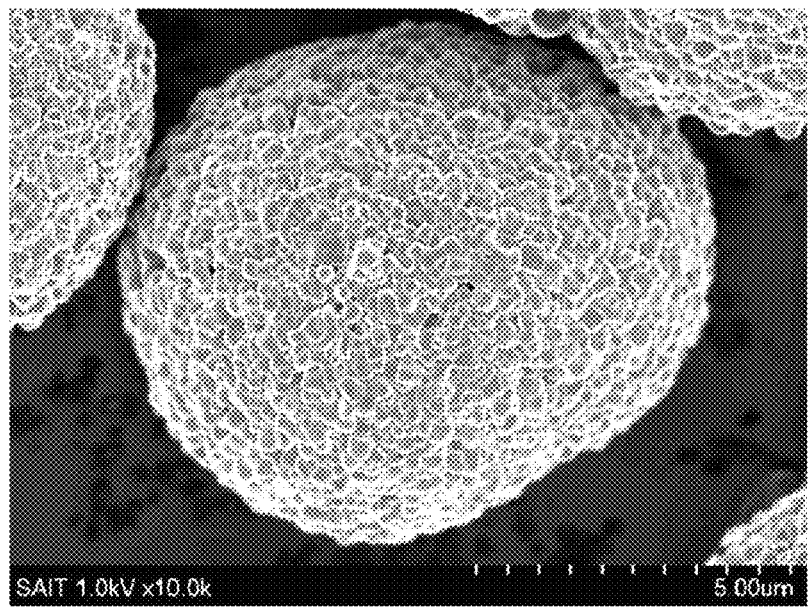
FIGS. 5G and 5H are SEM and HR-TEM images, respectively, of a lithium composite oxide of the formula $LiNi_{0.5}Co_{0.2}Mn_{0.3}O_2$ (NCM) for comparison with the electrode material of Example 1.
Figure 5H:
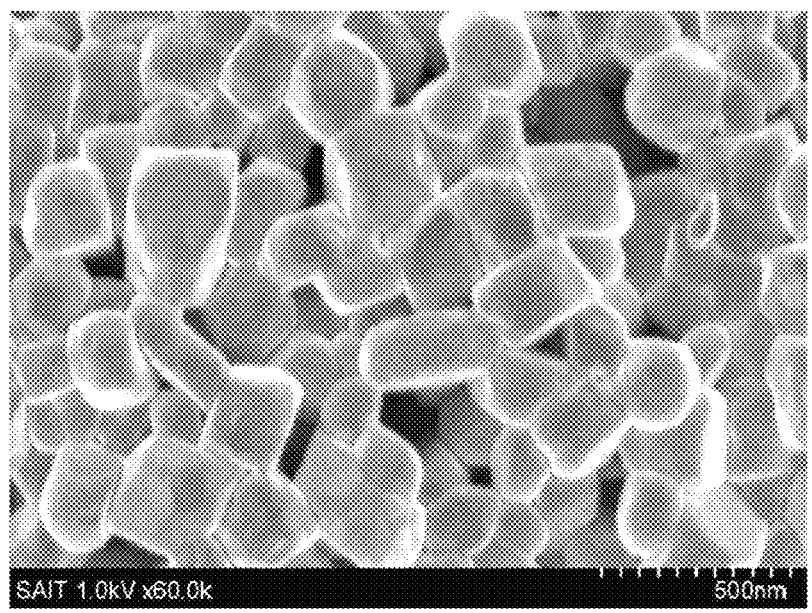

FIGS. 5B and 5H are magnified views of the SEM images of FIGS. 5A and 5G, respectively.

FIGS. 5C to 5F are HR-TEM images of the electrode material of Example 1. FIGS. 5D and 5F are magnified views of the HR-TEM images of FIGS. 5C and 5E, respectively.

Referring to FIGS. 5A to 5H, surface pores of NCM appear filled with graphene composite, and the surface of NCM was coated with graphene. Due to this structure, the graphene in the electrode material of Example 1 may suppress a side reaction in the cathode and prevent a reduction in conductivity.

3) Example 6

The electrode material of Example 6 was analyzed by HR-HEM in the same manner as for the composites of Preparation Examples 3 and 4.

Figure 5I:
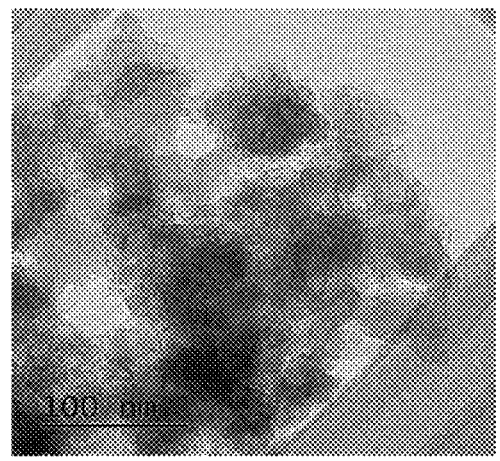
FIGS. 5I to 5K are HR-TEM images of an electrode material of Example 6.
Figure 5J:
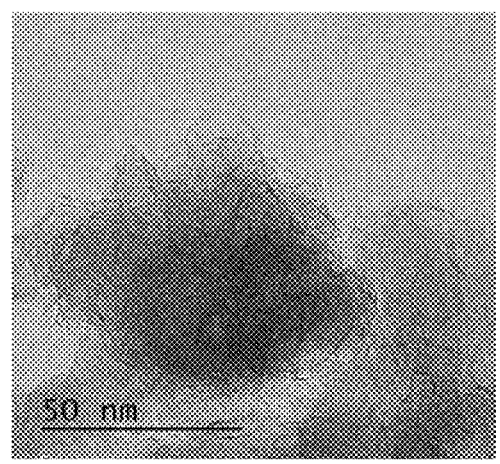
Figure 5K:
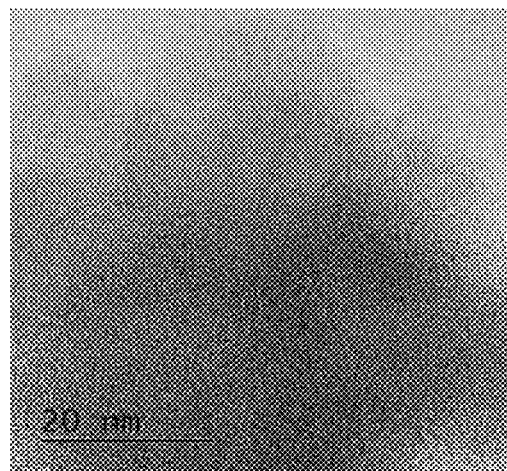

The results are shown in FIGS. 5I to 5K. For comparison, silicon oxide used as a starting material to prepare the electrode material of Example 6 was analyzed by HR-TEM. The results are shown in FIGS. 5L and 5M.

Figure 5L:
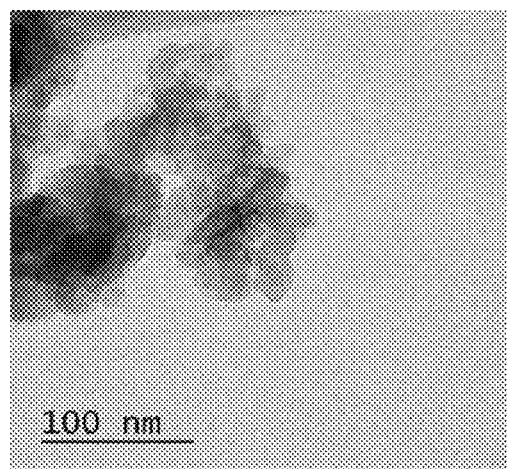
FIGS. 5L and 5M are HR-TEM images of silicon oxide used as a starting material to prepare the electrode material of Example 6.
Figure 5M:
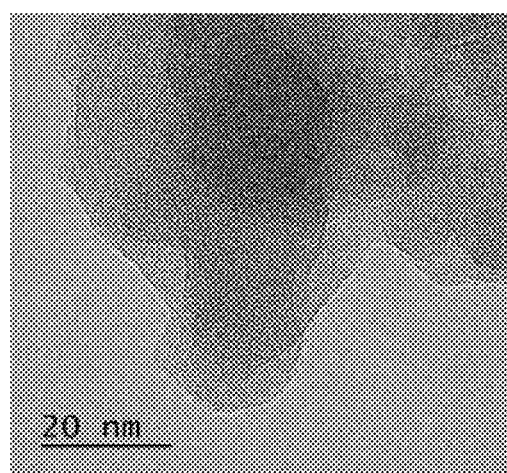

Referring to FIGS. 5L to 5M, the electrode material of Example 6 was found to include a graphene layer formed on silicon oxide particles.

Evaluation Example 3: Charge-Discharge Characteristics (1) Evaluation of Initial Efficiency, Rate Capability, Coulomb Efficiency, and Discharge Capacity 1) Manufacture Example 1 and Comparative Manufacture Example 2

Charge and discharge characteristics of the coin cells of Manufacture Example 1 and Comparative Manufacture Example 2 were evaluated.

Each of the coin cells of Manufacture Example 1 and Comparative Manufacture Example 2 was subjected to one cycle of charging and discharging at a 1 C rate (formation process), followed by one cycle of charging and discharging at 0.2 C and then initial charge-discharge characteristic measurement. After further 50 cycles of charging and discharging at 1 C rate, cycle characteristics of the coin cell were evaluated. In particular, the charging was set to begin with a constant current (CC) mode and shift to a constant voltage (CV) mode to terminate at a cut-off of 0.01 C, and the discharging was set to terminate at a constant current mode in a voltage range of Table 4.

The cycle characteristics were repeatedly measured up to about the $100^{th}$ cycle at which the specific capacity is reduced to about 92% of a $1^{st}$ cycle specific capacity, while controlling a current to be about 50 mA per 1 g of the electrode.

Figure 6A:
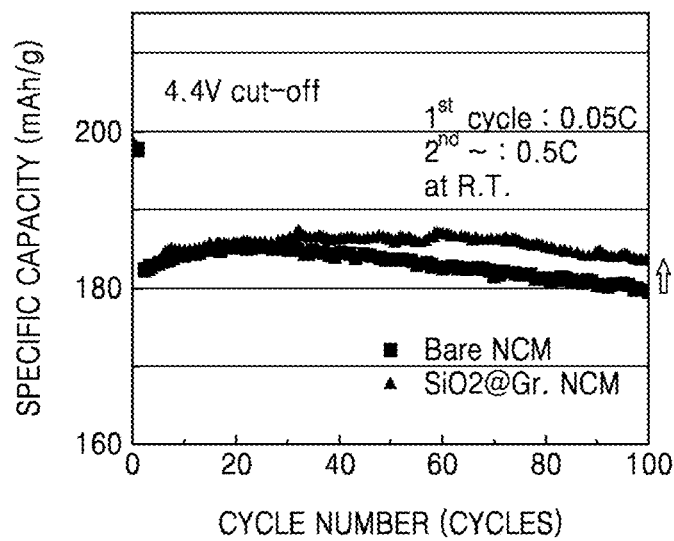
FIGS. 6A and 6B are graphs of specific capacity (milliampere hours per gram, mAh/g) at a cut-off voltage of 4.4 (volts, V) and 4.5 V, respectively, with respect to cycle number (cycles) for the coin cells of Manufacture Example 1 and Comparative Manufacture Example 2, obtained as a result of charge-discharge characteristics evaluation.
Figure 6B:
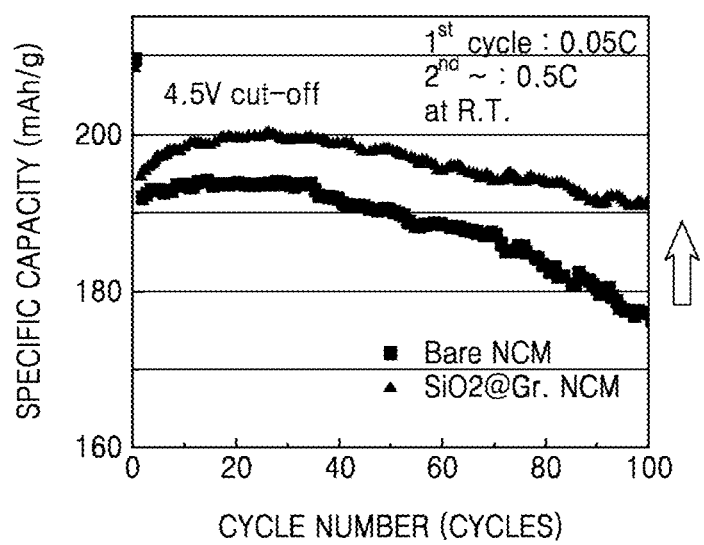

Discharge rate characteristics of the coin cells were evaluated after charging and discharging at 0.05 C/0.5 C. The results are shown in Table 4. A change in discharge capacity of the coin cells of Manufacture Example 1 and Comparative Manufacture Example 2 with respect to the number of cycles was measured. The results are shown in FIGS. 6A and 6B and Table 5. In FIGS. 6A and 6B, "bare NCM" denotes the coin cell of Comparative Manufacture Example 2, and "$SiO_2$@Gr.NCM" denotes the coin cell of Manufacture Example 1.

TABLE 4

| Example | Cut-off voltage (V) | 1st cycle | | | Coulombic efficiency (%) | Lifetime (% @100th) |
|---|---|---|---|---|---|---|
| | | 0.05C-Discharge capacity (mAh/g) | Initial efficiency (%) | Rate capability (%) 0.5C/0.05C | | |
| Manufacture Example 1 | 4.4 | 198.3 | 93.71 | 92.72 | 99.96 | 99.98 |
| Comparative Manufacture Example 2 | 4.4 | 198.5 | 92.49 | 92.72 | 99.75 | 98.16 |
| Manufacture Example 1 | 4.5 | 208.5 | 92.89 | 93.55 | 99.90 | 97.32 |
| Comparative Manufacture Example 2 | 4.5 | 209.3 | 91.95 | 91.64 | 99.63 | 91.83 |

Referring to Table 4, the coin cell of Manufacture Example 1 was found to have improved initial efficiency and improved lifetime characteristics, compared to the coin cells of Comparative Manufacture Example 2.

2) Manufacture Example 5 and Comparative Manufacture Example 3

Charge and discharge characteristics of the coin cells of Manufacture Example 5 and Comparative Manufacture Example 3 were evaluated in the same manner as for the coin cells of Manufacture Example 1 and Comparative Manufacture Example 2 as described above. The results are shown in FIGS. 6C and 6D.

Figure 6C:
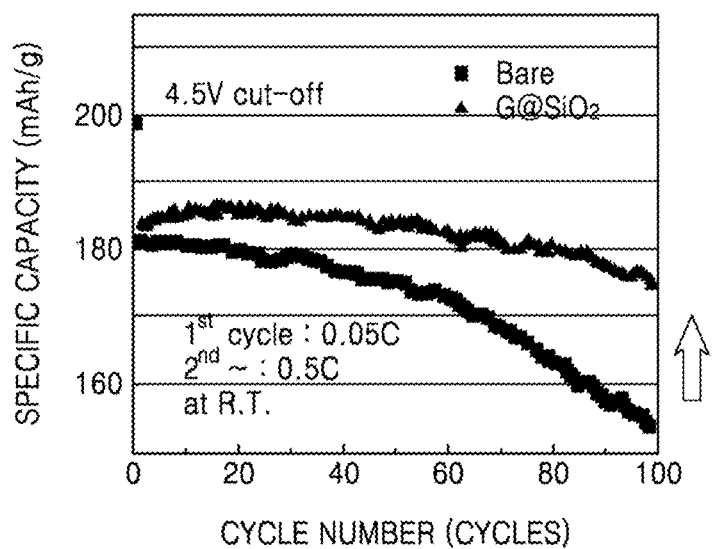
FIGS. 6C and 6D are graphs of specific capacity (mAh/g) at a cut-off voltage of 4.4V and 4.5V respectively, with respect to the number of cycles in coin cells of Manufacture Example 5 and Comparative Manufacture Example 3, obtained as a result of charge-discharge characteristics evaluation.
Figure 6D:
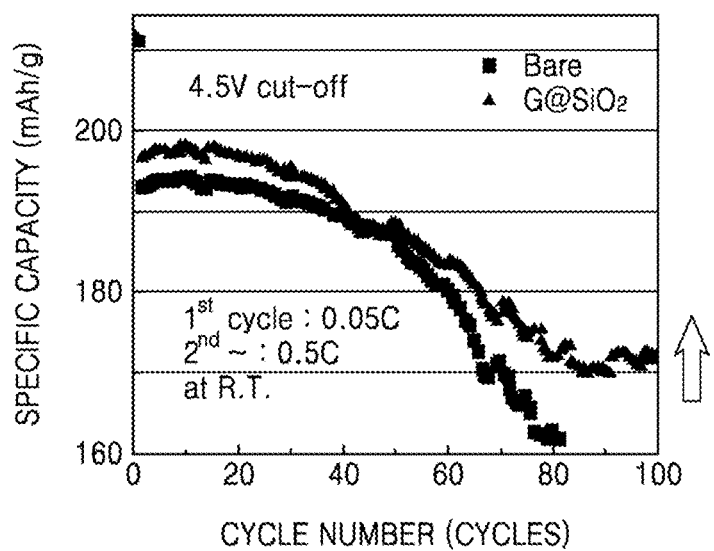

In FIGS. 6C and 6D, "Bare" denotes the coin cell of Comparative Manufacture Example 3, and "G@SiO$_2$" denotes the coin cell of Manufacture Example 5.

The initial efficiency, rate capability, and lifetime characteristics of each of the coin cells were calculated using Equations 1, 2, and 3, respectively.

Initial efficiency={(1$^{st}$ cycle discharge capacity)/(1$^{st}$ cycle charge capacity)}×100   Equation 1

Rate capability={(0.5 C discharge capacity)/(0.65 C discharge capacity)}×100   Equation 2

Lifetime={(100$^{th}$ cycle discharge capacity)/(1$^{st}$ cycle discharge capacity)}×100   Equation 3

Referring to Table 5 and FIGS. 6C and 6D, the Coin Cell of Manufacture

Example 5 was found to have an improved initial efficiency and improved resistance against high voltage, compared to the coin cell of Comparative Manufacture Example 3, This is attributed to the suppression of side reaction due to the use of the electrode material including the composite of Example 1 coated on the surface of NCM.

3) Manufacture Example 6, Comparative Manufacture Example 4

Charge and discharge characteristics of the coin cells of Manufacture Example 6 and Comparative Manufacture Example 4 were evaluated in the same manner as described above.

Figure 6E:
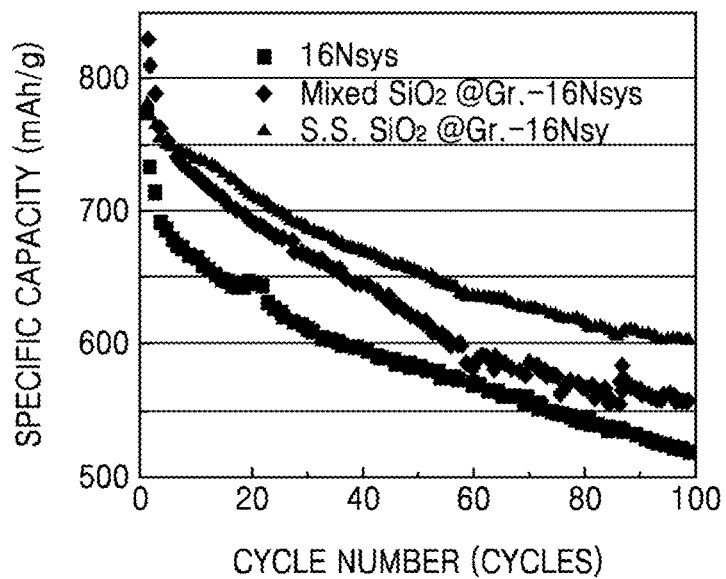
FIG. 6E is a graph of specific capacity (mAh/g) with respect to cycle number (cycles) for the coin cells of Manufacture Example 6 and Comparative Manufacture Examples 4 and 5, obtained as a result of charge-discharge characteristics evaluation.

The results are shown in FIG. 6E and Table 6. In FIG. 6E, "16Nsys" denotes the coin cell of Comparative Manufacture Example 4, and "S.S.SiO$_2$@Gr.-16Nsys" denotes the coin cell of Manufacture Example 6.

TABLE 5

| Example | Cut-off voltage (V) | 1st cycle | | | Coulombic efficiency (%) | Lifetime (% @100th) |
|---|---|---|---|---|---|---|
| | | 0.05 C-Discharge capacity (mAh/g) | Initial efficiency (%) | Rate capability (%) 0.5C/0.05C | | |
| Manufacture Example 5 | 4.4 | 198.8 | 94.11 | 92.34 | 99.92 | 95.41 |
| Comparative Manufacture Example 3 | 4.4 | 199.3 | 93.07 | 90.93 | 99.8 | 84.42 |
| Manufacture Example 5 | 4.5 | 212.3 | 93.13 | 93.00 | 99.75 | 86.73 |
| Comparative Manufacture Example 3 | 4.5 | 211.1 | 92.31 | 91.64 | 99.70 | 77.82 |

TABLE 6

| Example | 1st cycle | | | |
|---|---|---|---|---|
| | 0.1C-Discharge capacity (mAh/g) | Initial efficiency (%) | Rate capability (%) 0.5C/0.05C | Lifetime (% @ 100th) |
| Manufacture Example 6 | 781.5 | 87.82 | 96.16 | 80.07 |
| Comparative Manufacture Example 4 | 772.9 | 87.4 | 89.24 | 74.04 |

Referring to Table 6, the coin cell of Manufacture Example 6 was found to have improved charge and discharge characteristics and improved lifetime characteristics, compared to the coin cell of Comparative Manufacture Example 4.

(2) Rate Capability

1) Manufacture Example 1 and Comparative Manufacture Example 2

Rate capabilities of the coin cells of Manufacture Example 1 and Comparative Manufacture Example 2 were evaluated at different rates as follows.

A charge and discharge test was performed on coin cell of Manufacture Example 1) at a low rate of 0.05 C/0.05 C to evaluate a capacity, and at a rate of 0.5 C/0.05 C to evaluate rate characteristics according to the following equation. For comparison, the charge and discharge test was performed on the coin cells of Comparative Manufacture Example 2 under the same conditions.

Rate capability={(0.5 C Discharge capacity)/(0.05 C Discharge capacity)}×100

Figure 6F:
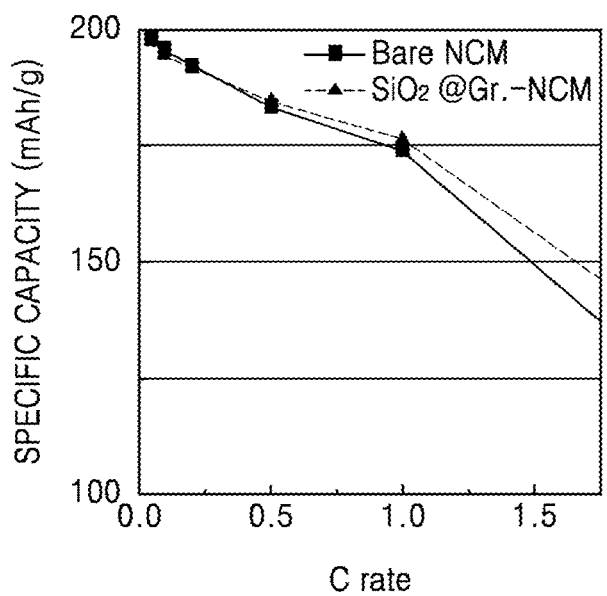
FIG. 6F is a graph of specific capacity (mAh/g) with respect to C rate for the coin cells of Manufacture Example 1 and Comparative Manufacture Example 2, obtained as a result of rate characteristics evaluation.

The results of the rate characteristics evaluation are shown in Table 7 and FIG. 6F. In FIG. 6F, "Bare NCM" denotes the coin cell of Comparative Manufacture Example 2, and "$SiO_2$@Gr.-NCM" denotes the coin cell of Manufacture Example 1.

TABLE 7

| | Comparative Manufacture Example 2 | | Manufacture Example 1 | | Degree of improvement (Δ) | |
|---|---|---|---|---|---|---|
| Discharge rate (C rate) | Capacity (mAh/g) | Charge and discharge efficiency (%) | Capacity (mAh/g) | Charge and discharge efficiency (%) | Capacity (mAh/g) | Charge and discharge efficiency (%) |
| 0.05 | 198.3 | 92.43 | 197.1 | 93.16 | −1.28 | 0.73 |
| 0.1 | 194.5 | 97.62 | 194.9 | 97.67 | 0.4 | 0.05 |
| 0.2 | 189.8 | 97.19 | 192.2 | 98.10 | 2.4 | 0.91 |
| 0.5 | 182.0 | 95.57 | 184.8 | 96.07 | 2.8 | 0.5 |
| 1 | 175.1 | 95.99 | 177.4 | 96.09 | 2.3 | 0.1 |

Referring to Table 7 and FIG. 6F, the coin cell of Manufacture Example 1 was found to have improved rate characteristics, compared to the coin cell of Comparative Manufacture Example 2.

2) Manufacture Example 5 and Comparative Manufacture Example 3

Rate capabilities of the coin cells of Manufacture Example 5 and Comparative Manufacture Example 3 were evaluated in the same manner as for the coin cells of Manufacture Example 1 and Comparative Manufacture Example 2 as described above.

Figure 6G:
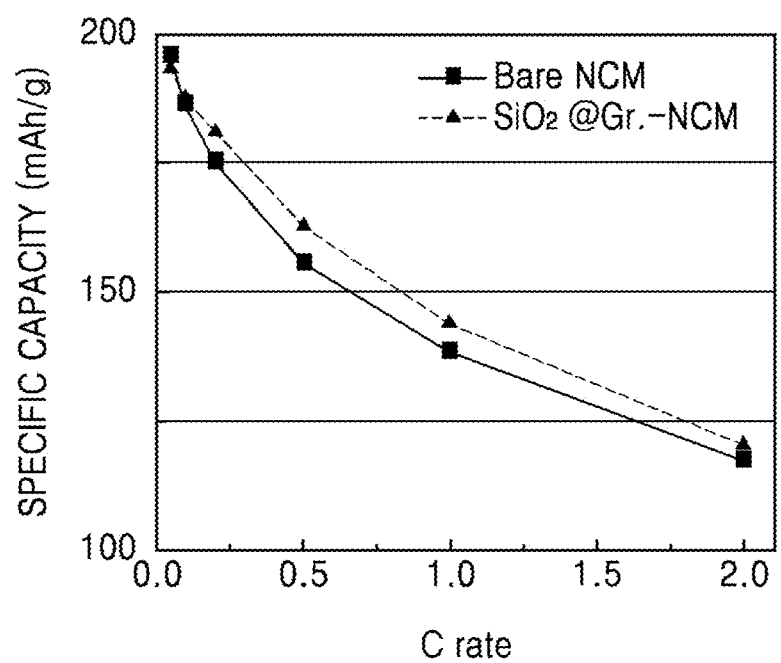
FIG. 6G is a graph of specific capacity (mAh/g) with respect to C rate in the coin cells of Manufacture Example 5 and Comparative Manufacture Example 3, obtained as a result of rate characteristics and capacity evaluation.

The results of the rate characteristics evaluation were shown in Table 8 and FIG. 6G. In FIG. 6G, "Bare NCM" denotes the coin cell of Comparative Manufacture Example 3, and "$SiO_2$@Gr.-NCM" denotes the coin cell of Manufacture Example 5.

TABLE 8

| | Comparative Manufacture Example 3 | | Manufacture Example 5 | | Degree of improvement (Δ) | |
|---|---|---|---|---|---|---|
| Discharge rate (C rate) | Capacity (mAh/g) | Charge and discharge efficiency (%) | Capacity (mAh/g) | Charge and discharge efficiency (%) | Capacity (mAh/g) | Charge and discharge efficiency (%) |
| 0.05 | 198.6 | 92.8 | 196.8 | 93.9 | −1.8 | 1.1 |
| 0.1 | 195.1 | 97.5 | 193.9 | 97.6 | −1.2 | 0.1 |

TABLE 8-continued

| | Comparative Manufacture Example 3 | | Manufacture Example 5 | | Degree of improvement (Δ) | |
|---|---|---|---|---|---|---|
| Discharge rate (C rate) | Capacity (mAh/g) | Charge and discharge efficiency (%) | Capacity (mAh/g) | Charge and discharge efficiency (%) | Capacity (mAh/g) | Charge and discharge efficiency (%) |
| 0.2 | 191.2 | 97.6 | 191.2 | 98.2 | 0 | 0.6 |
| 0.5 | 183.1 | 95.6 | 183.9 | 96.2 | 1 | 0.6 |
| 1 | 173.3 | 94.5 | 175.9 | 95.9 | 2.7 | 1.4 |
| 2 | 125.1 | 72.2 | 135.6 | 77.3 | 10.5 | 5.1 |

Referring to Table 8 and FIG. 6G, the coin cell of Manufacture Example 5 was found to have improved rate characteristics, compared to the coin cell of Comparative Manufacture Example 3.

3) Manufacture Example 6, and Comparative Manufacture Examples 4 and 5

Rate capabilities of the coin cells of Manufacture Example 6 and Comparative Manufacture Examples 4 and 5 were evaluated in the same manner as for the coin cells of Manufacture Example 1 and Comparative Manufacture Example 2 as described above.

The results are shown in Table 9. A cut-off voltage was in a range of about 4.4 V.

TABLE 9

| Example | Rate capability (%) |
|---|---|
| Manufacture Example 6 | 96.16 |
| Comparative Manufacture Example 4 | 91.71 |
| Comparative Manufacture Example 5 | 89.24 |

Referring to Table 9, the coin cells of Manufacture Example 6 was found to have improved rate characteristics, compared to the coin cell of Comparative Manufacture Examples 4 and 5.

Evaluation Example 3; X-ray Photoelectron Spectroscopy (XPS)

1) Preparation Example 4 and Example 4

Figure 7A:
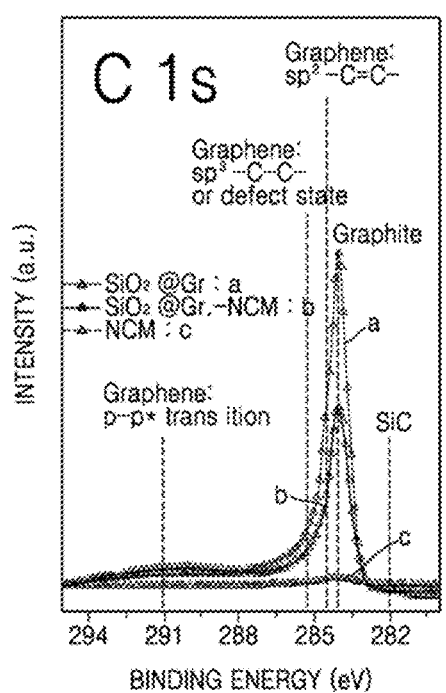
FIG. 7A is a graph of intensity (arbitrary units, a.u.) versus binding energy (electron volts, eV) illustrating the results of X-ray photoelectron spectroscopy (XPS) analysis on a composite of Preparation Example 4 and an electrode material of Example 4.

The composite of Preparation Example 4 and the electrode material of Example 4 were analyzed by X-ray photoelectron spectroscopy (XPS) using a Quantum 2000 (available from Physical Electronics). The results of the XPS analysis are shown in FIG. 7A. For comparison, the results of XPS on lithium composite oxide (LiNi$_{0.5}$Co$_{0.2}$Mn$_{0.3}$O$_2$) (NCM) are also represented. In FIG. 7A, "SiO$_2$@Gr" denotes the composite of Preparation Example 4, and "SiO$_2$@Gr-NCM" denotes the electrode material of Example 4.

The results of compositional XPS analysis on the composite of Preparation Example 4 and the electrode material of Example 4 are shown in Table 10.

TABLE 10

| Example | Amount of carbon corresponding to C 1s peak (Atomic %) | Amount of oxygen corresponding to O 1s peak (Atomic %) | Amount of silicon corresponding to Si 2p peak (Atomic %) |
|---|---|---|---|
| Preparation Example 4 | 98.66 | 1.08 | 0.25 |
| Example 4 | 52.97 | 43.86 | 3.16 |
| NCM | 29.39 | 69.16 | 0 |

Referring to FIG. 7A and Table 10, the composite of Preparation Example 4 and the electrode material of Example 4 were found to have features of grapheme, which was clear from the spectrum of C 1s.

2) Preparation Examples 1, 3 and 5, and Comparative Preparation Examples 2 and 3

The composites of Preparation Examples 1, 3 and 5 and the structures of Comparative Preparation Examples 2 and 3 were analyzed by XPS using a Quantum 2000 (available from Physical Electronics) with a beam size of about 100 μm. The results are shown in FIGS. 7B to 7E.

Figure 7B:
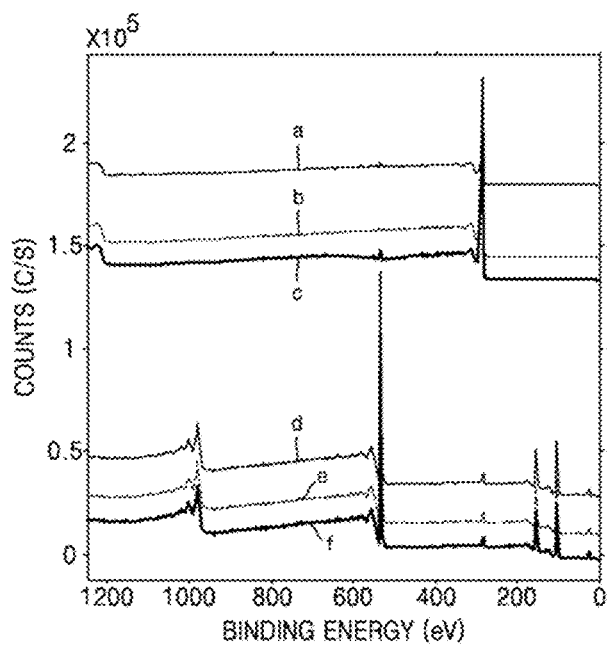
Figure 7C:
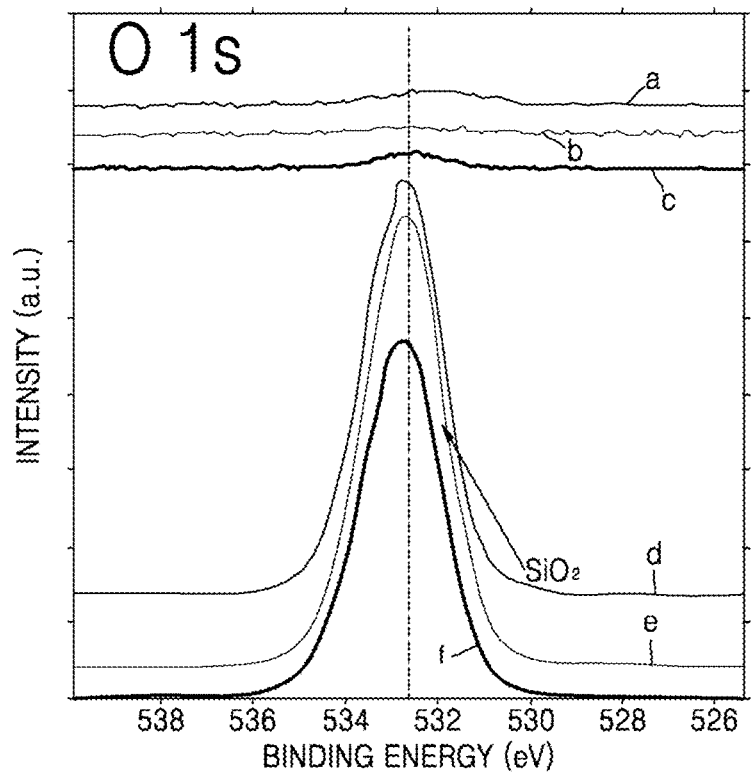
Figure 7D:
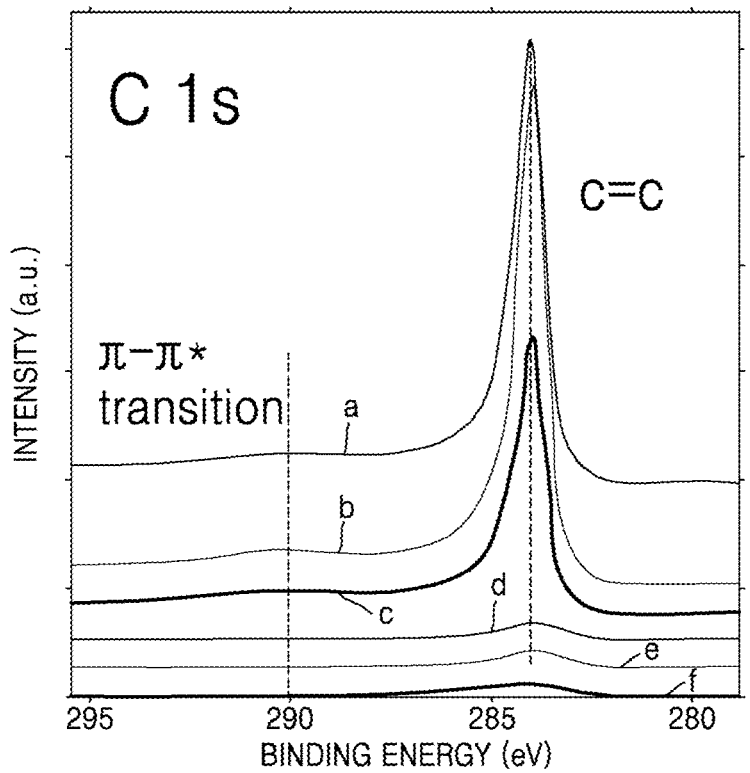
Figure 7E:
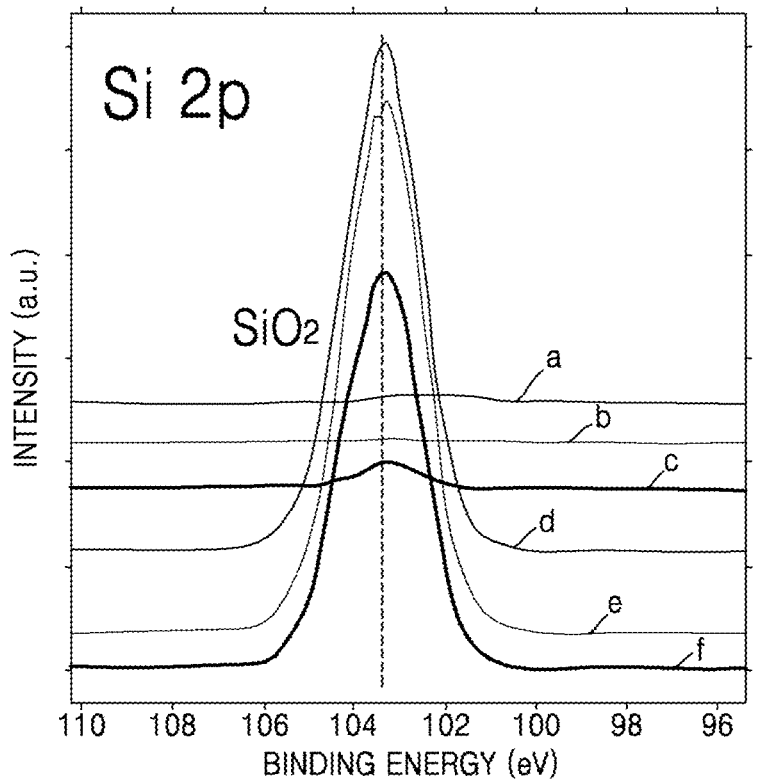

In FIG. 7B, a, b, c, d, and e indicate the times taken to raise temperature to a heat treatment temperature of about 1000° C., i.e., about 4 hours (Preparation Example 5), 60 minutes (Preparation Example 3), 30 minutes (Preparation Example 1), 5 minutes (Comparative Preparation Example 3), and 1 minute (Comparative Preparation Example 2), respectively, and f denotes the sample (fumed SiO$_2$ particles) before the thermal treatment. FIGS. 7C to 7E illustrate XPS spectra of C 1s, O 1s, and Si 2p, respectively, of the composites of Preparation Examples 1, 3 and 4 and the structures of Comparative Preparation Examples 2 and 3. The C 1s peak (a binding energy of about 284.48 eV) was used as peak reference.

Figure 7F:
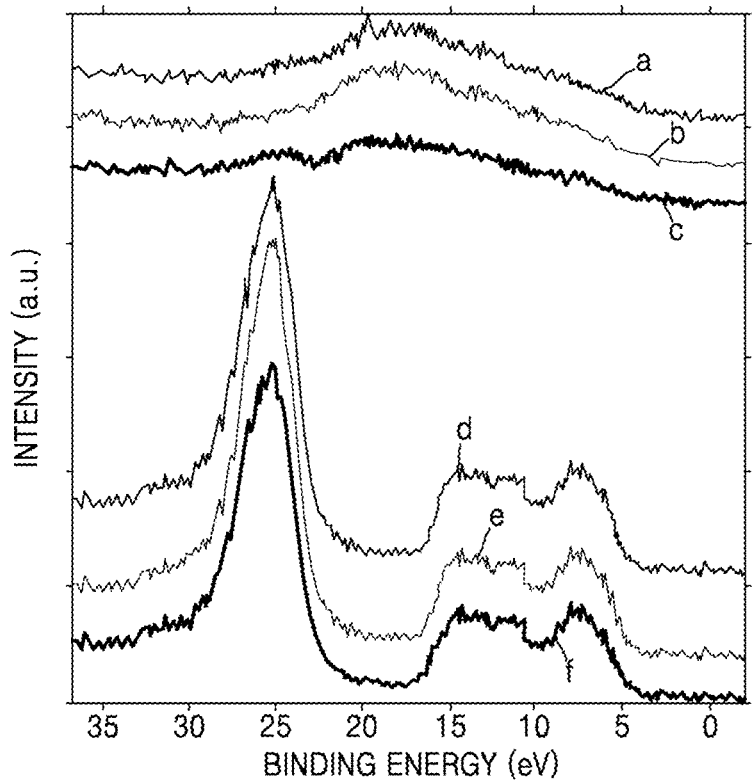
FIG. 7F is a graph of intensity (a.u.) versus binding energy (eV) which illustrates XPS valence band spectra of the composites of Preparation Examples 1, 3 and 5, the structures of Comparative Preparation Examples 2 and 3.

Referring to FIGS. 7B to 7E, in the composites of Preparation Examples 1, 4, and 5 in which it took 30 minutes or longer to raise temperature to 1000° C., graphene was detected as major component with almost no silicon oxide (SiO$_2$) component. FIG. 7F illustrates XPS valence band spectra of the composites of Preparation Examples 1, 3 and 5, the structures of Comparative Preparation Examples 2 and 3, and silicon oxide (SiO$_2$) as a starting material.

The results of compositional XPS analysis on the composites of Preparation Example 1, 3, and 5, the structures of Comparative Preparation Examples 2 and 3, and silicon oxide (SiO$_2$) as a starting material are shown in Table 11.

TABLE 11

| Example | Reaction time (Temperature increase time) | Amount of carbon corresponding to C 1s peak (Atomic %) | Amount of oxygen corresponding to O 1s peak (Atomic %) | Amount of silicon corresponding to Si 2p peak (Atomic %) |
|---|---|---|---|---|
| Preparation Example 1 | 30 min | 96.24 | 2.11 | 1.65 |
| Preparation Example 3 | 60 min | 99.06 | 0.8 | 0.15 |
| Preparation Example 5 | 4 hr | 97.64 | 1.71 | 0.65 |
| Comparative Preparation Example 2 | 1 min | 9.5 | 51.33 | 39.17 |
| Comparative Preparation Example 3 | 5 min | 10.47 | 50.57 | 38.97 |
| $SiO_2$ | 0 min | 8.62 | 53.54 | 37.64 |

Referring to Table 11, the structures of Comparative Preparation Examples 2 and 3 in which the reaction time was about 5 min or were found to include $SiO_2$ as major component, while the composites of Preparation Examples 1, 3, and 5 in which the reaction time was about 30 min or longer were found to include graphene as major component.

Referring to FIGS. 7B to 7E, it was found that peak shifting occurred as the reaction time increased, indicating generation of a reduction product of silicon oxide ($SiO_2$) used as a starting material.

Referring to FIG. 7F, only a valence-band structure of $SiO_2$ was observed in the XPS valence band spectra of the structures of Comparative Preparation Examples 2 and 3 in which the reaction time was about 5 min or less, while a valence-band structure of graphene was observed in the XPS valence band spectra of the composites of Preparation Examples 1, 3, and 5 in which the reaction time was 30 min or longer to.

Uniformities of carbon and silicon over different regions were analyzed based on the results in Table 11. The results are shown in Table 12.

The uniformity of carbon and silicon in each sample was obtained as a deviation in the amounts of carbon and silicon in 10 regions of the sample from an average amount of carbon and silicon obtained based on XPS analysis results.

TABLE 12

| Example | Uniformity (%) |
|---|---|
| Preparation Example 1 | 1% |
| Preparation Example 3 | 0.98 |
| Preparation Example 5 | 0.99% |
| Comparative Preparation Example 2 | 5.1% |
| Comparative Preparation Example 3 | 5.5% |
| $SiO_2$ | 5.0% |

Referring to Table 12, the composites of Preparation Example 1, 3, and 5 were found to have an improved uniformity of 1% or less, compared to the structures of Comparative Preparation Examples 2 and 3 and $SiO_2$.

3) Preparation Example 3 and Example 5

The composite of Preparation Example 3 and the electrode material of Example 5 were analyzed by XPS in the same manner as for the composite of Preparation Example 4 and Example 4 as described above. For comparison, XPS data of electrode active material A that was used as a starting material to prepare the electrode material of Example 5 was also represented.

Figure 7G:
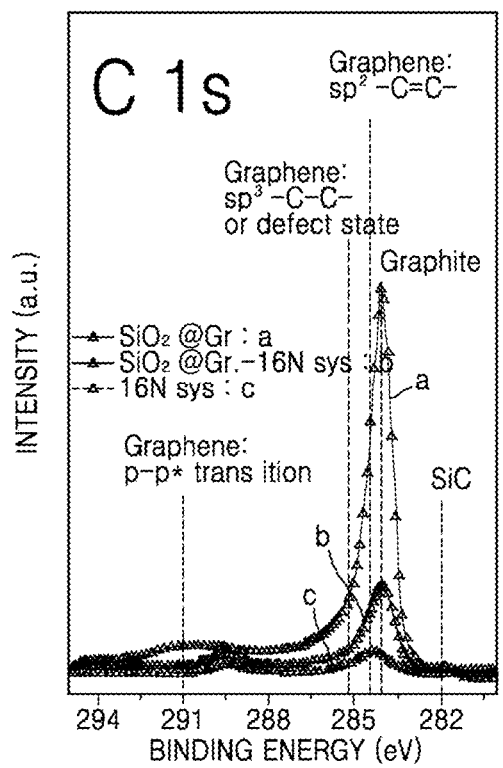
FIGS. 7G and 7H are each a graph of intensity (a.u.) versus binding energy (eV) which illustrate results of compositional XPS analysis on the composite of Preparation Example 3 and the electrode material of Example 5, respectively.
Figure 7H:
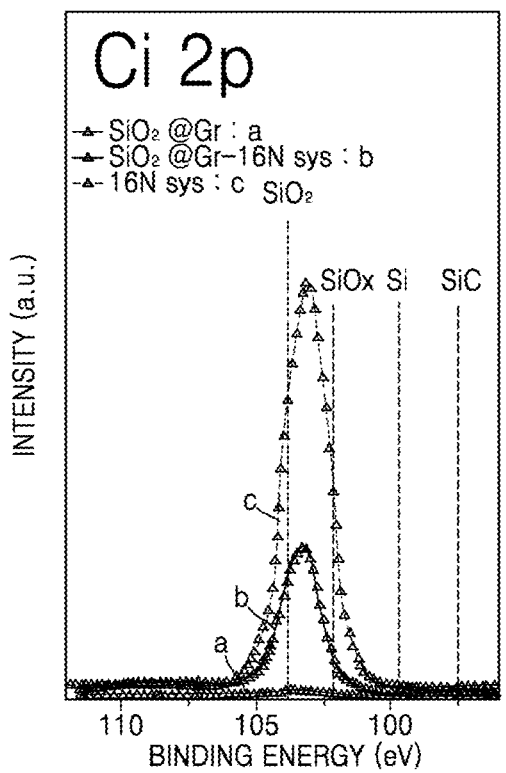

The results of compositional XPS analysis on the samples are shown in Table 13 and FIGS. 7G and 7H. In FIGS. 7G and 7H, "$SiO_2$@Gr" indicates the composite of Preparation Example 3, "$SiO_2$@Gr.-16Nsys" indicates the electrode material of Example 5, and "16 Nsys" indicates the electrode active material A.

TABLE 13

| Example | Amount of carbon corresponding to C 1s peak | Amount of oxygen corresponding to O 1s peak (Atomic %) | Amount of silicon corresponding to Si 2p peak (Atomic %) |
|---|---|---|---|
| Preparation Example 3 | 98.66 | 1.08 | 0.25 |
| Example 5 | 67.36 | 20.97 | 11.67 |
| electrode active material A | 2.32 | 69.18 | 28.51 |

Evaluation Example 4; Scanning Electron Microscopy with Energy Dispersive Analysis of X-rays (SEM-EDAX)

The electrode material of Example 1 was analyzed by scanning electron microscopy combined with energy dispersive analysis of X-rays (SEM-EDAX) using a FEI Titan 80-300 (available from Philips). The results of the SEM-EDAX are shown in FIGS. 8A to 8H.

Figure 8A:
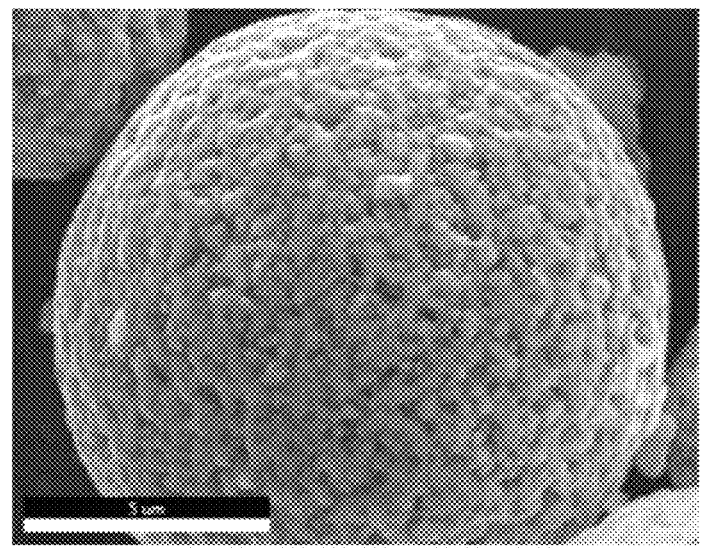
Figure 8B:
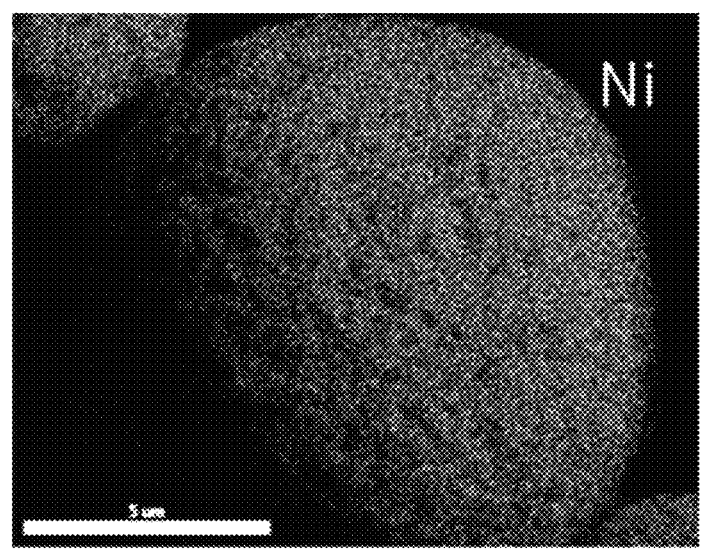
Figure 8C:
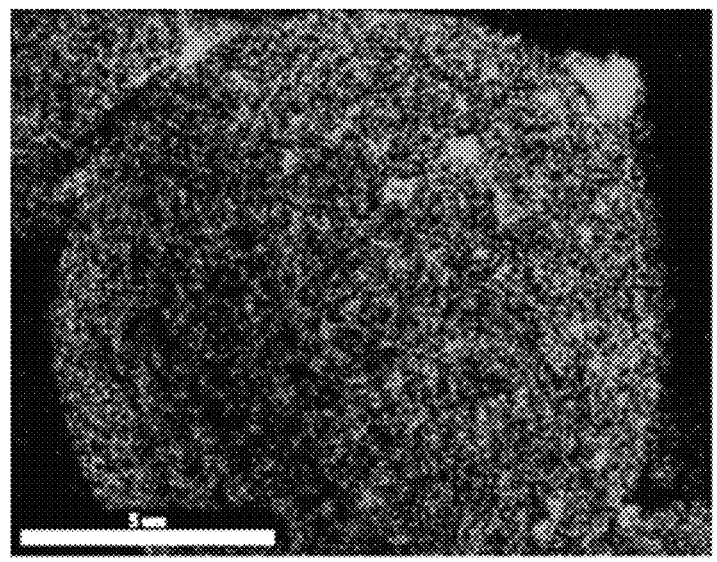
Figure 8D:
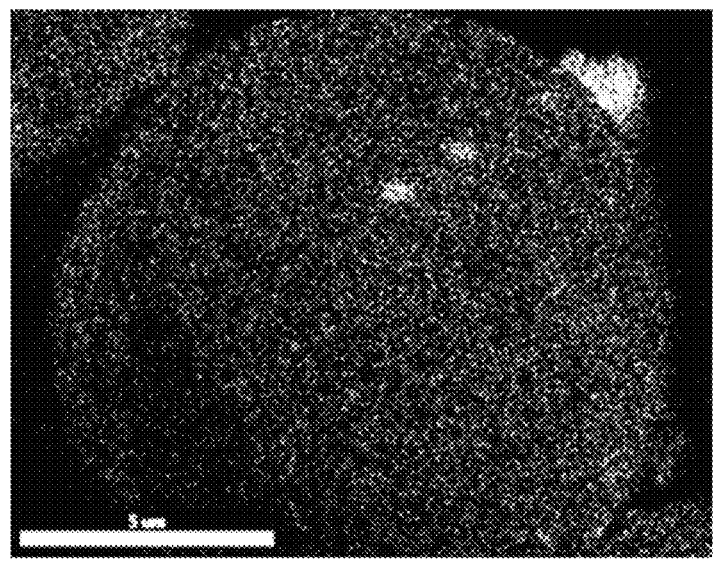
Figure 8E:
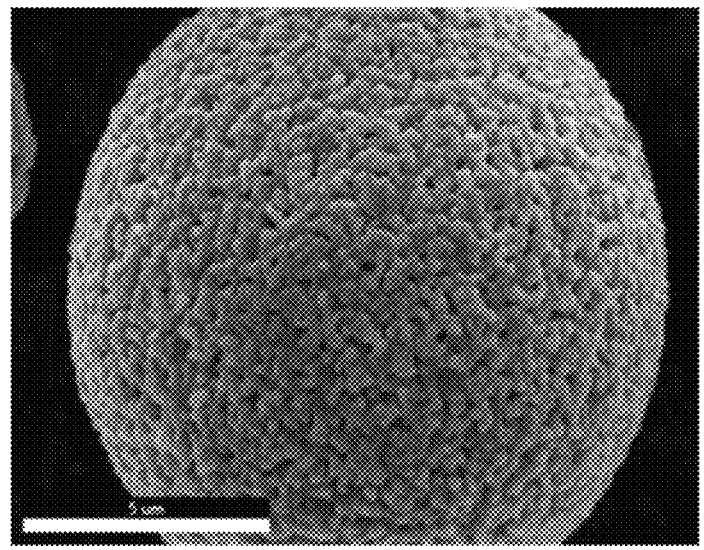
Figure 8F:
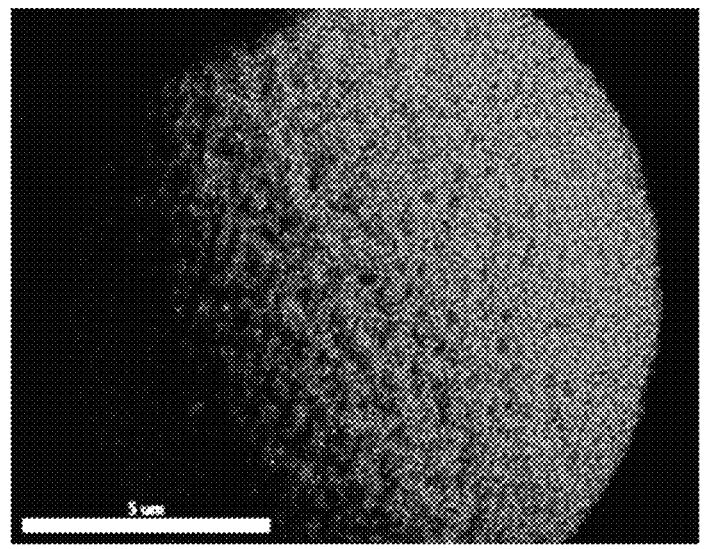
Figure 8G:
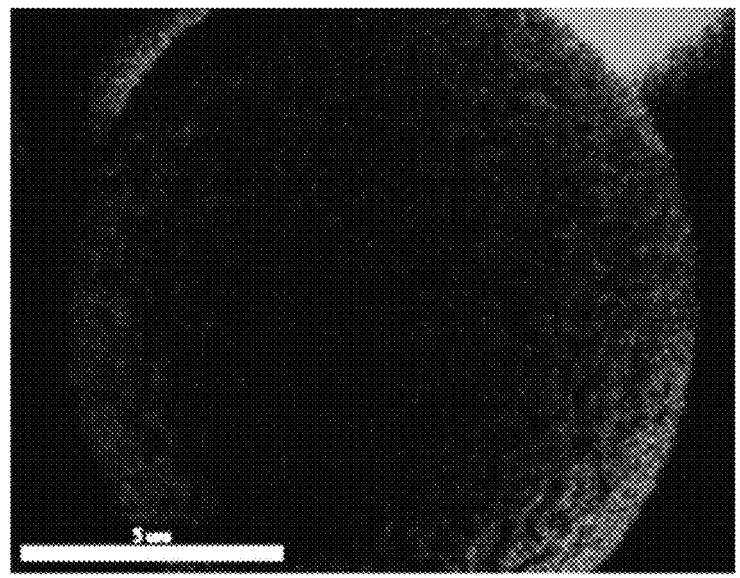
Figure 8H:
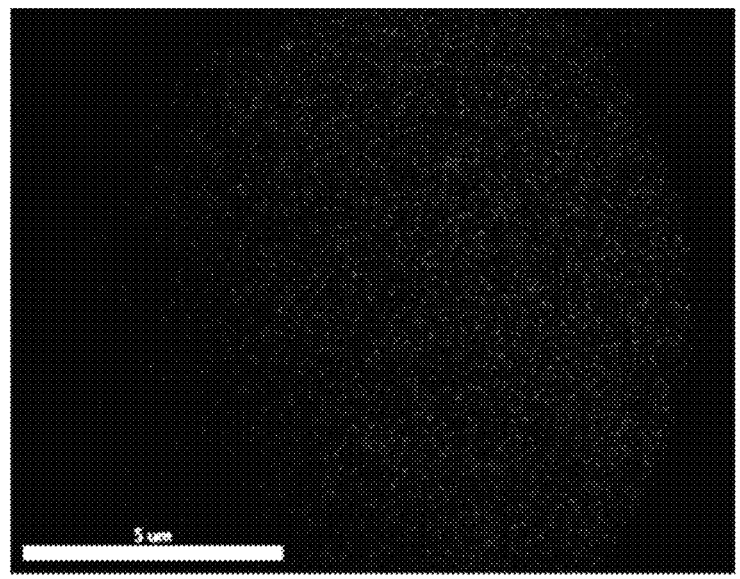

Referring to FIGS. 8A to 8H, the electrode material of Example 1 was found to include the composite of Preparation Example 1 coating the surface of NCM. FIGS. 8A and 8E are the results of the SEM-EDAX on the entire electrode material of Example 1. FIGS. 8B and 8F are the results of SEM-EDAX on nickel, FIGS. 8C and 8G are the results of SEM-EDAX on carbon, and FIGS. 8E and 8H are the results of SEM-EDAX on silicon.

Evaluation Example 5: Thermogravimetric Analysis

1) Preparation Examples 1 and 4 and Comparative Preparation Examples 1 to 3

Figure 9A:
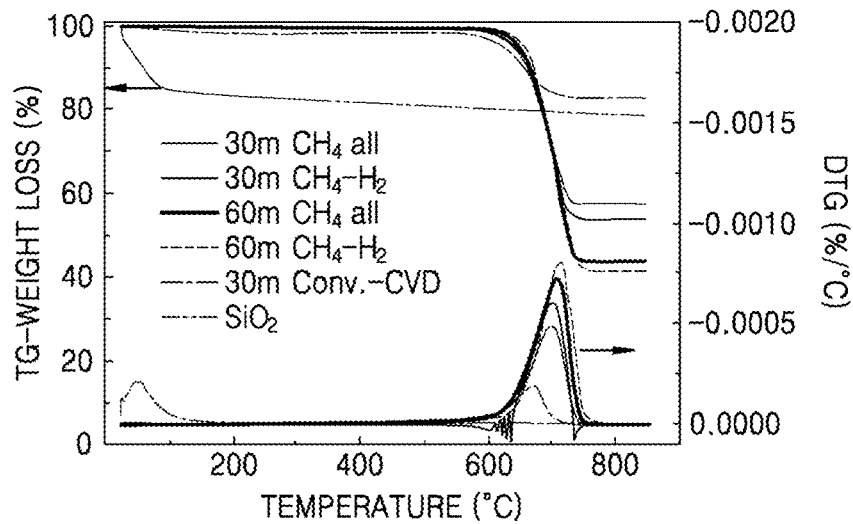
FIG. 9A is graph of weight loss (percent, %) versus temperature (° C.) showing the results of thermogravimetric analysis (TGA) of the composites of Preparation Examples 1 to 4 and the structure of Comparative Preparation Example 1.

The composites of Preparation Examples 1 to 4 and the structures of Comparative Preparation Examples 1 to 3) were analyzed by thermogravimetry using a thermogravimetric analyzer (SDF-2960, available from TA instrument). The resulting thermogravimetric analysis-differential thermogravimetric analysis (TGA-DTGA) curves thereof are shown in FIG. 9A. For comparison, the results of TGA on fumed $SiO_2$ particles used as a starting material in Preparation Examples 1 to 4 are also represented in FIG. 9A. In FIG. 9A, "30 m $CH_4$ all" denotes the composite of Preparation Example 1, "30 m $CH_4$—$H_2$" denotes the composite of Preparation Example 2, "60 m $CH_4$ all" denotes the composite of Preparation Example 3, "60 m $CH_4$—$H_2$" denotes the composite of Preparation Example 4, and "30 m Conv.-CVD" denotes the structure of Comparative Preparation Example 1. The amount of graphene in each of the samples was calculated based on the results in FIG. 9A, and is shown in Table 14.

TABLE 14

| Example | Amount of graphene (wt %) |
| --- | --- |
| Preparation Example 1 | 42.5 |
| Preparation Example 2 | 46.1 |
| Preparation Example 3 | 56.2 |
| Preparation Example 4 | 69.5 |
| Comparative Preparation Example 1 | 17.1 |
| Comparative Preparation Example 2 | 2 |
| Comparative Preparation Example 3 | 10 |

Referring to FIG. 9A and Table 14, the composites of Preparation Examples 1 to 4 were found to contain relatively large amount of graphene due to the active growth of graphene, compared to the structures of Comparative Preparation Examples 1 to 3.

2) Example 4 and NCM

The electrode material of Example 4 and NCM were analyzed by thermogravimetry in the same manner as for the composites of Preparation Examples 1 to 4 and the structure of Comparative Preparation Example 1 as described above.

Figure 9B:
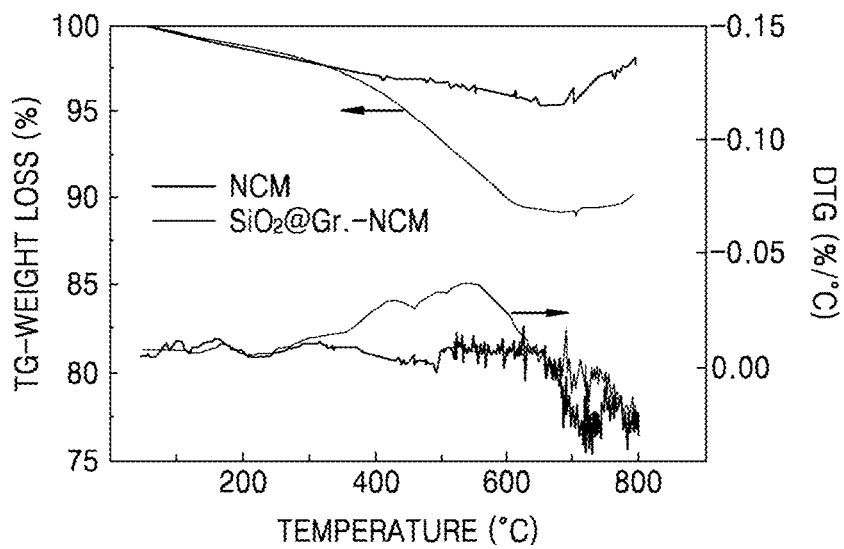
FIG. 9B is a graph of weight loss (percent, %) versus temperature (° C.) showing the results of TGA of the electrode material of Example 1 and NCM.

The results of the TGA are shown in FIG. 9B and Table 15. In FIG. 9B, "NCM" indicates a lithium composite oxide ($LiNi_{0.5}Co_{0.2}Mn_{0.3}O_2$), and "$SiO_2$@Gr-NCM" indicates the composite of Example 4.

TABLE 15

| Example | Amount of graphene (wt %) |
| --- | --- |
| Preparation Example 4 | 58.9 |
| Example 4 | 0.3 |
| NCM | 0 |

Evaluation Example 6: X-Ray Diffraction Analysis

1) Preparation Examples 1-4 and Comparative Preparation Example 1

The composites of Preparation Examples 1 to 4 and the structure of Comparative Preparation Example 1 were analyzed by X-ray diffraction analysis with CuKα radiation.

Figure 10A:
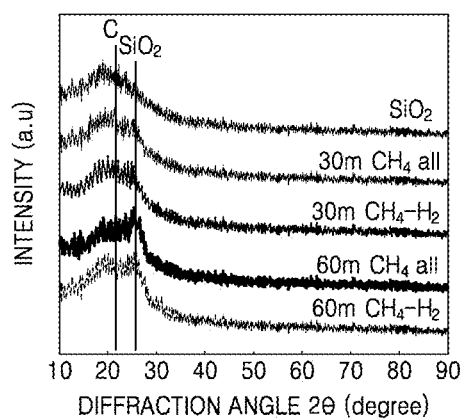
FIG. 10A is a graph of intensity (a.u.) versus diffraction angle (degrees two-theta, °2θ) which illustrates results of X-ray diffraction analysis on the composites of Preparation Examples 1 and 4 and the structure of Comparative Preparation Example 1.

The results of the X-ray diffraction analysis are shown in FIG. 10A. In FIG. 10A, "30 m $CH_4$ all" denotes the composite of Preparation Example 1, "30 m $CH_4$—$H_2$" denotes the composite of Preparation Example 2, "60 m $CH_4$ all" denotes the composite of Preparation Example 3, and "60 m $CH_4$—$H_2$" denotes the composite of Preparation Example 4, denotes the structure of Comparative Preparation Example 1.

Referring to FIG. 10A, in the composites of Preparation Examples 1 to 4, peak shifting occurred due to the inclusion of a reproduction product of silicon oxide ($SiO^2$), compared to the $SiO_2$.

2) Preparation Examples 1, 3 and 5, and Comparative Preparation Examples 2 and 3

The composites of Preparation Examples 1, 3, 5 and the structures of Comparative Preparation Examples 2 and 3 were analyzed by X-ray diffraction analysis with CuKα radiation.

Figure 10B:
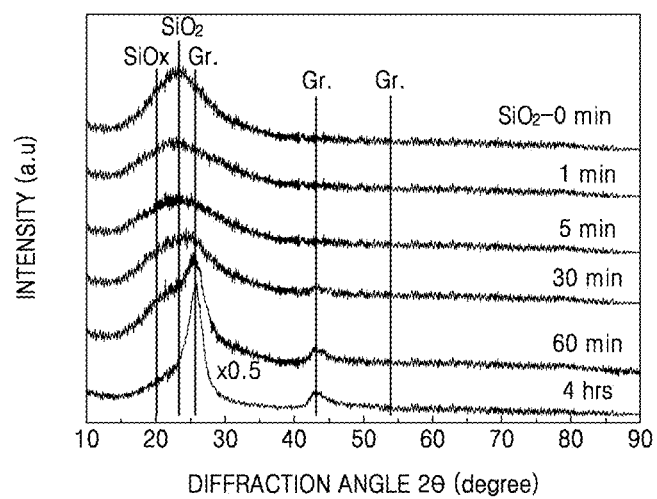
FIG. 10B is a graph of intensity (a.u.) versus diffraction angle (degrees two-theta, °2θ) which illustrates results of X-ray diffraction analysis on the composites of Preparation Examples 1, 3 and 5 and the structures of Comparative Preparation Examples 2 and 3.

The results of the X-ray diffraction analysis are shown in FIG. 10B. In FIG. 10B, "$SiO_2$-0 min" denotes silicon oxide ($SiO_2$), "1 min" denotes the structure of Comparative Preparation Example 2, "5 min" denotes the structure of Comparative Preparation Example 3, "30 min" denotes the composite of Preparation Example 1, "60 min" denotes the composite of Preparation Example 3, and "4 hrs" denotes the composite of Preparation Example 5.

Evaluation Example 7: Raman Spectroscopy

1) Preparation Examples 1-4

The composites of Preparation Examples 1 to 4 were analyzed by Raman spectroscopy.

Figure 11A:
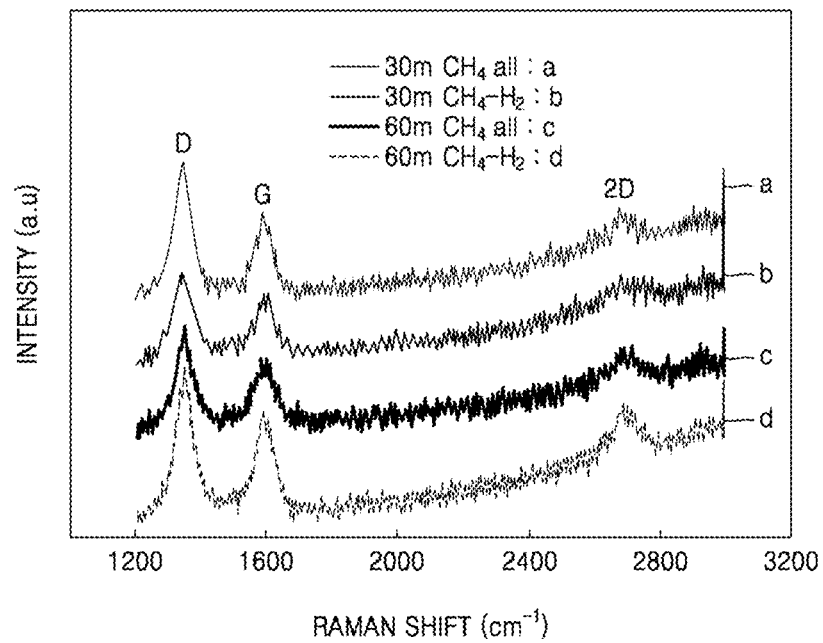
FIGS. 11A to 11D are graphs of intensity (a.u.) versus Raman shift (wavenumbers, $cm^{-1}$) showing Raman spectra of the composites of Preparation Examples 1 to 4, the structures of Comparative Preparation Examples 2 and 3, and the electrodes materials of Examples 4 and 5.

The results of the Raman spectroscopy are shown in FIG. 11A. In FIG. 11A, "30 m $CH_4$ all" denotes the composite of Preparation Example 1, "30 m $CH_4$—$H_2$" denotes the composite of Preparation Example 2, "60 m $CH_4$ all" denotes the composite of Preparation Example 3, and "60 m $CH_4$—$H_2$" denotes the composite of Preparation Example 4.

An intensity ratio of D peak to G peak (D/G) of each of the composites was obtained based on the results of FIG. 11A. The results are shown in Table 16.

A Raman spectrum of graphene includes peaks at 1350 $cm^{-1}$, 1580 $cm^{-1}$, and 2700 $cm^{-1}$, which give information about the thickness, crystallinity, and charge doping status of the graphene. The peak at 1580 $cm^{-1}$, which is a peak called G-mode, results from a vibrational mode of C—C bond stretching. The energy of G-mode is determined depending on the density of surplus charges. The peak at 2700 $cm^{-1}$, which is a peak called 2D-mode, indicates the thickness of graphene. The peak at 1350 $cm^{-1}$, which is a peak called D-mode, indicates that a $SP^2$ crystal structure includes a defect. The intensity ratio of D/G indicates the degree of disordering of graphene crystals.

TABLE 16

| Example | Intensity ratio of D/G |
| --- | --- |
| Preparation Example 1 | 1.076 |
| Preparation Example 2 | 1.055 |
| Preparation Example 3 | 1.068 |
| Preparation Example 4 | 1.093 |

Referring to 11a and Table 16, in consideration of the intensity ratio of D/G of graphene, it was found that the quality of graphene did not degrade even when the amount of graphene increases as the reaction time increases.

2) Preparation Example 4 and Example 4

The composite of Preparation Example 4 and the electrode material of Example 4 were analyzed by Raman spectroscopy in the same manner as for the composites of Preparation Examples 1 to 4. For comparison, a Raman spectrum of NCM was also represented.

Figure 11B:
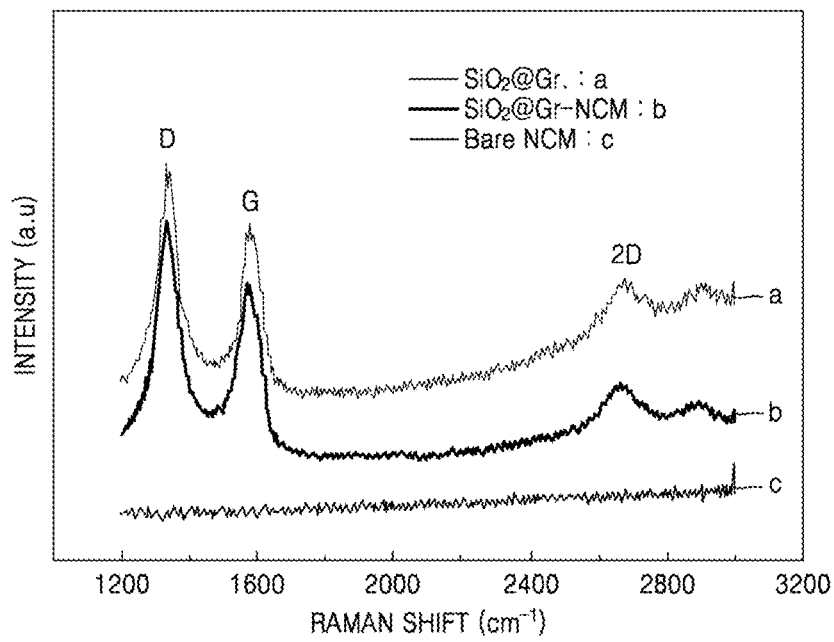

The results of the Raman spectroscopy are shown in FIG. 11B and Table 17. In FIG. 11B, "$SiO_2$@Gr." denotes the composite of Preparation Example 4, "$SiO_2$@Gr.-NCM" denotes the electrode material of Example 4, and "Bare NCM" denotes lithium composite oxide ($LiNi_{0.5}Co_{0.2}Mn_{0.3}O_2$).

TABLE 17

| Example | Intensity ratio of D/G |
|---|---|
| Preparation Example 4 | 1.093 |
| Example 4 | 1.146 |

3) Preparation Examples 1 and 5, Comparative Preparation Examples 2 and 3

The composites of Preparation Examples 1, 3, and 5 and the structures of Comparative Preparation Examples 2 and 3 were analyzed by Raman spectroscopy in the same manner as for the composites of Preparation Examples 1 to 4.

Figure 11C:
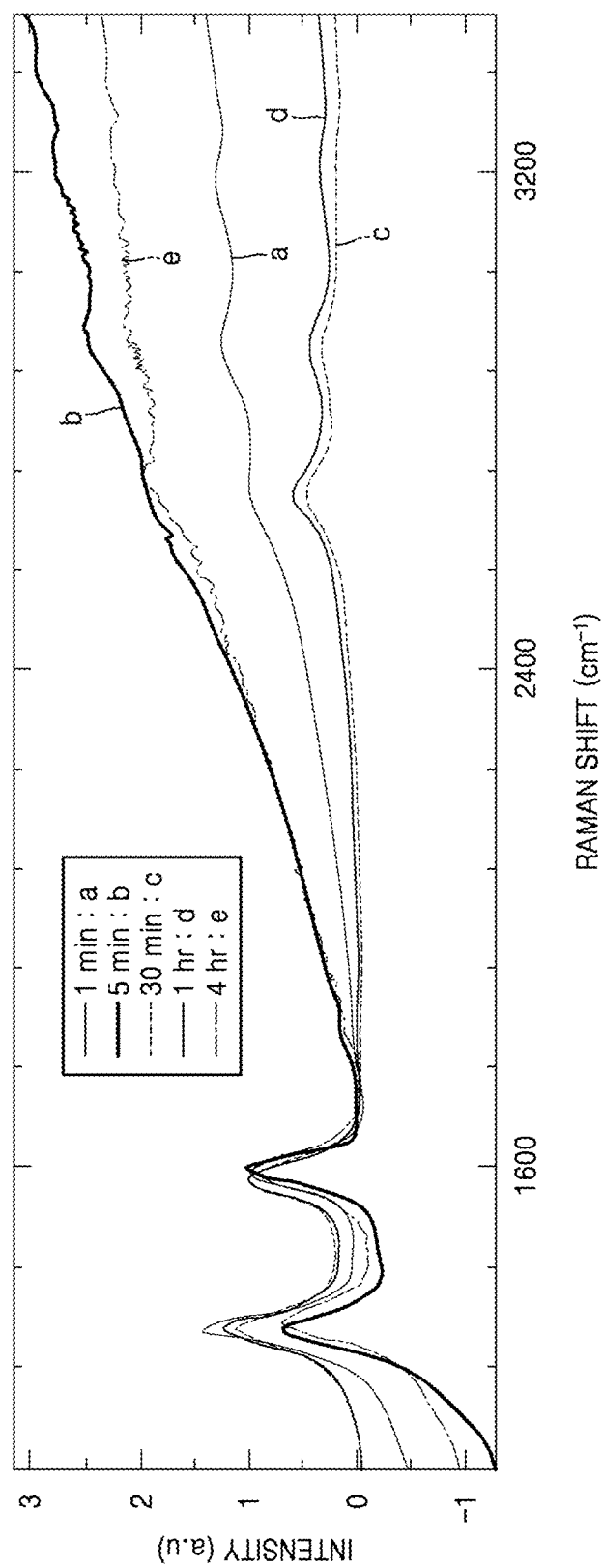

The results of the Raman spectroscopy are shown in FIG. 11C and Table 18. In FIG. 11C, "1 min" denotes the structure of Comparative Preparation Example 2, "5 min" denotes the structure of Comparative Preparation Example 3, "30 min" denotes the composite of Preparation Example 1, "60 min" denotes the composite of Preparation Example 3, and "4 hrs" denotes the composite of Preparation Example 5.

TABLE 18

| Example | Intensity ratio of D/G |
|---|---|
| Preparation Example 1 | 1.2 |
| Preparation Example 3 | 1.2 |
| Preparation Example 5 | 1.3 |
| Comparative Preparation Example 2 | 1.6 |
| Comparative Preparation Example 3 | 1.2 |

Referring to Table 18, when the reaction time was 5 minutes or longer (Preparation Examples 1, 3, and 5), the intensity ratios of D/G were not significantly different, unlike when the reaction time was shorter than 5 minutes (Comparative Preparation Examples 2 and 3).

4) Preparation Example 3 and Example 5

The composite of Preparation Example 3 and the electrode material of Example 5 were analyzed by Raman spectroscopy in the same manner as described above.

Figure 11D:
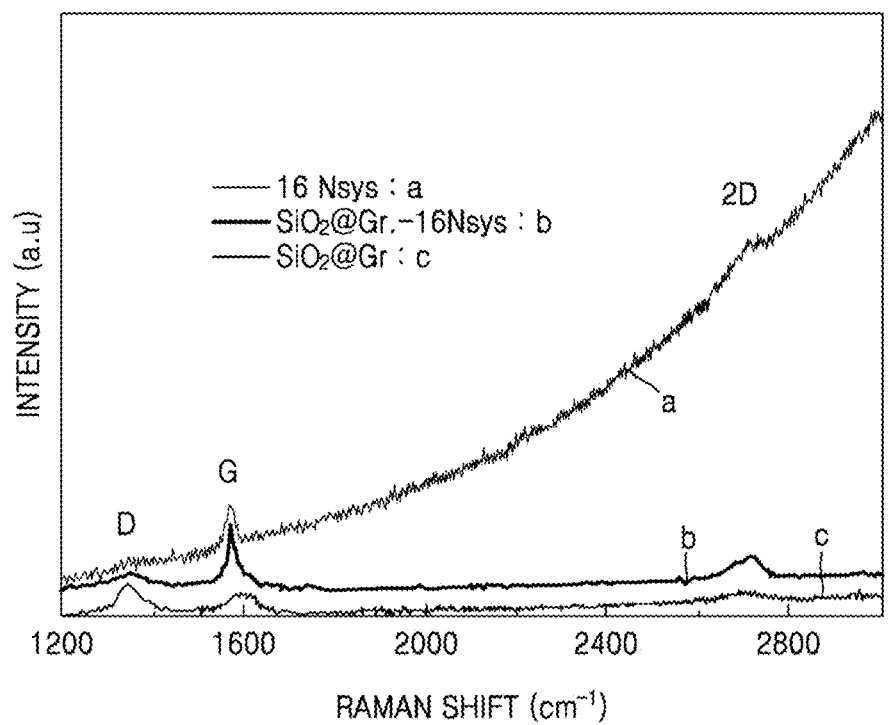

The results of the Raman spectroscopy are shown in FIG. 11D and Table 19. In FIG. 11D, "16Nys" denotes a starting material, that is, an electrode active material (SiNANOde, available from Nanosys, U.S.A) including a graphite core and a silicon oxide nanowire on the graphite core used to prepare the electrode material of Example 5, "SiO$_2$@Gr-16Nys" denotes the electrode material of Example 5, and "SiO$_2$@Gr" denotes the composite of Preparation Example 3.

TABLE 19

| Example | Intensity ratio of D/G |
|---|---|
| Preparation Example 3 | 1.093 |
| Example 5 | 1.146 |

Evaluation Example 8: Adhesion Test

1) Example 4

The adhesions of the electrode material of Example 4 and NCM were tested according to a T-peel a test (ASTM D1876). The results of the adhesion test are shown in Table 20.

TABLE 20

| Example | Adhesion (N/m) |
|---|---|
| Example 4 | 121.31 |
| NCM | 118.24 |

Referring to Table 20, the electrode material of Example 4 was found to have improved adhesion, compared to NCM.

2) Example 5

The adhesion of the electrode material of Example 1 was tested in the same manner as for the electrode material of Example 4. The results are shown in Table 21. For comparison, the adhesion of the starting material (i.e., the electrode active material (hereinafter referred to as electrode active material A) including a graphite core and a silicon oxide nanowire on the graphite core) used to prepare the electrode material of Example 5 is also represented in Table 21.

TABLE 21

| Example | Adhesion (N/m) |
|---|---|
| Example 5 | 27.43 |
| Electrode active material A | 2.71 |

Referring to Table 21, the electrode material of Example 5 was found to have improved adhesion, compared to the electrode active material A.

Figure 12:
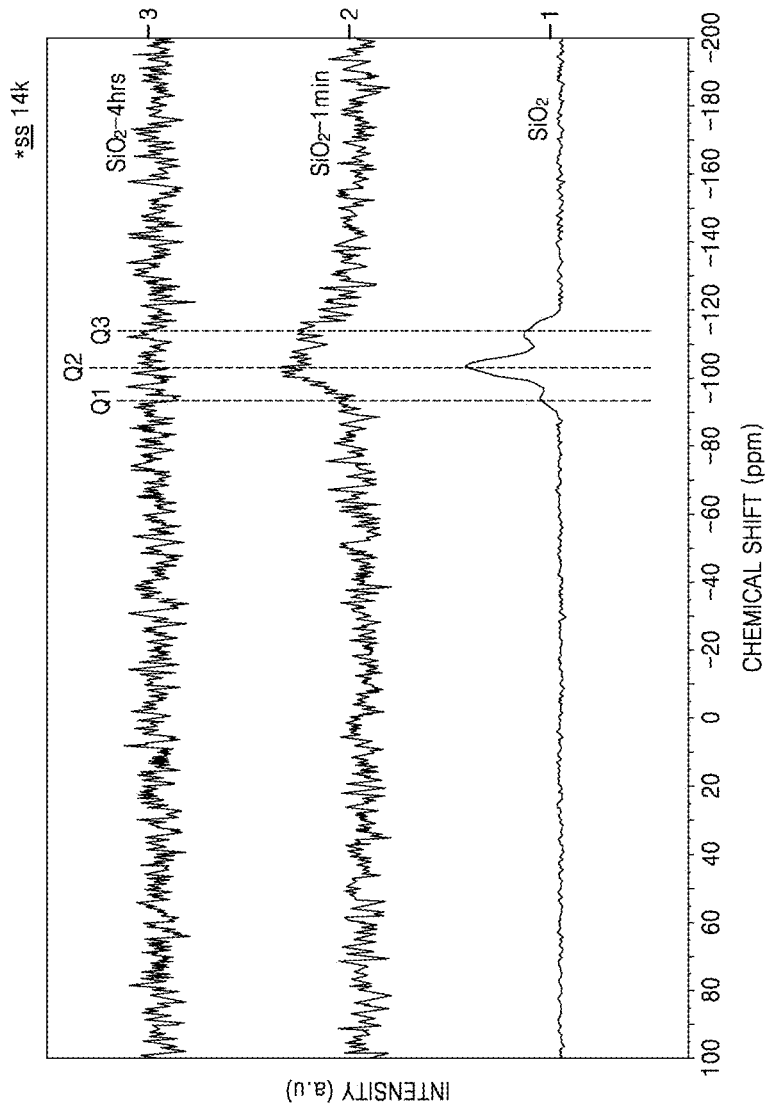
FIG. 12 is a graph of intensity (a.u.) versus $^{29}Si$ chemical shift (parts per million, ppm from tetramethylsilane (TMS)) which illustrates results of $^{29}Si\{^1H\}$-cross-polarization/magic angle spinning nuclear magnetic resonance ($^{29}Si\{^1H\}$-CP/MAS NMR) spectroscopy on the composite of Preparation Example 5, the structure of Comparative Preparation Example 2, and $SiO_2$.

Evaluation Example 9: 29Si{$^1$H}-Cross-Polarization/Magic-Angle Spinning Nuclear Magnetic Resonance (CP/MAS NMR) Spectroscopy The composite of Preparation Example 5, the structure of Comparative Preparation Example 2, and SiO$_2$ were analyzed by 29Si{$^1$H}-CP/MAS NMR spectroscopy, which was performed at a spinning rate of about 5 kHz using a Bruker 700 MHz NMR spectrometer with rotors in which about 100 mg to 200 mg of samples were loaded. The results are shown in FIG. 12. In FIG. 12, "SiO$_2$-4 hrs" denotes the composite of Preparation Example 5, and "SiO$_2$-1 min" denotes the structure of Comparative Preparation Example 2.

Referring to FIG. 12, the composite of Preparation Example 5 "SiO$_2$-4 hrs" was found to have Si—O-related peaks that became broad in width and lower in peak intensity, with the increase of time, compared to the structure of Comparative Preparation Example 2 and SiO$_2$, indicating that the composite of Preparation Example 5 loses characteristics of SiO$_2$ that appears in the structure of Comparative Preparation Example 2 and SiO$_2$.

Evaluation Example 10: Transmission Electron Microscopy with Energy-Dispersive X-ray Spectrometry (TEM-EDS)

1) Preparation Example 6

Figure 13A:
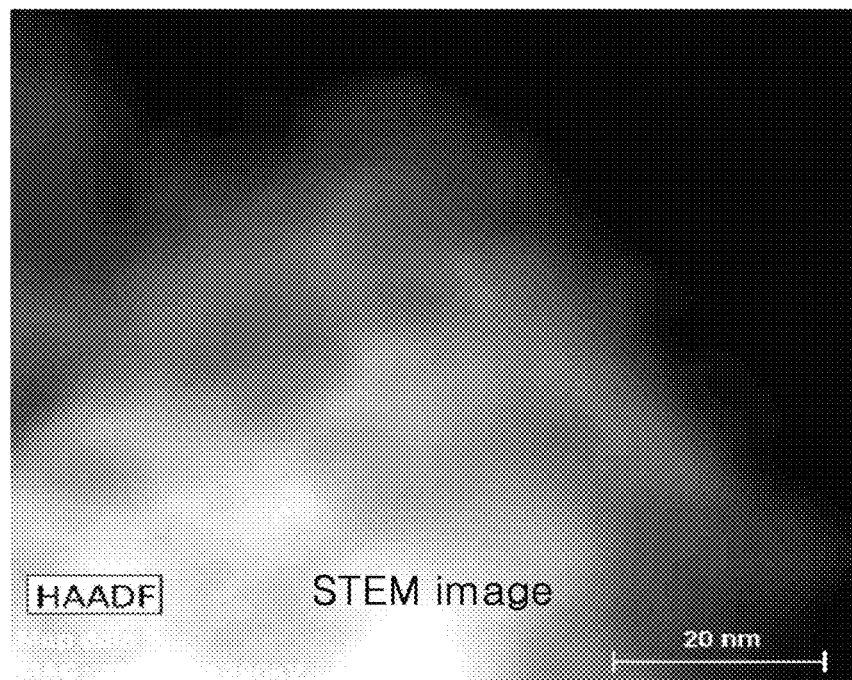
Figure 13B:
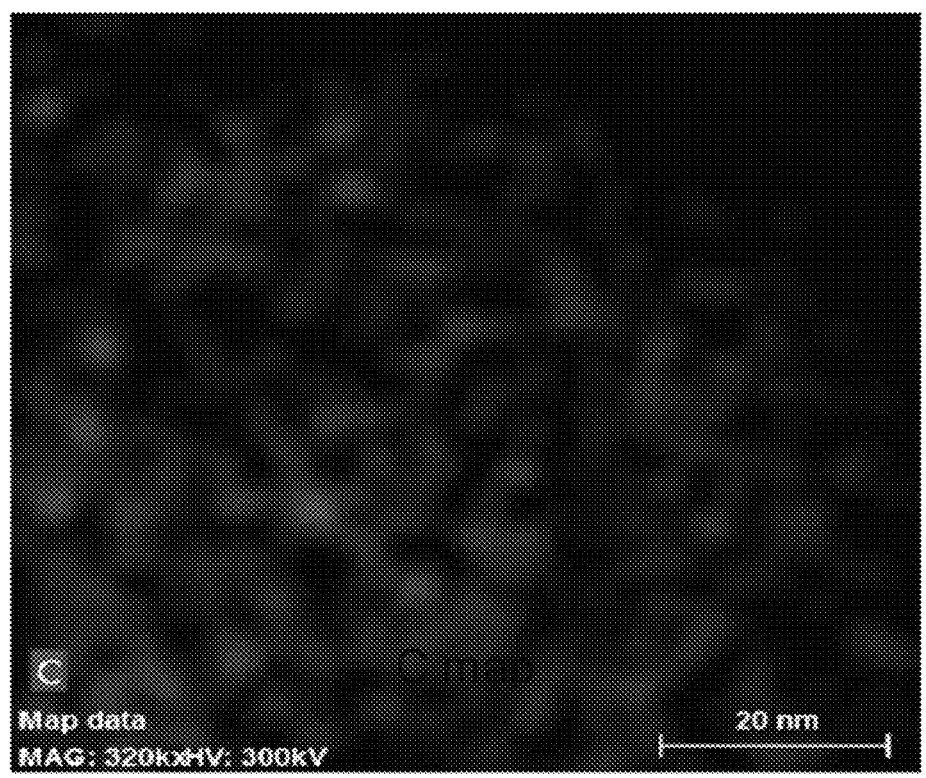

The composite of Preparation Example 6 was analyzed by transmission electron microscopy with energy-dispersive X-ray spectrometry (TEM-EDS) using an analysis equipment including a transmission electron microscope with an energy-dispersive X-ray spectrometer attached. As a result, high-angle annular dark field scanning transmission electron microscopic (HAADF-STEM) images of the composite of Preparation Example 6 were obtained, and qualitative analysis was performed on component elements. For comparison, silicon oxide ($SiO_2$) used as a starting material to prepare the composite of Preparation Example 6 was also analyzed by TEM-EDS. A HAADF-STEM image of the composite of Preparation Example 6 is shown in FIG. 13A. A carbon map, silicon-carbon map overlap, silicon map, oxygen map, and silicon and oxygen map overlap of the composite of Preparation Example 6 are shown in FIGS. 13B to 13F, respectively. The results of the TEM-EDS on the silicon oxide ($SiO_2$) are shown in FIGS. 13G to 13K.

Figure 13C:
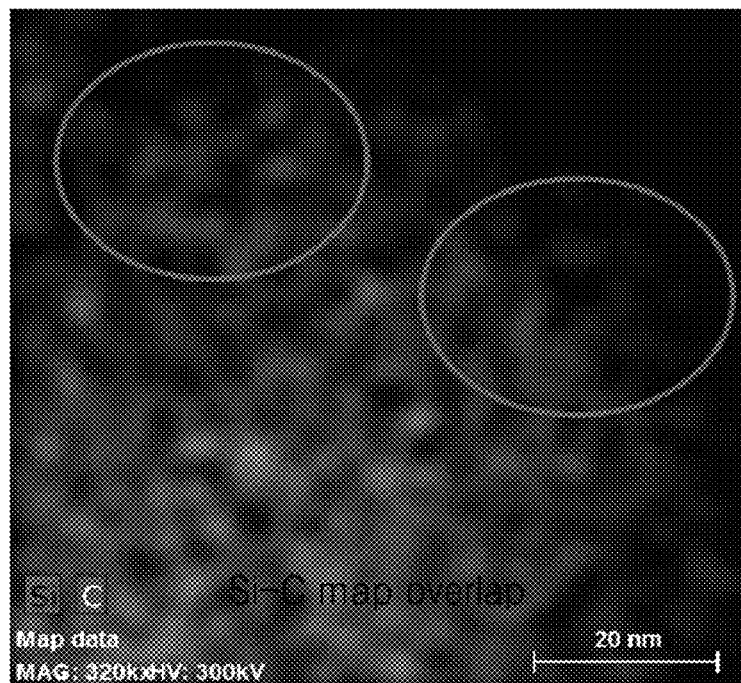
Figure 13D:
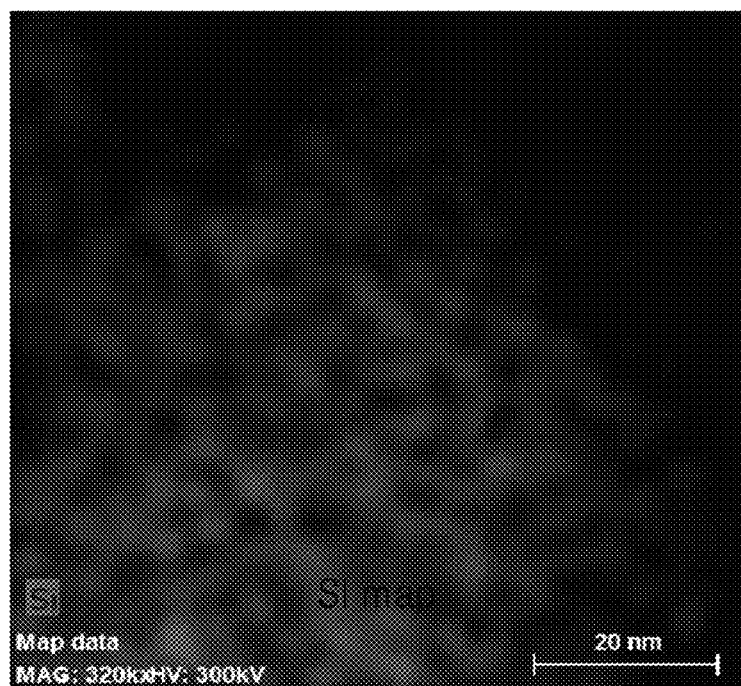
Figure 13E:
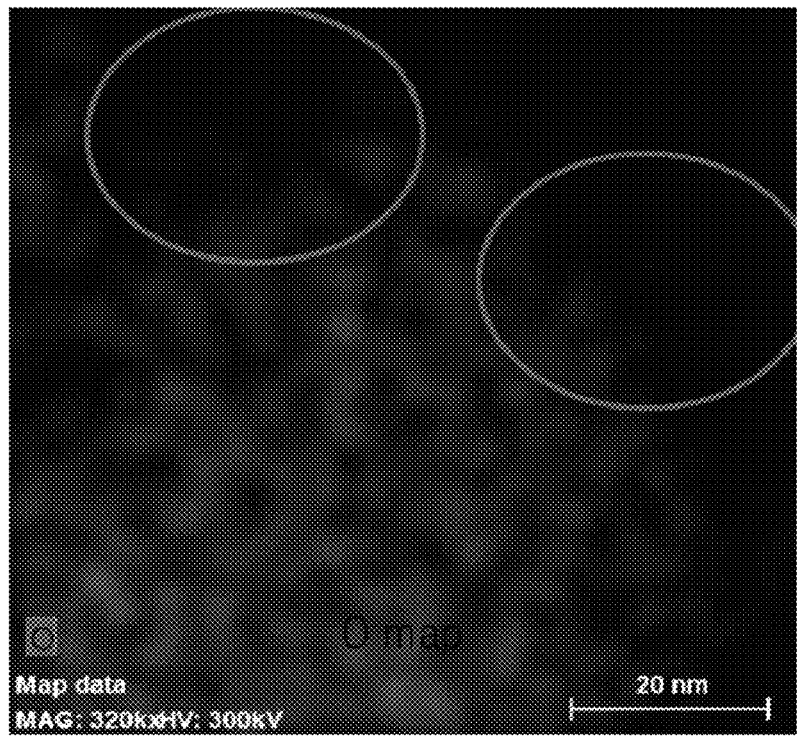
Figure 13F:
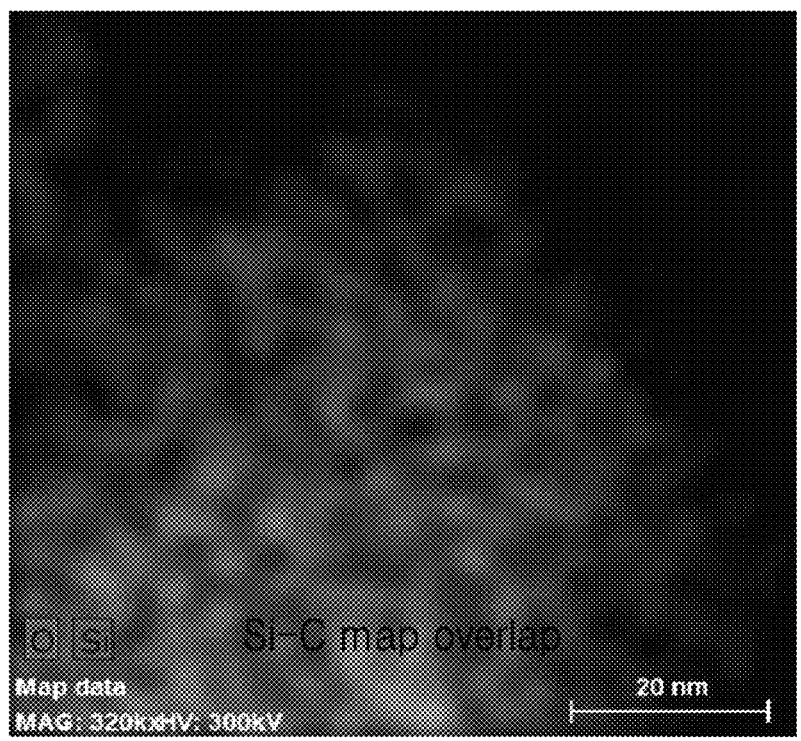
Figure 13G:
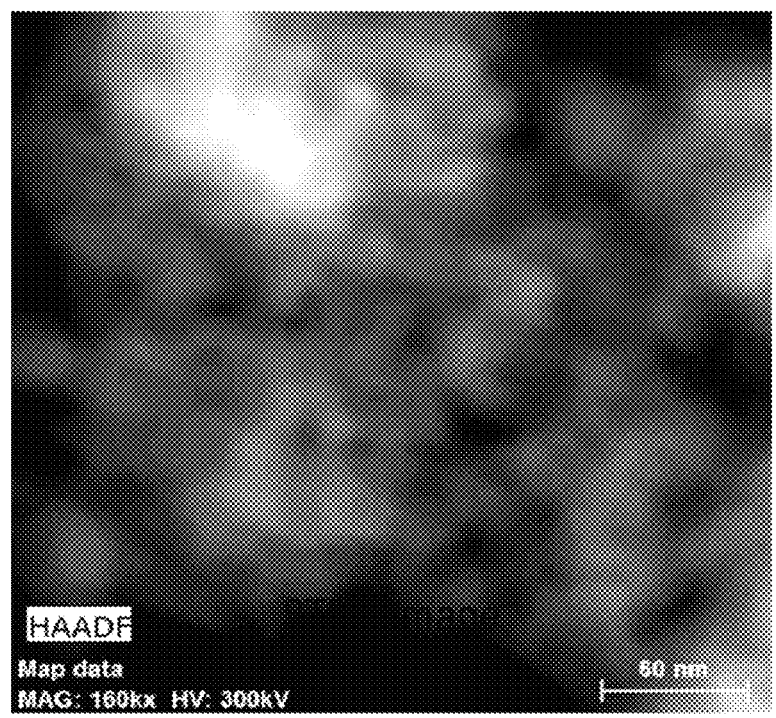
Figure 13H:
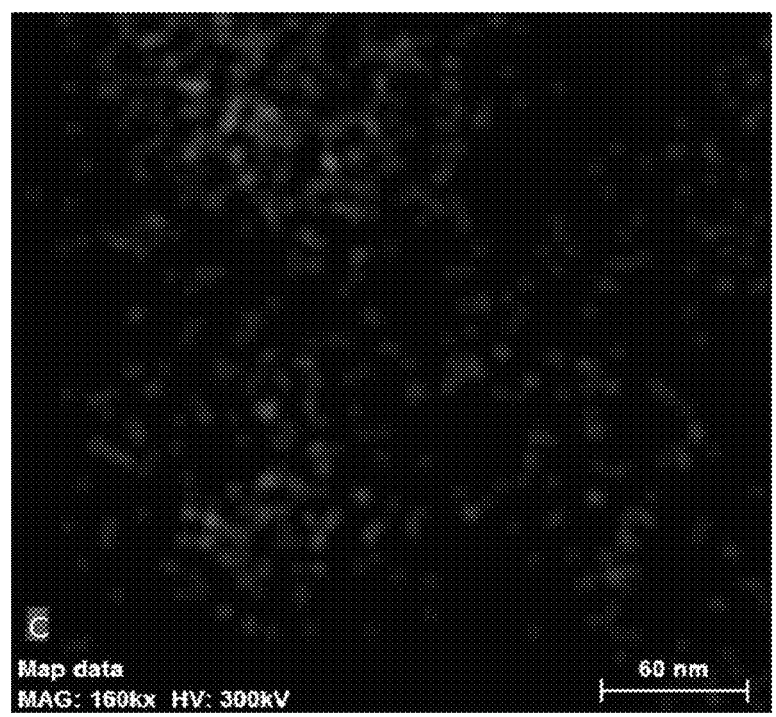
Figure 13I:
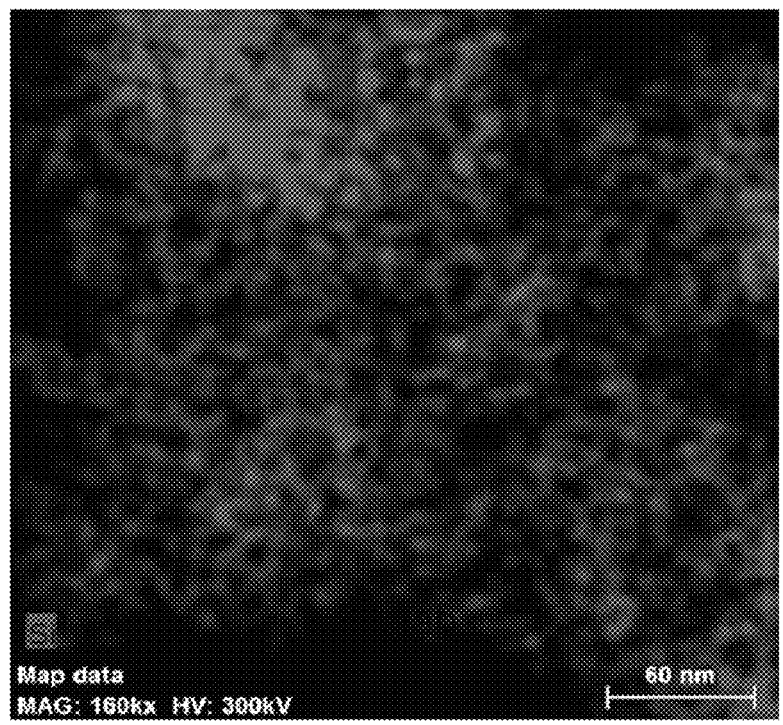
Figure 13J:
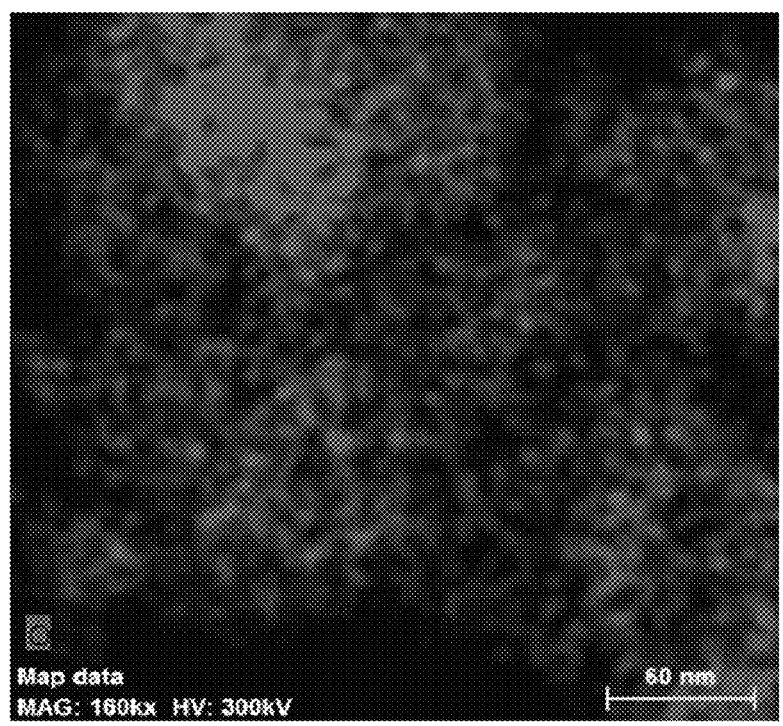
Figure 13K:
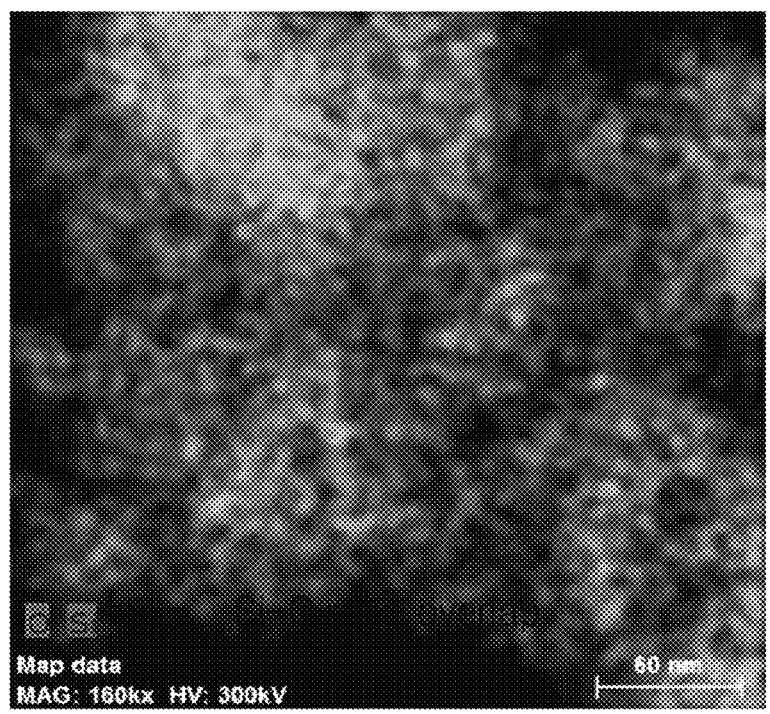
Figure 14A:
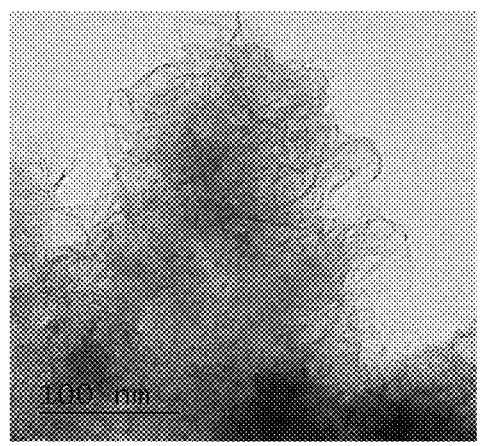
FIGS. 14A to 14D are TEM images of the composite of Preparation Example 1.
Figure 14B:
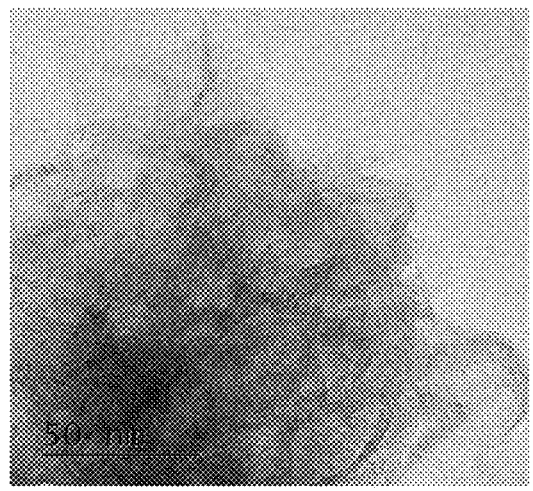
Figure 14C:
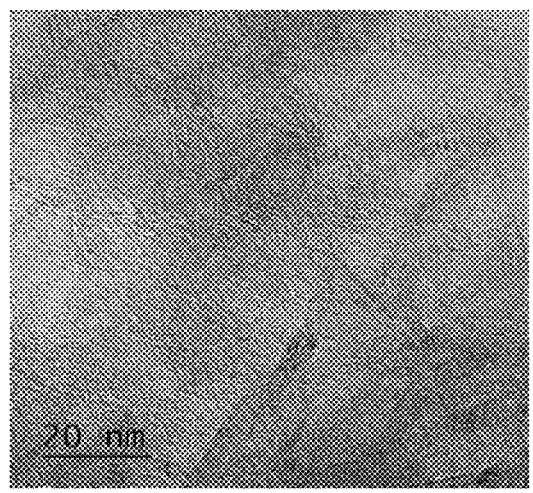
Figure 14D:
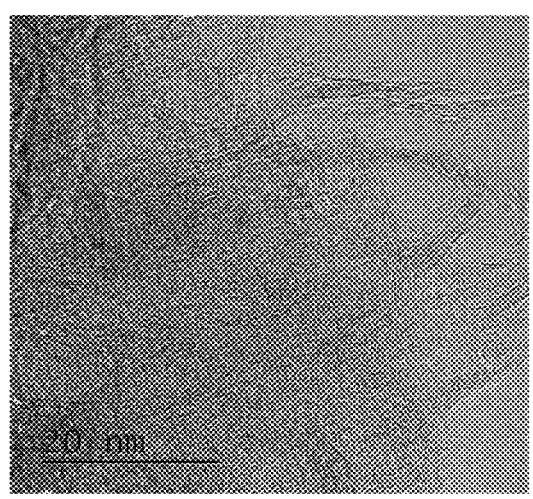

Referring to FIG. 13A, the composite of Preparation Example 6 was found to have a uniform distribution of Si—O. As shown in FIG. 13C, the composite of Preparation Example 6 was found to include graphene regions (delimited by circles) grown around the at least one selected from silicon oxide ($SiO_2$) and a reduction product thereof ($SiO_x$) (where $0<x<2$) particles and to include oxygen in the graphene regions, indicating that the at least one selected from silicon oxide ($SiO_2$) and a reduction product thereof ($SiO_x$) (where $0<x<2$) is distributed in graphene.

2) Preparation Example 1

The composite of Preparation Example 1 was analyzed by TEM-EDS in the same manner as for the composite of Preparation Example 6.

Figure 15A:
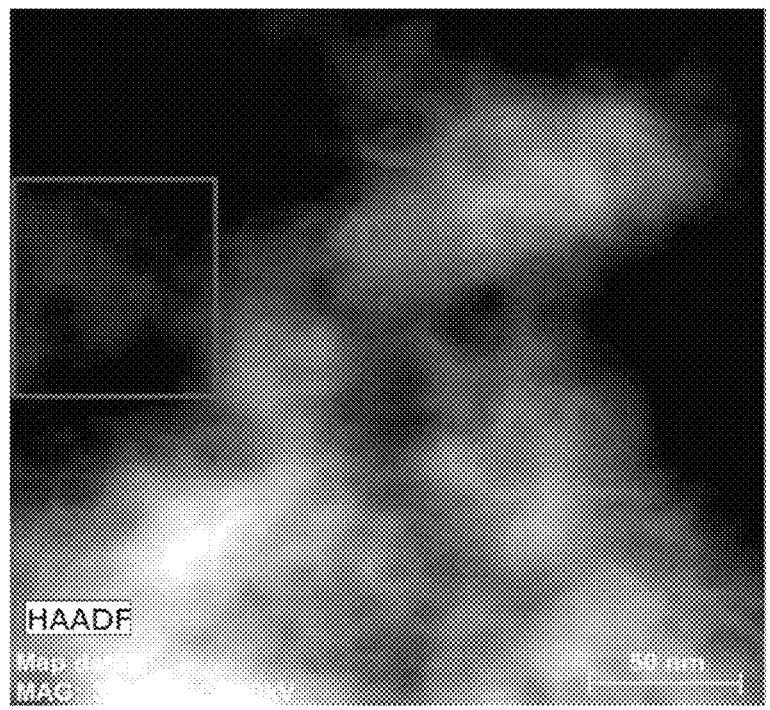
Figure 15B:
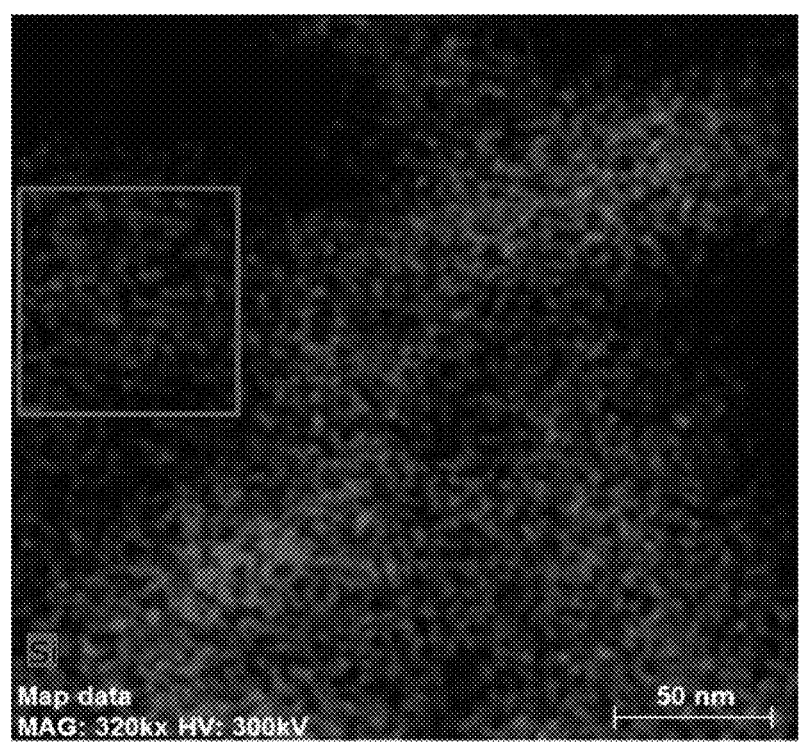
Figure 15C:
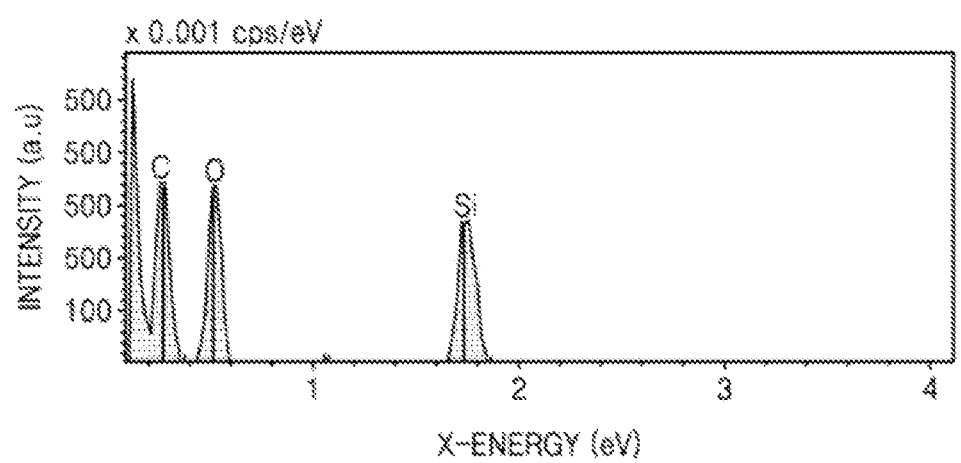

The results are shown in FIGS. 15A to 15C. TEM images of the composites of Preparation Example 1 are shown in FIGS. 14A to 14D.

FIG. 15B is a silicon map of a region delimited by a rectangular in FIG. 15A, obtained from an EDS spectrum of the composite of Preparation Example 1, Referring to FIGS. 15B and 15C, the composite of Preparation Example 1 was found to have uniform distribution of silicon.

3) Preparation Example 3

Figure 16:
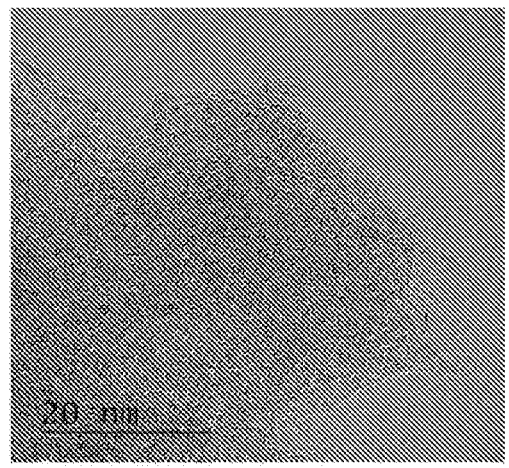
FIG. 16 is a result of TEM-EDS analysis on the composite of Preparation Example 3.

The composite of Preparation Example 3 was analyzed by TEM-EDS in the same manner as for the composite of Preparation Example 6. The results are shown in FIG. 16. FIG. 16 is a HREM and STEM-HADDF image of the composite of Preparation Example 16.

In FIG. 16, the result of component analysis of the composite of Preparation Example 3, and a degree of dispersion of at least one selected from silicon oxide ($SiO_2$) and a reduction product thereof ($SiO_x$) (where $0<x<2$) are shown.

As described above, according to the one or more of the above embodiments, using a composite according to any of the above-described embodiments, or an electrochemically active material composite including the composite may improve electrode conductivity and efficiently suppress side reaction between electrochemically active material and electrolyte. A lithium battery having improved charge and discharge efficiency may be manufactured using any of the composites or electrochemically active material composites according to the above-described embodiments.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A method of preparing a composite, the method comprising:
   contacting a reaction gas and silicon dioxide to provide a reaction gas-contacted silicon dioxide, wherein the reaction gas comprises a carbon source gas; and
   thermally treating the reaction gas-contacted silicon dioxide to prepare the composite,
   wherein the composite comprises
   particles comprising
      a silicon oxide of the formula $SiO_2$ and a silicon oxide of the formula $SiO_x$ wherein $0<x<2$, or
      a silicon oxide of the formula $SiO_x$ wherein $0<x<2$, and graphene,
   wherein the particles comprising the silicon oxide of the formula $SiO_2$ and the silicon oxide of the formula $SiO_x$ wherein $0<x<2$, or the silicon oxide of the formula $SiO_x$ wherein $0<x<2$, are surrounded by the graphene and are interconnected with each other in a graphene matrix.

2. The method of claim 1, wherein the thermal treating comprises thermally treating at about 700° C. to about 1100° C.

3. The method of claim 2, wherein the thermally treating comprises:
   raising the temperature to about 700° C. to about 1100° C.; and
   maintaining the temperature at about 700° C. to about 1100° C.

4. The method of claim 3, wherein the raising of the temperature is performed for a time of about 10 minutes to about 4 hours.

5. The method of claim 1, further comprising contacting the silicon dioxide with a hydrogen gas to provide a hydrogen-contacted silicon dioxide, and thermally treating the hydrogen-contacted silicon dioxide before the contacting of the reaction gas including the carbon source gas.

6. The method of claim 1, wherein the carbon source gas is
   a compound represented by Formula 2, or
   a combination of a compound represented by Formula 2 and at least one of a compound represented by Formula 1 or an oxygen-containing gas represented by Formula 3:

$$C_nH_{(2n+2-a)}[OH]_a \qquad \text{Formula 1}$$

wherein, in Formula 1, n is an integer of 1 to about 20, and a is 0 or 1, $$C_nH_{(2n)} \qquad \text{Formula 2}$$

wherein, in Formula 2, n is an integer of 2 to about 6, and $$C_xH_yO_z \qquad \text{Formula 3}$$

wherein, in Formula 3, x is 0 or an integer of 1 to about 20, y is 0 or an integer of 1 to about 20, and z is 1 or 2.

7. The method of claim 6, wherein the oxygen-containing gas is at least one of carbon dioxide, carbon monoxide, or water vapor.

8. The method of claim 1, further comprising after the contacting with the reaction gas and after the thermally treating of the reaction gas-contacted silicon dioxide, cooling with at least one of nitrogen, helium, or argon.

9. The method of claim 1, wherein the carbon source is at least one of methane, ethylene, propylene, methanol, ethanol, or propanol.

10. The method of claim 1, wherein the carbon source gas is methane; a combination of methane and an inert gas; an oxygen-containing gas; or a combination of methane and an oxygen-containing gas.

\* \* \* \* \*